United States Patent [19]
Choi et al.

[11] Patent Number: 5,963,475
[45] Date of Patent: Oct. 5, 1999

[54] ADVANCED NONVOLATILE MEMORIES ADAPTABLE TO DYNAMIC RANDOM ACCESS MEMORIES AND METHODS OF OPERATING THEREIN

[75] Inventors: Byeng-Sun Choi, Suwon; Tae-Sung Jung, Seoul; Myoung-Jae Kim, Suwon; Seung-Keun Lee, Sungnam-shi, all of Rep. of Korea

[73] Assignee: Samsung Electronics Co., Ltd., Suwon, Rep. of Korea

[21] Appl. No.: 08/990,023

[22] Filed: Dec. 12, 1997

[30] Foreign Application Priority Data

Dec. 14, 1996 [KR] Rep. of Korea ............... 96-65921

[51] Int. Cl.⁶ .................................................. G11C 16/04
[52] U.S. Cl. .............................. 365/185.11; 365/185.23
[58] Field of Search ........................ 365/185.11, 185.23, 365/185.08, 230.03

[56] References Cited

U.S. PATENT DOCUMENTS

| | | | |
|---|---|---|---|
| 5,297,096 | 3/1994 | Terada et al. ............................ | 365/218 |
| 5,384,742 | 1/1995 | Miyakawa et al. ...................... | 365/218 |
| 5,621,690 | 4/1997 | Jungroth et al. ...................... | 365/185.11 |
| 5,663,923 | 9/1997 | Baltar et al. ........................ | 365/230.03 |
| 5,737,258 | 4/1998 | Choi et al. .............................. | 365/63 |

*Primary Examiner*—David Nelms
*Assistant Examiner*—Anh Phung
*Attorney, Agent, or Firm*—Marger, Johnson & McCollom, P.C.

[57] ABSTRACT

Disclosed is a nonvolatile memory, compatible with a dynamic random access memory, including a memory array divided into a plurality of blocks, each of the blocks being divided into a plurality of sub-blocks, reading and writing row decoders for selecting rows of the memory array, and reading and writing gate drive circuits for selecting a plurality of drive lines which supply source voltages to the rows of the memory array, wherein the memory array employs a plurality of section decoders which are arranged between the sub-blocks, each of the section decoders being assigned to a half of the rows belong to the sub-block and connecting the drive lines to the rows.

11 Claims, 52 Drawing Sheets

Fig. 8

| NO | 16M Flash | 16M DRAM |
|---|---|---|
| 1 | Vcc | Vcc |
| 2 | DQ0 | DQ0 |
| 3 | DQ1 | DQ1 |
| 4 | DQ2 | DQ2 |
| 5 | DQ3 | DQ3 |
| 6 | Vcc | Vcc |
| 7 | DQ4 | DQ4 |
| 8 | DQ5 | DQ5 |
| 9 | DQ6 | DQ6 |
| 10 | DQ7 | DQ7 |
| 11 | R/$\overline{B}$ | NC |
| 12 | $\overline{RST}$ | NC |
| 13 | NC | NC |
| 14 | $\overline{W}$ | $\overline{W}$ |
| 15 | $\overline{RAS}$ | $\overline{RAS}$ |
| 16 | A11 | A11 |
| 17 | A10 | A10 |
| 18 | A0 | A0 |
| 19 | A1 | A1 |
| 20 | A2 | A2 |
| 21 | A3 | A3 |
| 22 | Vcc | Vcc |

50(44) TSOP II

| NO | 16M Flash | 16M DRAM |
|---|---|---|
| 44 | Vss | Vss |
| 43 | DQ15 | DQ15 |
| 42 | DQ14 | DQ14 |
| 41 | DQ13 | DQ13 |
| 40 | DQ12 | DQ12 |
| 39 | Vss | Vss |
| 38 | DQ11 | DQ11 |
| 37 | DQ10 | DQ10 |
| 36 | DQ9 | DQ9 |
| 35 | DQ8 | DQ8 |
| 34 | $\overline{EC}$ | NC |
| 33 | NC | NC |
| 32 | $\overline{LCAS}$ | $\overline{LCAS}$ |
| 31 | $\overline{UCAS}$ | $\overline{UCAS}$ |
| 30 | $\overline{OE}$ | $\overline{OE}$ |
| 29 | A9 | A9 |
| 28 | A8 | A8 |
| 27 | A7 | A7 |
| 26 | A6 | A6 |
| 25 | A5 | A5 |
| 24 | A4 | A4 |
| 23 | Vss | Vss |

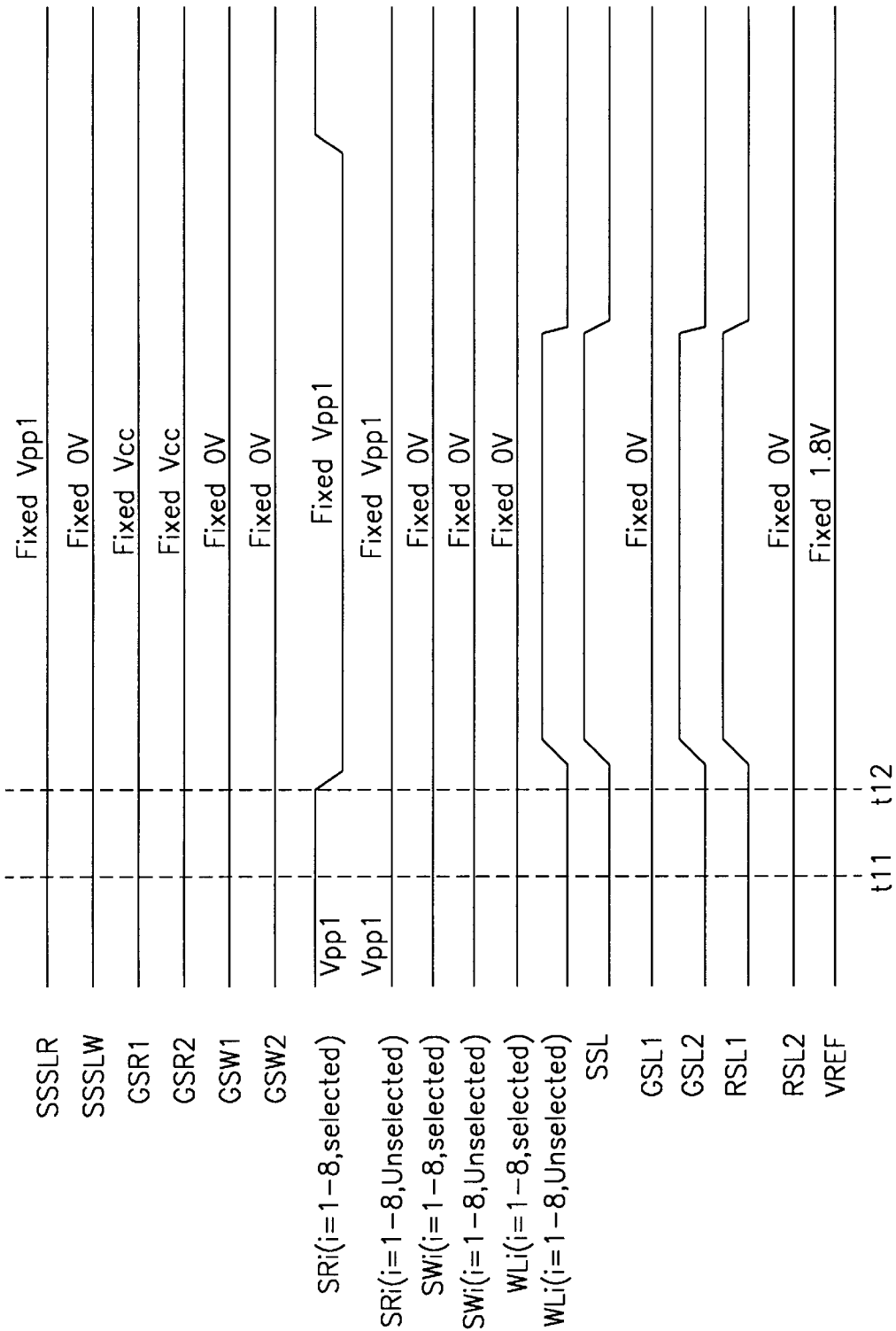

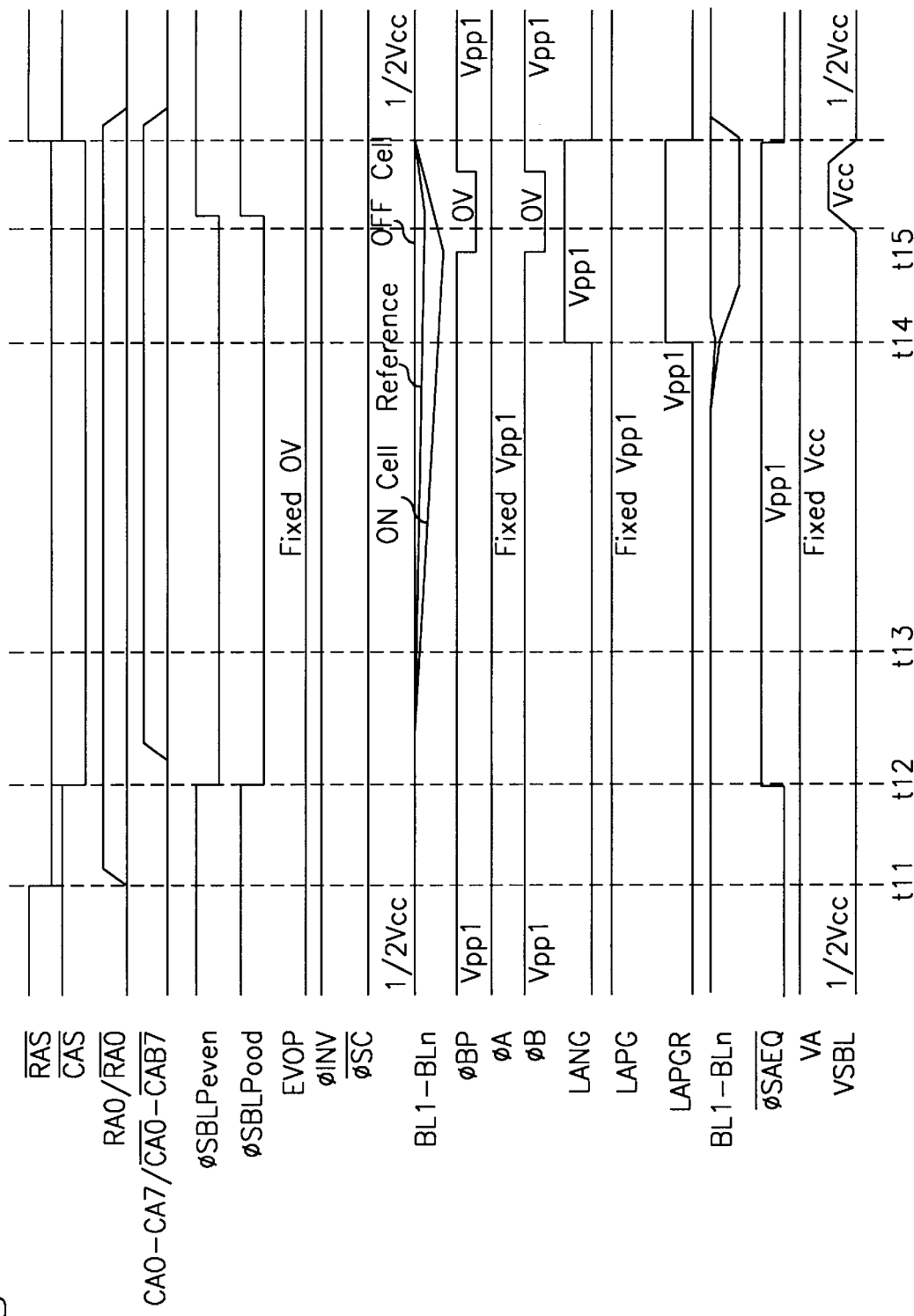

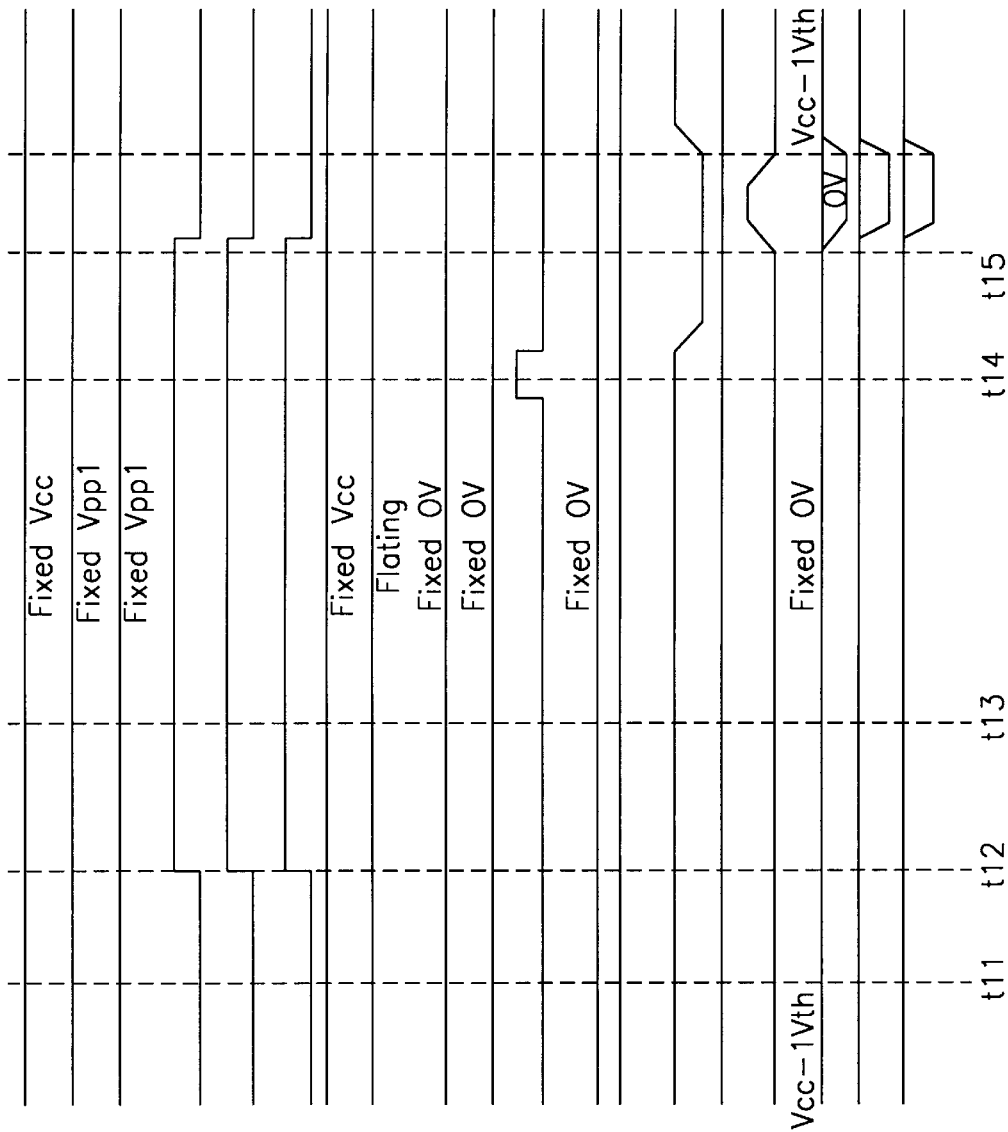

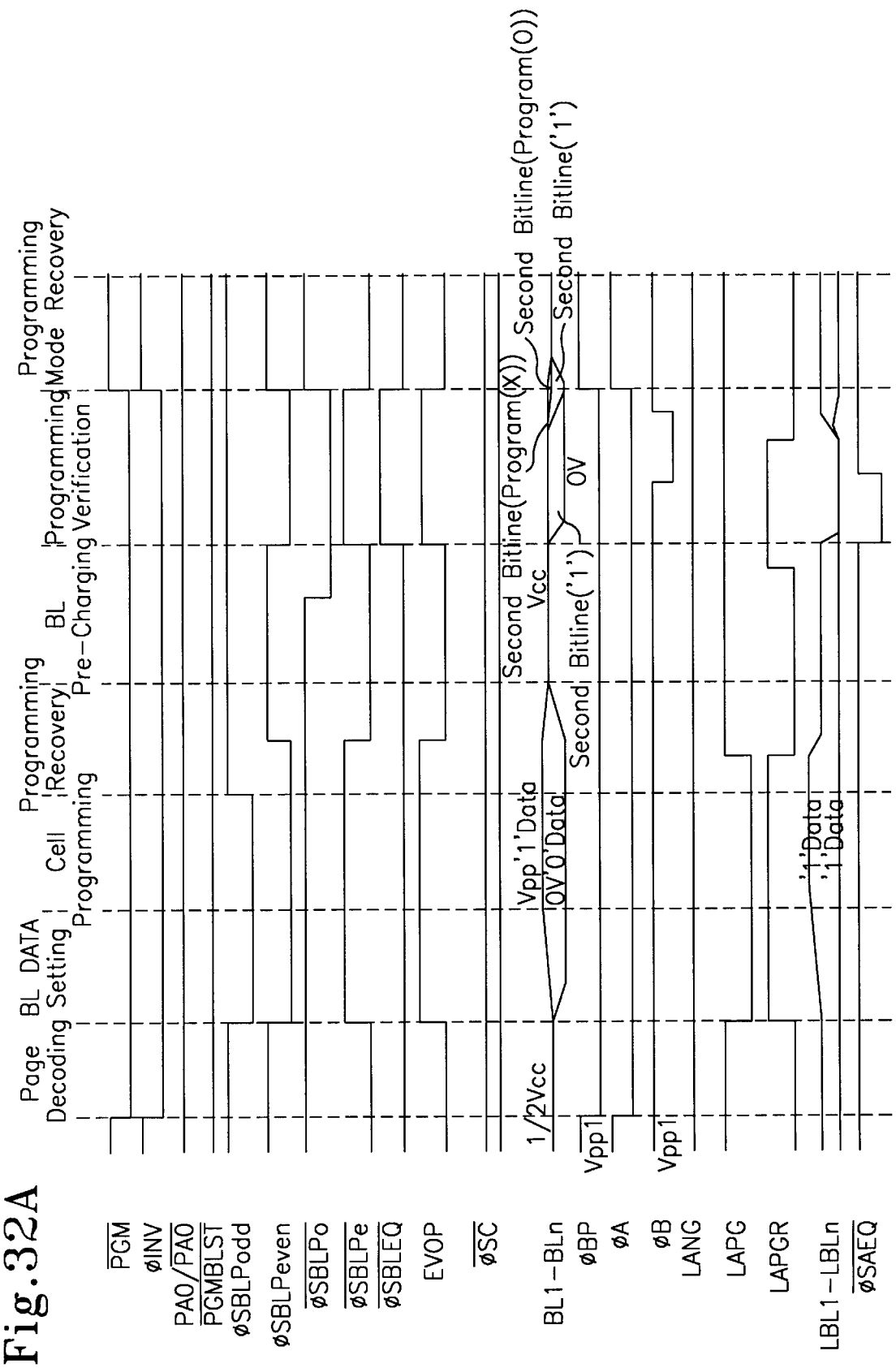

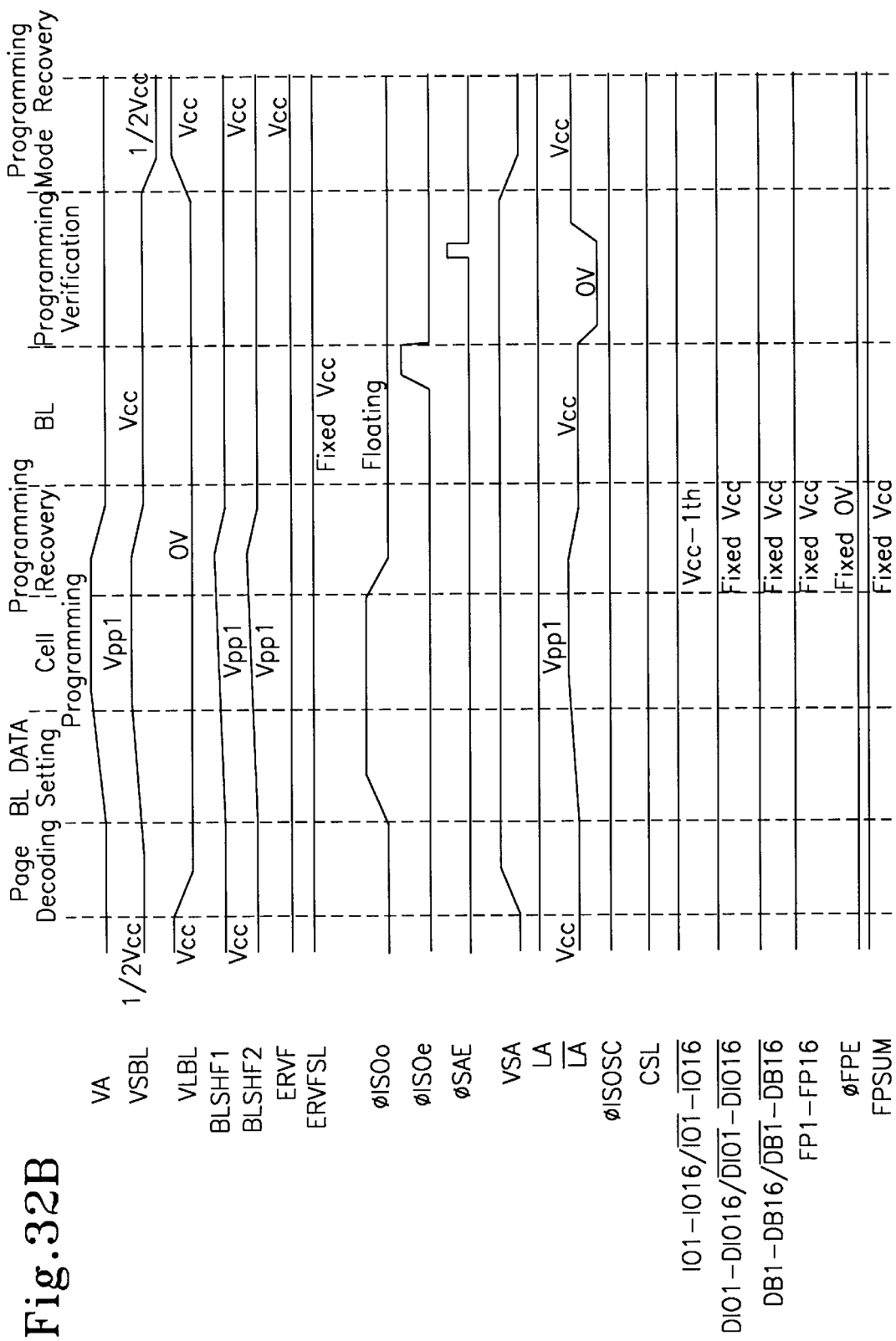

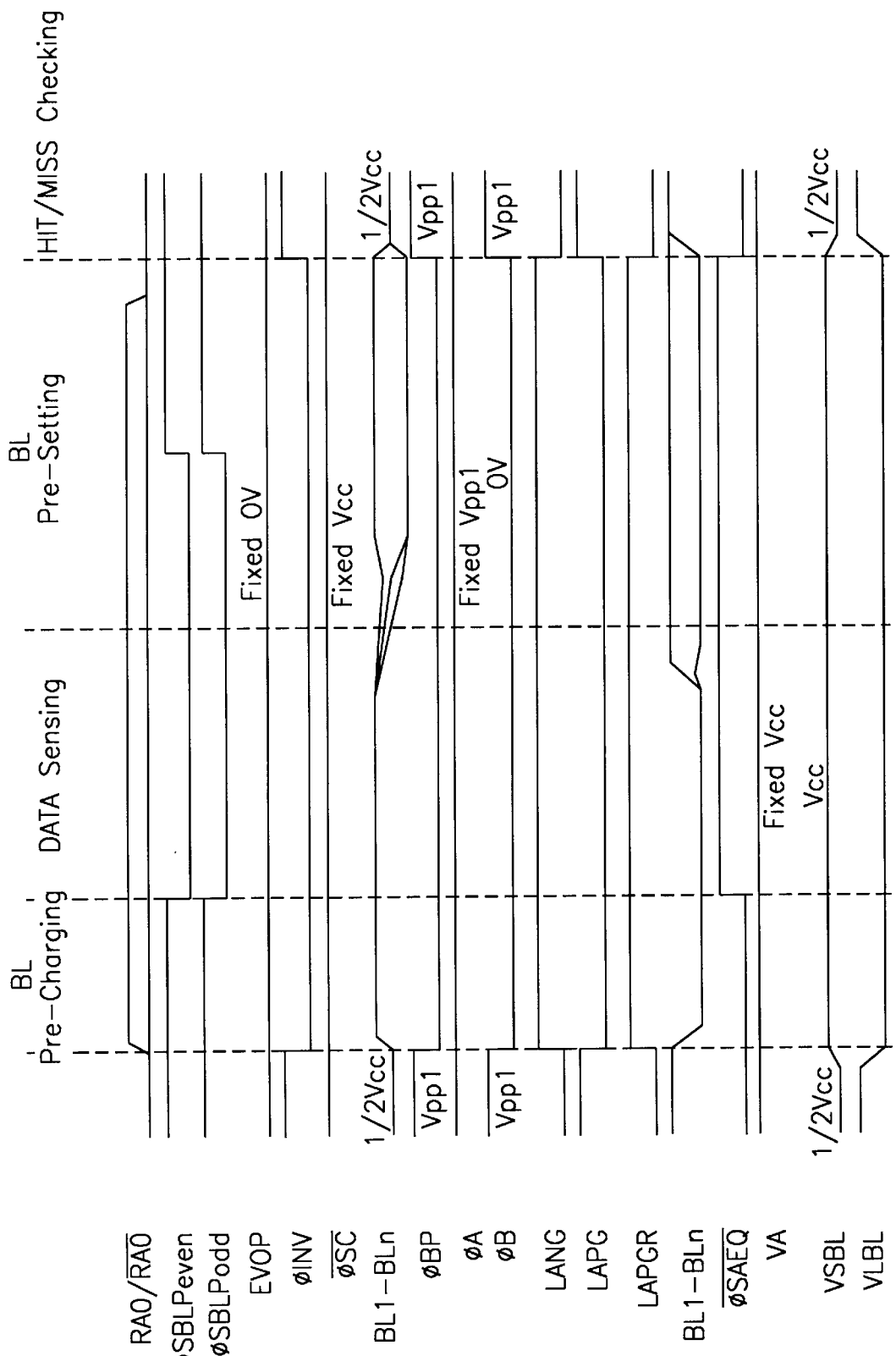

ADVANCED NONVOLATILE MEMORIES ADAPTABLE TO DYNAMIC RANDOM ACCESS MEMORIES AND METHODS OF OPERATING THEREIN

This application corresponds to Korean patent application No. 96-65921 filed Dec. 14, 1996 in the name of Samsung Electronics Co., Ltd.

FIELD OF THE INVENTION

The invention relates to nonvolatile memories, more particularly to nonvolatile memory devices such as flash EEPROMs (electrically erasable and programmable read only memory) which can be adapted to random access memories such as DRAMs and methods of operating same.

BACKGROUND OF THE INVENTION

It has been considered an efficient usage in a computer system to employ flash EEPROMs which store application programs as auxiliary memories and are operable in conjunction with buses of main memories such as dynamic random access memories therein. One type of such Flash EEPROMs has been proposed by Intel Co. in October 1994, identified as Flash Memory 28F016xD, which is now referred to as DRAM-interface flash EEPROM because it includes a pin arrangement adaptable to interfacing with a DRAM. FIG. 1 shows the layout configuration of the pins of Intel's device, being comprised of data input/output pins DQ0–DQ15, address input pins A0–A9, row address strobe pin $\overline{RAS}$, column address strobe pin $\overline{CAS}$, read protect pin $\overline{RP}$, write protect pin $\overline{WP}$ and ready/busy pin RY/$\overline{BY}$. $\overline{RP}$ places the flash memory into a sleep mode to minimize current dissipation when it is not activated. $\overline{WP}$ prevents the data stored in the memory from being lost during power-up and power-down periods. RY/$\overline{BY}$ allows other devices within a system to recognize a programming time or an erasure time of the flash memory.

As is well known, operations of a DRAM are determined by the states of the control signals such as write enable signal $\overline{WE}$. A low level on $\overline{WE}$ activates a writing operation while a high level activates a read operation, just in the DRAM. On the other hand, a flash memory can only be initiated by setting commands by way of data input/output pins DQ0–DQ15. For example, commands FFh, 40h, 20h and 0Ch may enable a read mode, a writing mode, an erasure mode and a programming mode, respectively. In a read operation of the conventional device, as shown in FIG. 2, if a read command (e.g., FFh) is applied to DQ when $\overline{WE}$, $\overline{RAS}$ and $\overline{CAS}$ are all at low levels, address signals A0–A9 applied to the device are ignored. $\overline{RAS}$ and $\overline{CAS}$ respectively read row and column addresses with both a flash memory and a DRAM. DQ is held at a high impedance until both addresses are completely received. Data is output from DQ when $\overline{WE}$ is at a high level.

FIG. 3 shows a writing operation of the flash memory, which is same as the read operation of FIG. 2 except for the command information and the logic status of $\overline{WE}$. The operation for receiving the write command has the same timing as a normal DRAM writing operation. In the event the flash memory and the DRAM share buses, it can be seen from FIG. 3 that a writing operation for only the flash memory may cause the DRAM to perform an unwanted writing operation. Because of this fact, flash memory and DRAM cannot share buses, that is, they have to use their own individual buses.

In addition, considering that an entire flash memory writing operation, which generally consists of two steps: (1) the writing operation as shown in FIG. 3 in which external data are applied to and stored in page buffers; and (2) the programming cycle in which the data stored in the page buffers are written into flash memory cells, substantially corresponds to a DRAM writing operation, it can be understood that a further input cycle for issuing a programming command is needed after the writing cycle of FIG. 3. Thus, a central processor unit (CPU) has to carry out an additional operation for generating the programming command even though other works may be delayed, thereby causing degradation in system performance. And conventional controller chip-sets used only for the DRAMs must be modified because they must support the command-controlled flash memories, as well as the DRAMs.

FIG. 4 is a schematic illustrating a part of cell array in a conventional NAND type flash memory device, FIG. 5 illustrates a lay-out pattern of the NAND cell unit in FIG. 4, and FIG. 6 is a corss-sectional view taken along line I—I in FIG. 5.

Referring to FIGS. 4 through 6, gates of the cell transistors of NAND cell units NU are coupled to word lines WL1–WL7 and bit lines BL1–BLn are connected to the cell units. The higher the density and capacity of the memory get, the more the length of the word and bit lines is increased and then the more the parasitic capacitance and resistance are increased. Those parasitic demerits cause the random access time—the time from a selection of a word line to output of data through a bit line—to be longer and acts as a major limitation in designing a high speed flash memory.

As one way to enhance the access speed, a folded bit line sensing scheme, which is employed in DRAMS, has been proposed. However, since each sense amplifier is coupled between a pair of bit lines (one is a reference line) and a selected memory cell to be programmed is connected to just one of the bit line pair, the entire memory capacity might be reduced.

If, in order to increase the memory capacity, each of cross points between word lines and the pairs of bit lines is coupled to one memory cell, the data loading (or latching) operation for the pair of bit lines after a flash erasure against all memory cells is takes at least two cycles because only half of the memory cells can be programmed at one time. Thus, the whole programming time increases. Moreover, in case there are some data which need to be saved, the data must be read outside before an erasure and re-written after the erasure. Such management of the secured data is inconvenient when using the memory.

On the other hand, the architecture of a conventional memory cell array having lockable cells is shown in FIG. 7, in which an erasure lock function is equipped to protect data stored in memory cells from being destroyed by device malfunction due to the external noises and/or the abrupt changes in supply voltages. The lockable cells LM1–LM7 are arranged in correspondence with word lines WL0–WL7 and each lockable cell retains alternative information for an erasure lock and an erasure unlock for a corresponding page. If lockable cell LM1 is an off-cell, the page, memory cells coupled to WL0, is considered to be in an erasure lock state. To the contrary, LM1 of an on-cell indicates that the page is laid on an erasure unlock state, which means it is available to program the memory cells within the page. However, in programming and erasing the lockable cells, data stored in the memory cells have to be saved and re-written, before and after either programming or erasing the lockable cells, respectively.

SUMMARY OF THE INVENTION

Accordingly, the invention is to solve the aforementioned problems involved in the conventional flash memory adaptable to buses for DRAM.

Therefore, it is a primary object of the invention to provide an advanced nonvolatile memory efficiently adaptable to a DRAM.

It is another object of the invention to provide an advanced nonvolatile memory capable of sharing buses with a DRAM in an integrated system.

It is another object of the invention to provide an auxiliary memory capable of performing its own operation modes without disturbing a main memory even though the auxiliary memory shares buses with the main memory in a digital data processing system.

In order to accomplish those objects, a nonvolatile memory compatible with a dynamic random access memory includes a memory array divided into at least one pair of mats, each of the mats including a plurality of sub-array sections separated in a row direction and a plurality of section decoders for the separated sub-array sections. Each section decoder is arranged adjacent to one or between two of the sub-array sections to select rows of the one or two adjacent sub-array sections. Each of sub-array sections is divided into a plurality of sub-blocks in a column direction. A number of sub-blocks arranged in the row direction forms a block. One of two section decoders corresponding to each sub-array section is assigned to a half of rows belong to the corresponding sub-array section and the other of the two section decoders is assigned to the other rows thereof, and each section decoder connects the drive lines to the assigned rows of the one or two adjacent sub-array sections.

BRIEF DESCRIPTION OF THE DRAWINGS

FIG. 8 illustrates arrangement of pins of an integrated circuit device according to the present invention.

FIGS. 28A through 30B are timing diagrams of operations for controlling the rows in FIGS. 11A through 11C for a read mode, a writing mode and an erasure mode, respectively.

FIGS. 31A through 34B are timing diagrams of operations for controlling the columns in FIG. 14 for the read mode, the writing mode, the erasure mode and a writing hit/miss checking mode, respectively.

DETAILED DESCRIPTION OF THE PREFERRED EMBODIMENT

Figure 1:
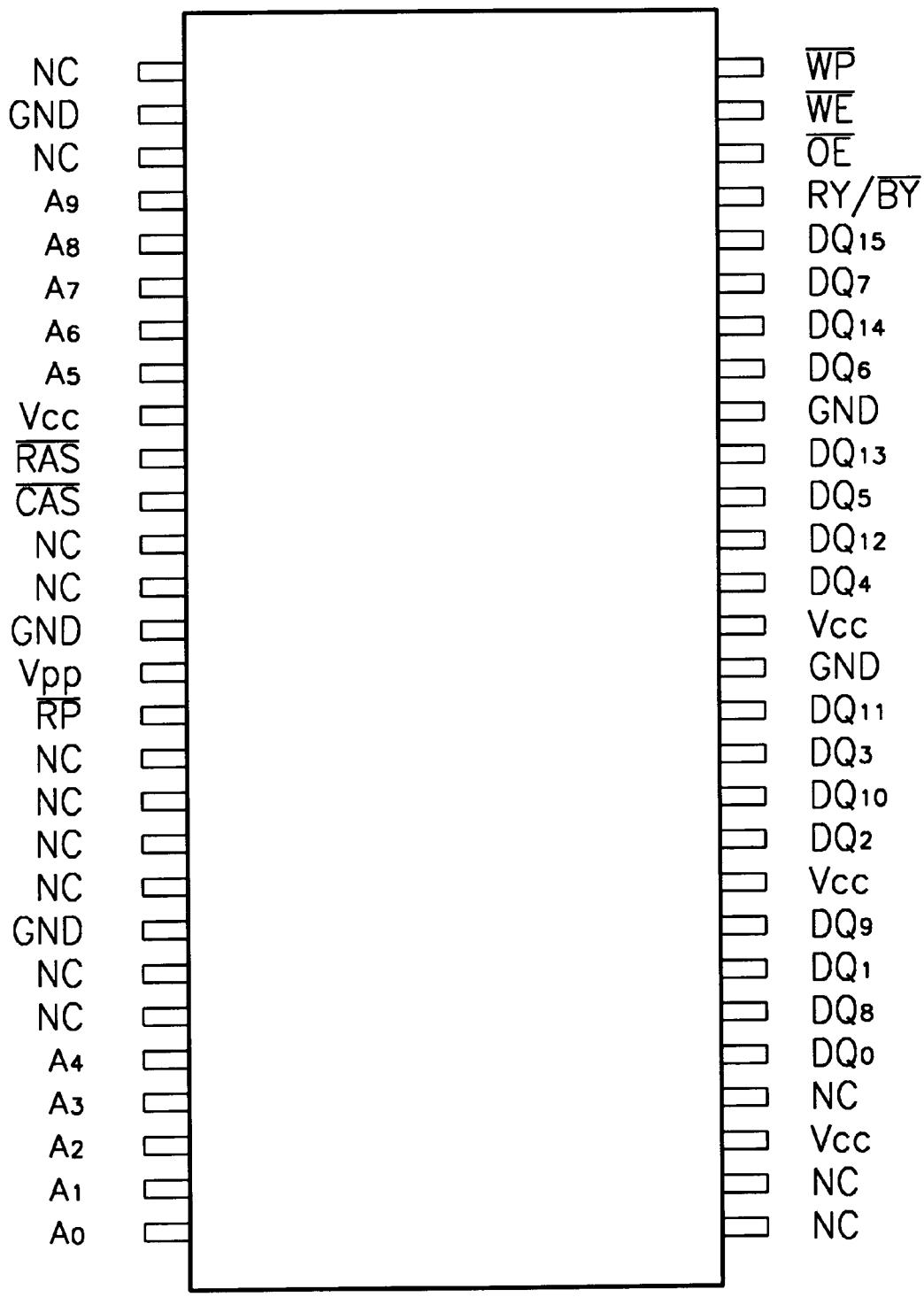
FIG. 1 illustrates an arrangement of pins of conventional devices.
Figure 2:
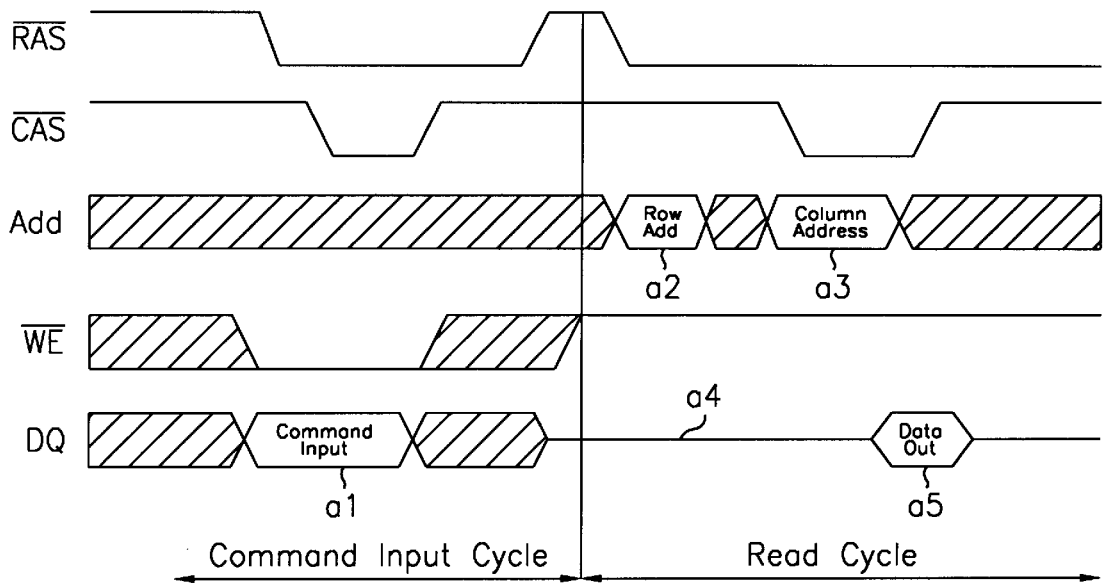
FIG. 2 shows a sequential timing for a read operation in the conventional device.
Figure 3:
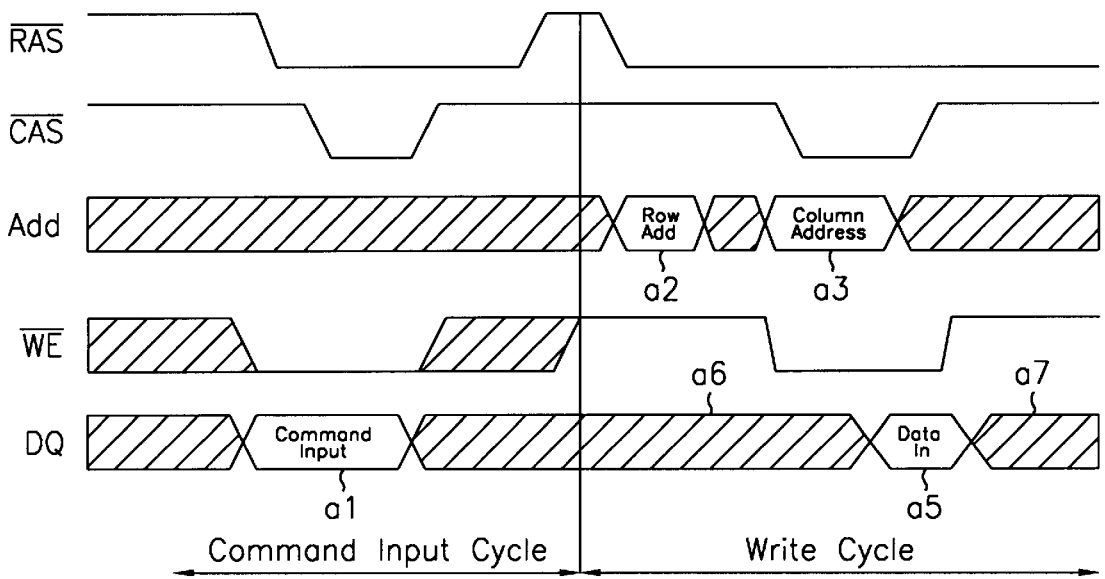
FIG. 3 shows a sequential timing for a writing operation in the conventional device.
Figure 4:
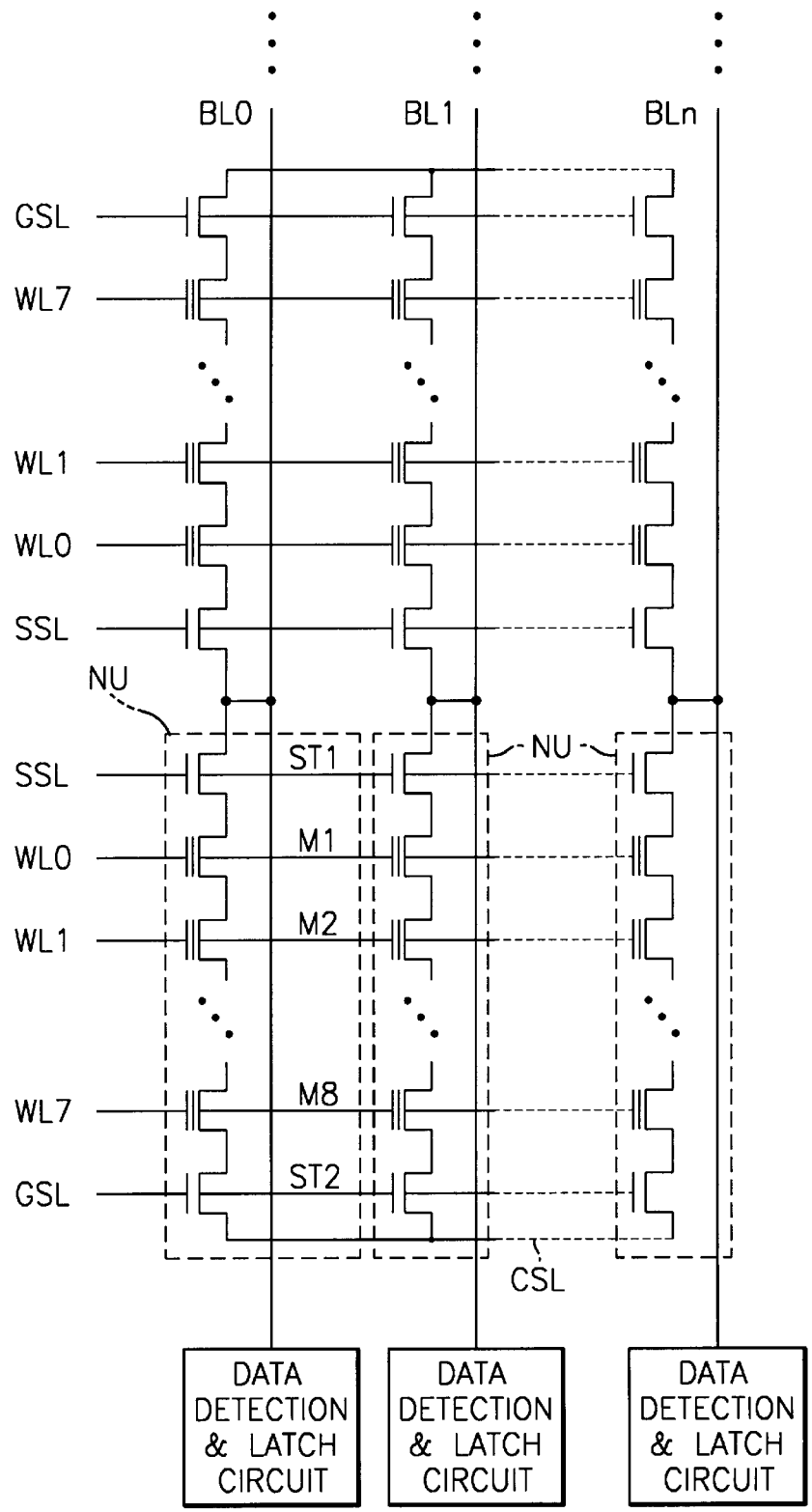
FIG. 4 is a schematic illustrating a part of cell array in the conventional device.
Figure 5:
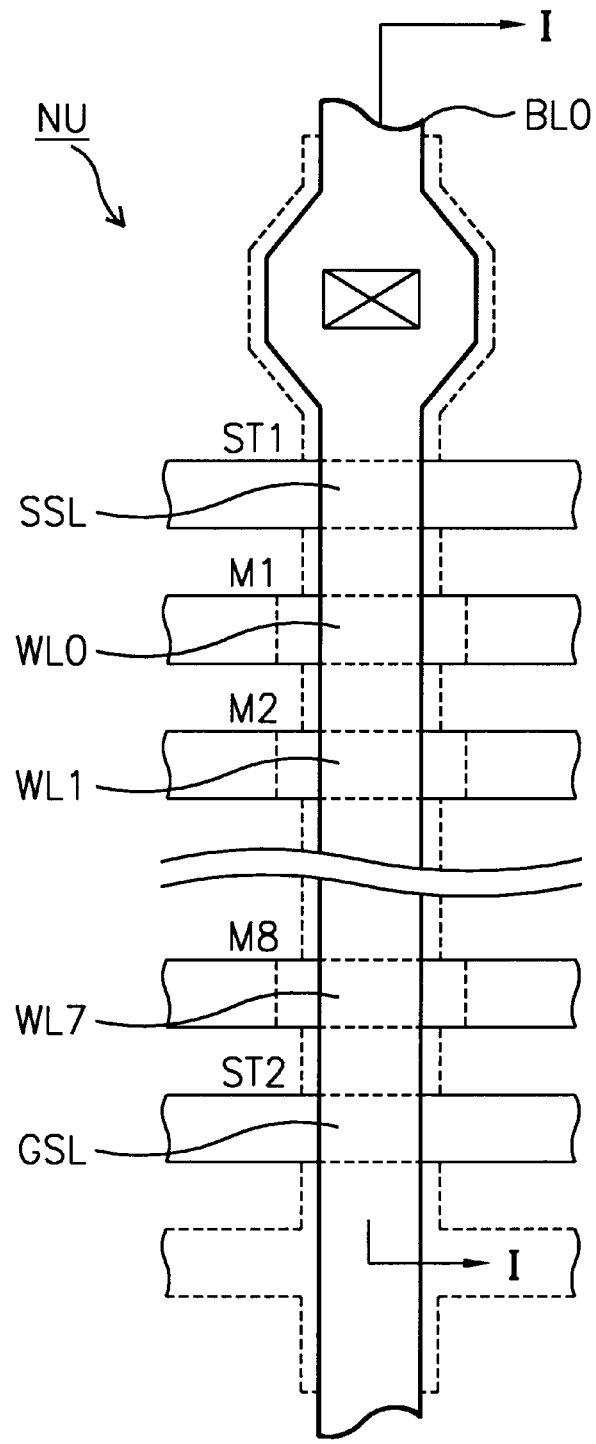
FIG. 5 illustrates a lay-out pattern of teh NAND cell unit in FIG. 4.
Figure 6:
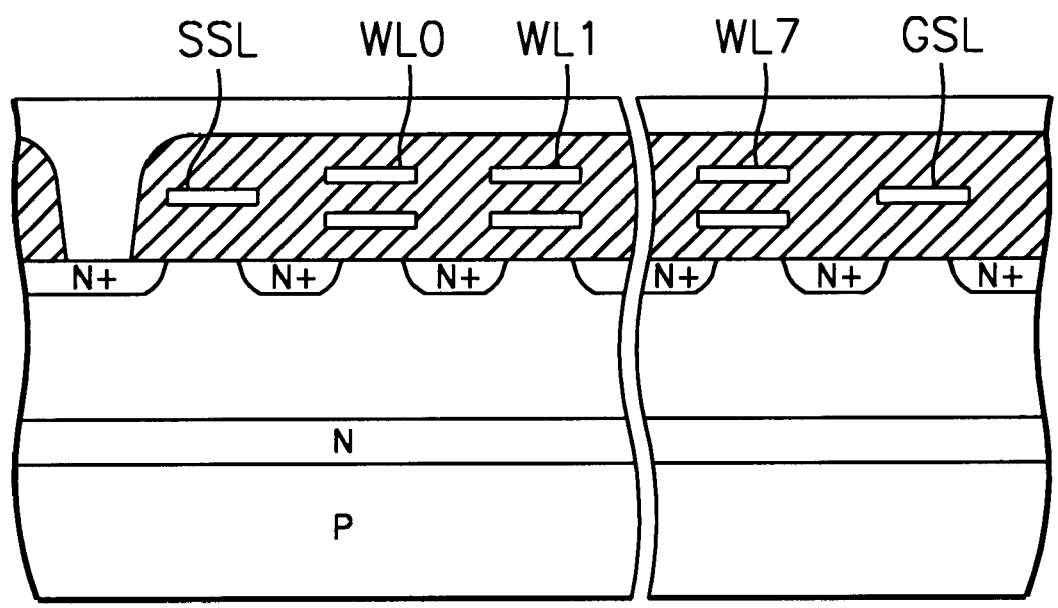
FIG. 6 is a cross-sectional view taken along line I—I in FIG. 5.
Figure 7:
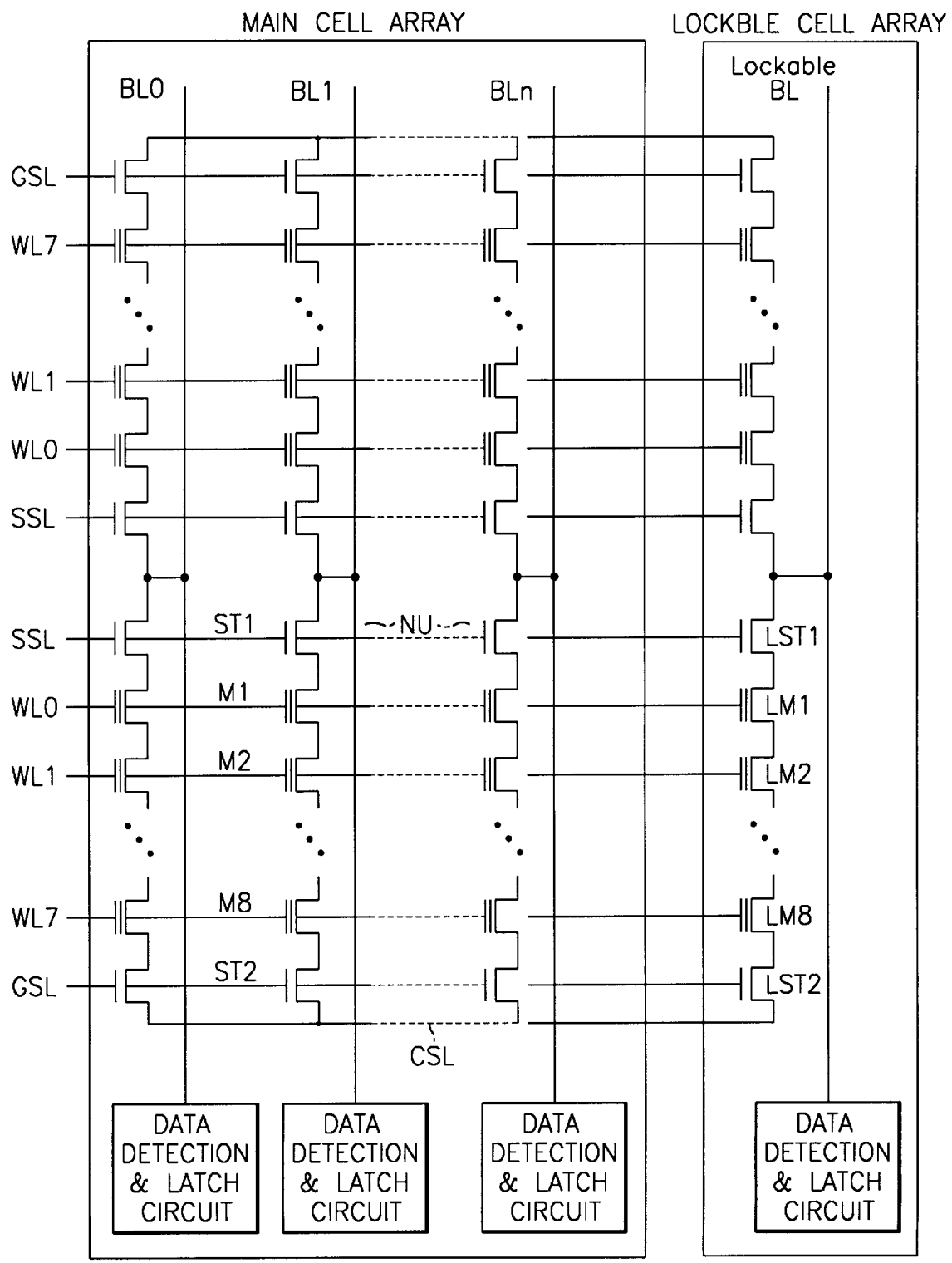
FIG. 7 is a schematic diagram illustrating a part of cell array in another conventional device, in which lockable cells are embedded therein.

Hereinbelow, applicable embodiments of the invention will be as follows, with reference to the appended drawings. Referring now to the drawings, like reference characters designate like or corresponding parts throughout the several views and signals lines and signals thereon may be referred to by the same reference symbols. The flash EEPROM (hereinafter referred to as flash memory) applied to an embodiment of the invention is a 16 Mb-type and its adaptable DRAM is the same. In operations of the flash memory, a general term "writing" is refers to both programming and erasing. The flash memory of the embodiments according to the invention uses various voltages that are practically optimized to control signals or lines therein, such as power supply voltage Vcc of, for example, 3V, substrate voltage (or ground voltage) Vss of 0V, the first pumping voltage Vpp1 of, for example, 4.5V which can be used for the pass voltage Vpass as a programming or programming inhibition voltage, the second pumping voltage Vpp2 of, for example, 6V, reference voltage Vref of, for example, 1.8V, programming voltage Vpgm of, for example, 18V, and erasure voltage Vera of, for example, 20V.

FIG. 8 shows a configuration of pins for a flash memory in accordance with the present invention which is operable in conjunction with buses for DRAM. FIG. 8 also includes matching tables comparing a 16 Mb flash memory with a 16 Mb DRAM as an example. In FIG. 8, several pins used in specific operation modes of the flash memory, such as $\overline{RST}$, $R/\overline{B}$ and $\overline{EC}$, are arranged to be assigned to no-contact pins NC of the DRAM. The $\overline{RST}$, $R/\overline{B}$ and $\overline{EC}$ denote a reset pin, a ready/busy pin and an erasure control pin, respectively. The $R/\overline{B}$ pin informs a processor (i.e., CPU) that the flash memory is conducting a restoring operation (for several microseconds through milliseconds), i.e., a busy state, or that the restoring mode is over, i.e., a ready state. The $\overline{RST}$ pin resets the flash memory during any operation, and places the flash memory in a sleep mode to consume a low current of about 5 micro-amperes. The $\overline{EC}$ pin places the flash memory into a flash erasure mode in which several kilobytes of data are simultaneously erased without influencing data stored in the DRAM. The other the pins, such as data input/output pins DQ0–DQ15, address pins A0–A11, address strobe pins $\overline{RAS}$ and $\overline{CAS}$, write control pin $\overline{W}$ and power supply pins Vcc and Vss, are located in the same positions as the DRAM. As shown in FIG. 8, the number of the pins shared by the flash memory and DRAM is 39 out of 44. Basic operations, read and writing modes, will be described in detal later with reference to FIGS. 26 and 27.

Figure 9:
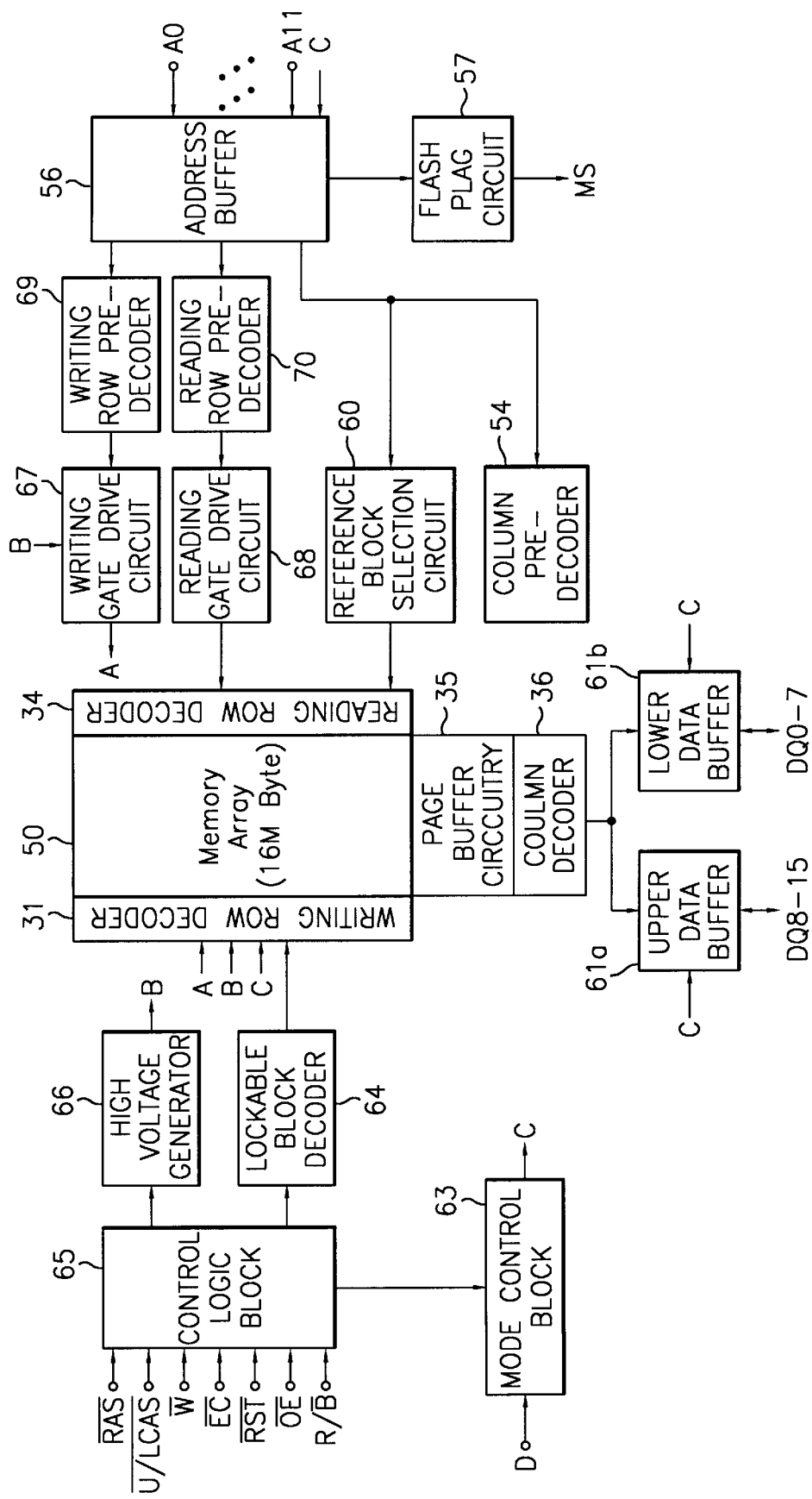
FIG. 9 is a block diagram illustrating the functional construction of a device according to the present invention.

Referring FIG. 9, a 16 Mb flash memory according to the present invention includes a writing row decoder 31, a reading row decoder 34, a mode control block 63, a lockable block decoder 64 and a flash flag circuit 57. Reading and writing row decoders, 31 and 34, are positioned at the sides of a memory array 50 to select memory blocks and word lines. Columns of memory array 50 are led to data buffers 61a and 61b through page buffer circuitry 35 by means of a column decoder 36 which selects columns of the memory array 50. The data buffers 61a and 61b are connected to data input/output pins DQ0–DQ15. The outputs of the page buffer 35 are separated in upper data buffer 61 a for DQ8–DQ15 and lower data buffer 61b for DQ0–DQ7. The outputs of an address buffer 56 are applied the to reading and writing row pre-decoders 69 and 70, a reference block selection circuit 60, a column pre-decoder 54 and the flash flag circuit 57.

Reference block selection circuit 60 selects a memory block of the memory array 50 which is supposed to receive a predetermined reference voltage. Flash flag circuit 57 generates mode setting signals MS, which are applied to the mode control block 63, thereby determining an internal operation mode of the flash memory. Control logic block 65 receives row address strobe signal $\overline{RAS}$, upper/lower column strobe signal $\overline{U/LCAS}$, write control signal $\overline{W}$, erasure control signal $\overline{EC}$, reset signal $\overline{RST}$, output enable signal $\overline{OE}$ and ready/busy signal $R/\overline{B}$, and generates internal control signals to be applied to peripheral circuits of the memory array, such as high voltage generator 66 and lockable block decoder 64, and mode control block 63. The $\overline{EC}$, $\overline{RST}$ and $R/\overline{B}$ signals are disabled by the control logic block when their corresponding pins on the DRAM buses, shown in FIG. 8, are placed in floating states (a condition in which there is no bias). Mode control block 63 receives the mode setting signals from flash flag circuit 57 and control signals from control logic block 65, and then generates control signals for conducting specific operation modes such as reading, writing, programming, erasing, program verifying, erasure verifying, write hit/miss checking and lockable cell checking. Therefore, mode control block 63 includes logic circuits to perform those functions. Lockable block decoder 64 selects lockable blocks in response to the output of control logic block 65. Reading and writing gate drive circuits 67 and 68 transfer word line drive signals and block selection signals to reading and writing row decoders 31 and 34, respectively, in response to the outputs from reading and writing row pre-decoders, 69 and 70. High voltage generator 66 applies high voltages, such as Vpp1, Vpp2, Vpgm, and Vera, to the writing row decoder 31 and writing gate drive circuit 67. It should be noted, in FIG. 9, that the selecting chains for reading and writing are physically separated therebetween.

Figure 10:
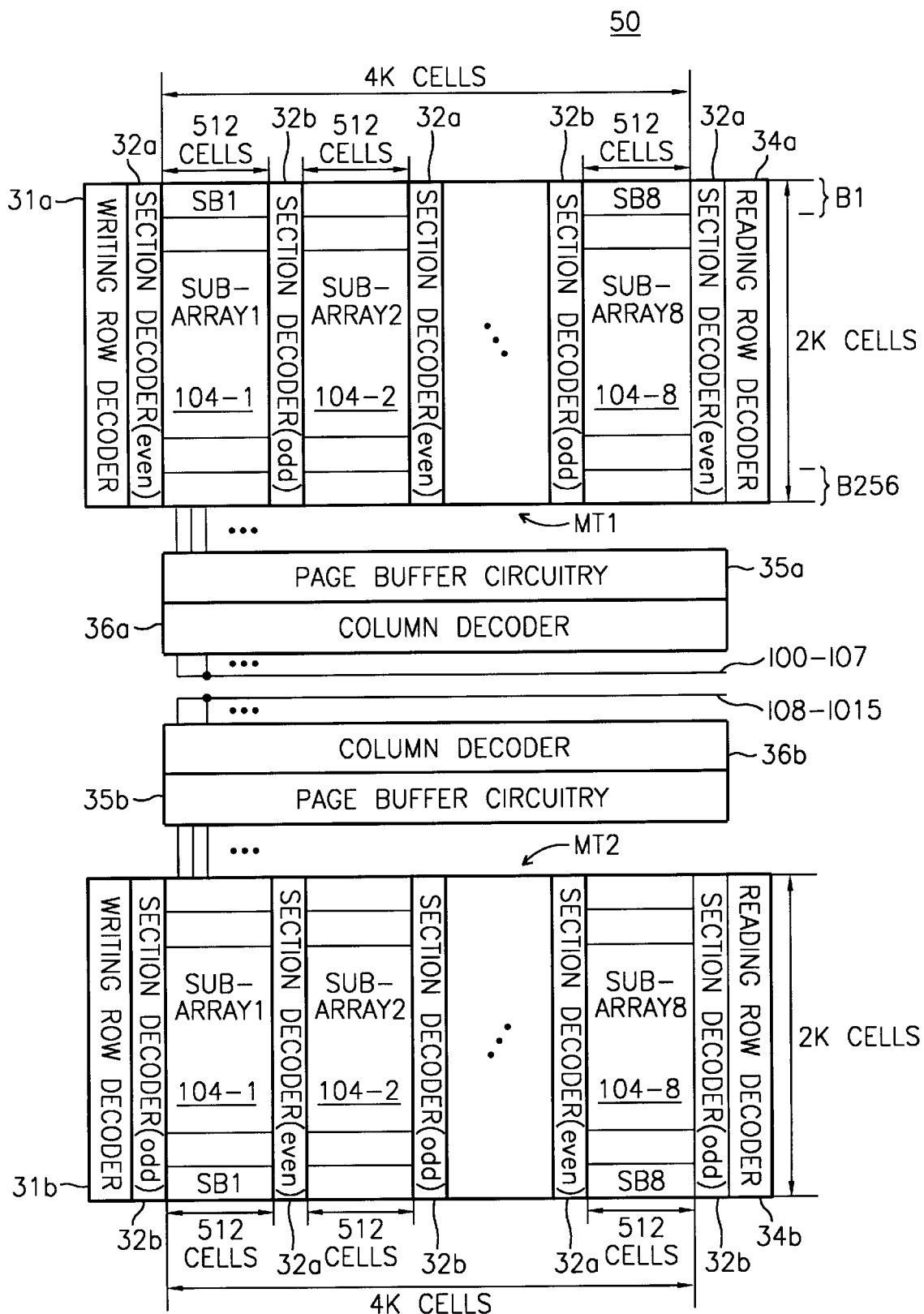
FIG. 10 illustrates an anchitecture of the memory array and its peripherals in FIG. 9.

FIG. 10 shows an overall architecture of memory array 50 having a capacity of 16 Mb and the peripheral regions thereof. Memory array 50 is divided into one or more pairs of mats MT1 and MT2. Each of the mats MT1 and MT2 includes eight sub-array sections 104-1 through 104-8 which are separated by first and second types of section decoders 32a and 32b in the row direction. Each mat has a memory capacity of 8 Mb (4 K by 2 K). Each of the subarray sections (e.g., 104-1) is divided into 256 sub-blocks along the column. Each sub-block (e.g., SB1) has a memory capacity of 4 Kb (512 by 8). Each mat is also formed of 256 blocks B1–B256 arranged along the column direction. Each block (e.g., B1, or B256) has a capacity of 32 Kb (4 K by 8) and consists of eight sub-blocks (e.g., SB11–SB18 in B256). Such a divided memory array structure contributes to an increase of data accessing speed, and there would be various modifications for such a hierarchical construction. Writing and reading row decoders 31a and 34a are provided for mat MT1, and writing and reading row decoders 31b and 34b for mat MT2. At the intermediate positions in the mats or blocks, i.e., at the opposite sides of the sub-blocks or sub-array, the different types of section decoders 32a and 32b are alternately arranged to select rows of the sub-arrays or sub-blocks in response to the outputs of the row decoders 31a, 34a and 31b, 34b. That is, each section decoder is arranged adjacent to one or two sub-array sections. The section decoders 32a and 32b have different circuit configurations (refer to FIGS. 11A and 11C). One of two section decoders corresponding to each sub-array section is assigned to a half of the rows belonging to the corresponding sub-array section, and the other of the two section decoders is assigned to the other rows of the sub-array section. Each section decoder connects the drive lines to the assigned rows of the one or two adjacent sub-array sections. In both of mats MT1 and MT2, the first type of section decoders 32a are opposite to the second type of section decoders 32b, respectively. The alternate allocation of the section decoders lets the loading capacitance of the mats be regulated therein. Between input/output lines IO0–IO7 and mat MT1, page buffer 35a and column decoder 36a are arranged. Similarly, page buffer 35b and column decoder 36b are arranged between mat MT2 and input/output lines IO8–IO15. Each mat inputs/outputs one byte of data through its own input/output data lines.

Figure 11A:
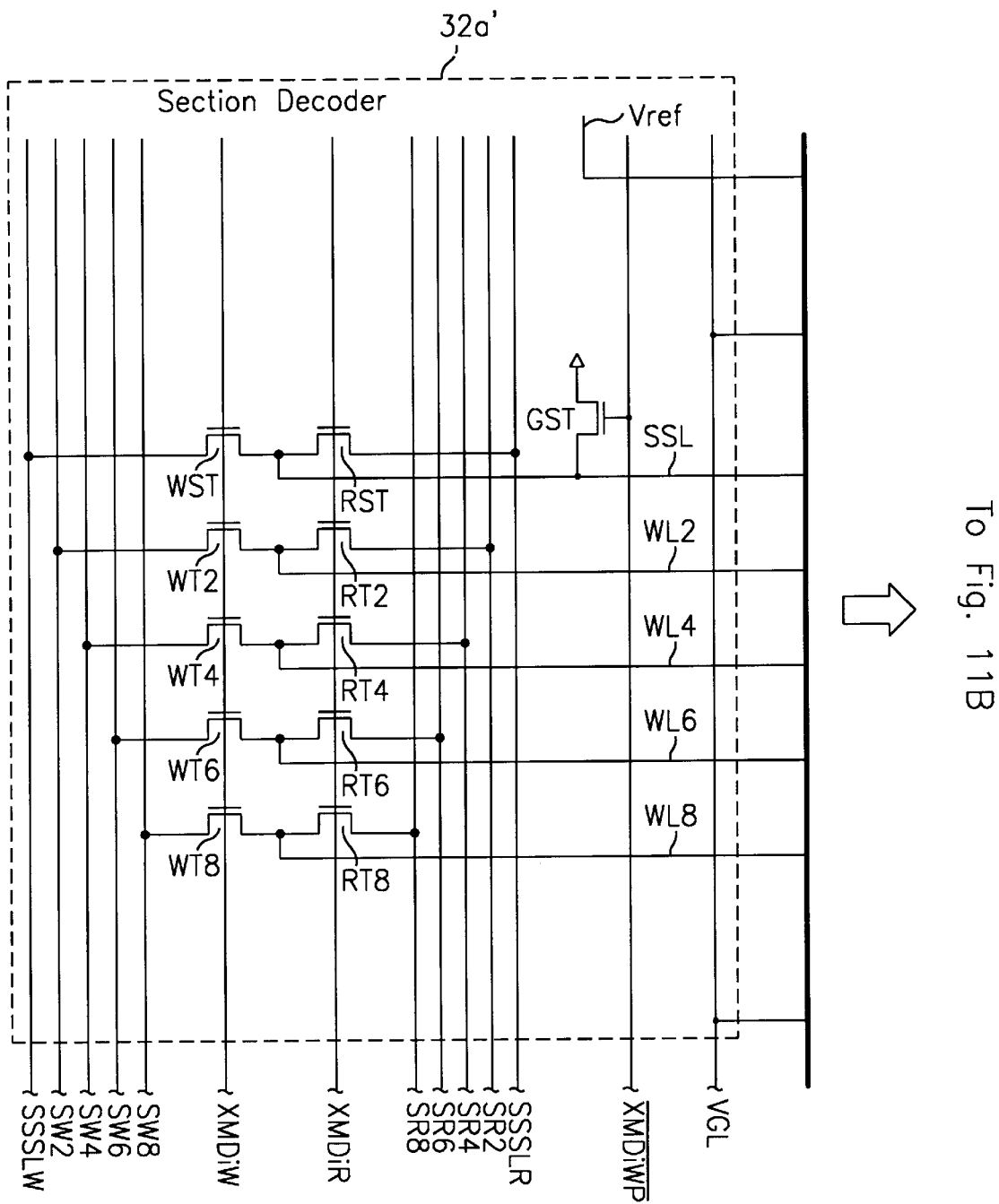
FIGS. 11A through 11C are circuit diagrams illustrating an interconnecting configuration with memory cells and transistors in a unit core portion of the memory array of FIG. 9.
Figure 11B:
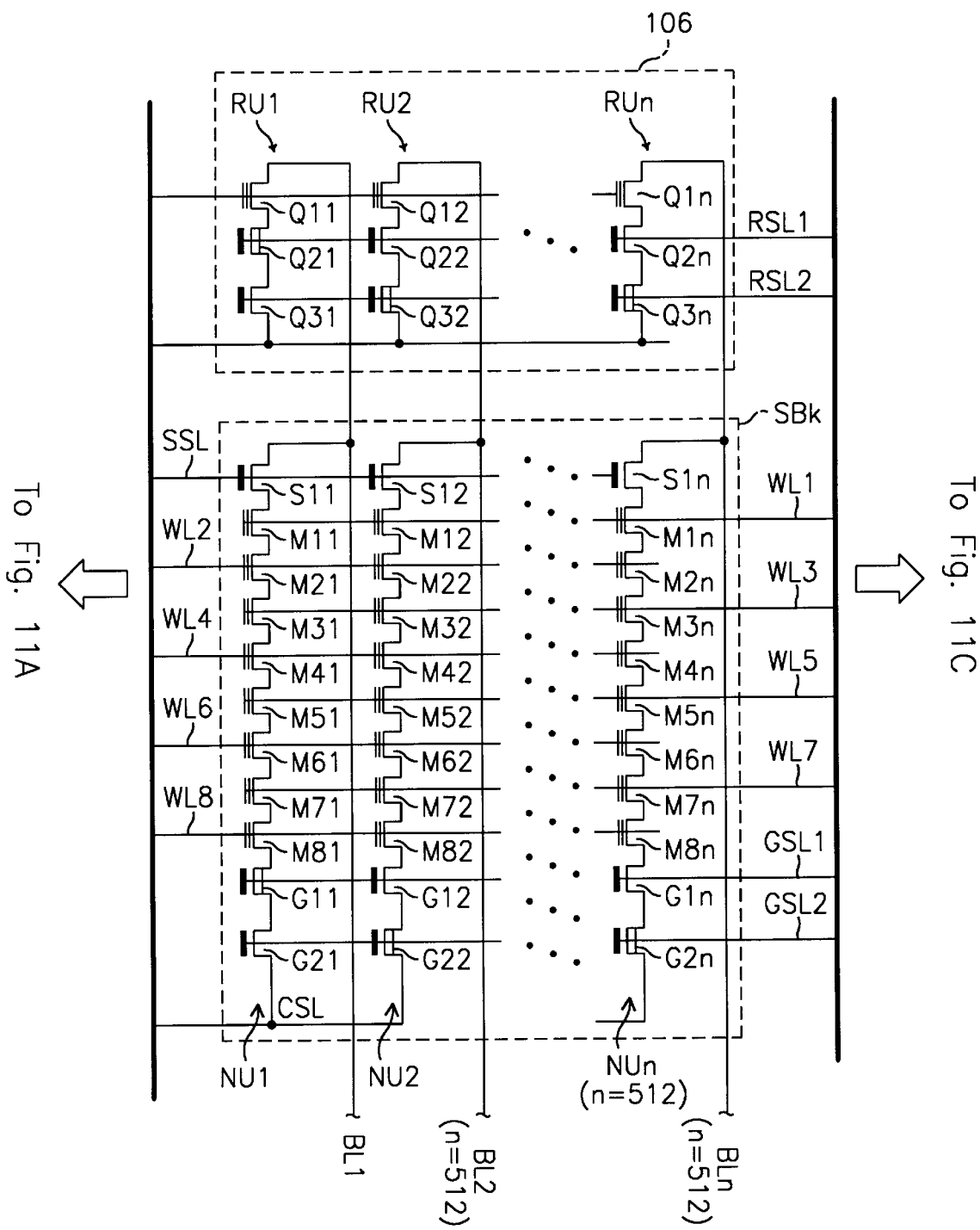
Figure 11C:
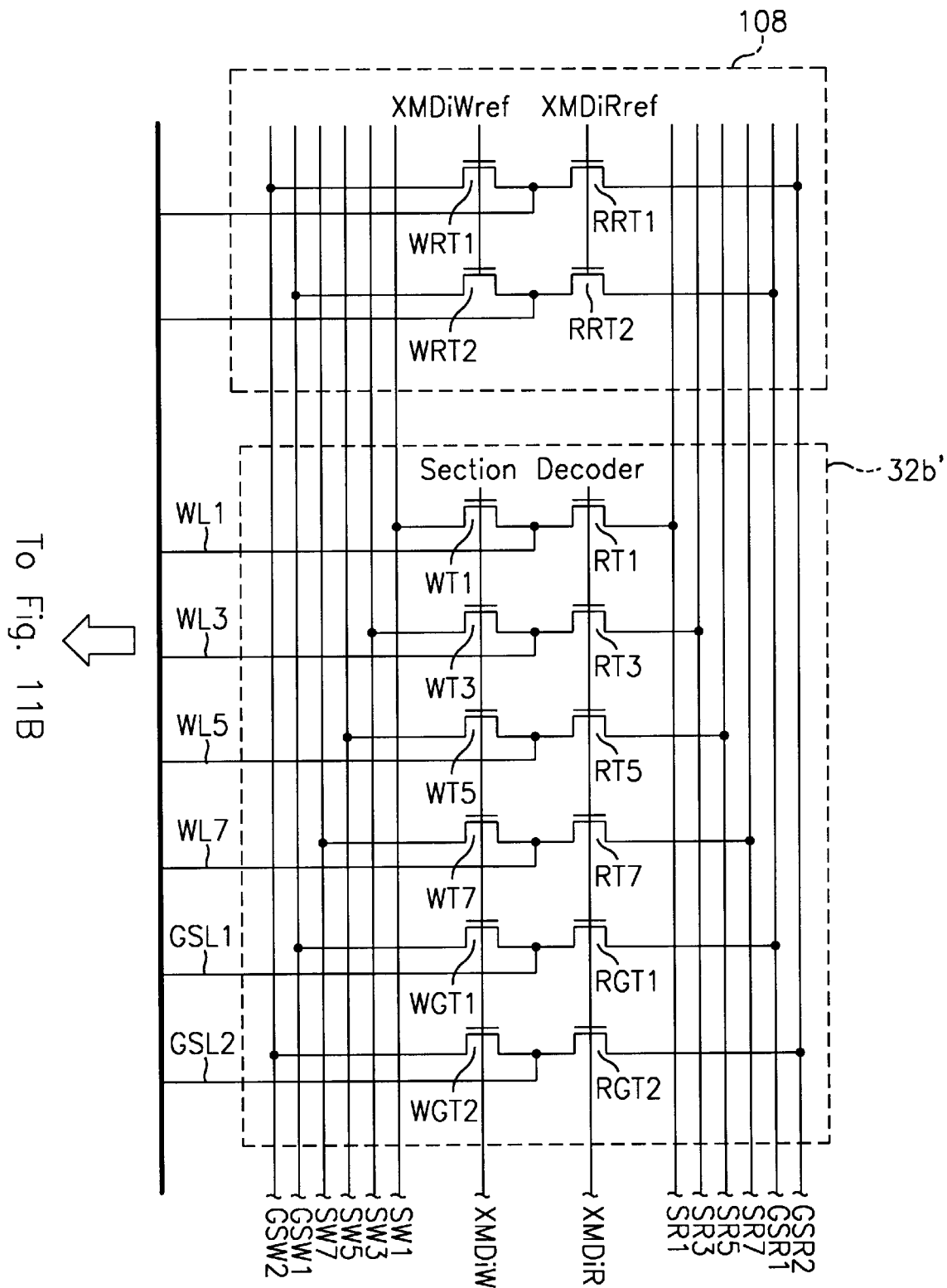

FIGS. 11A through 11C show an exemplary construction of a sub-block SBk (one of eight sub-blocks in a memory block of FIG. 10), corresponding section decoder parts and corresponding peripherals. Section decoder parts 32a' and 32b' are arranged to select eight word lines WL1–WL8 and three selection lines SSL, GSL1 and GSL2 in n (=512) NAND cell units NU1–NUn of sub-block SBk. String selection line SSL and even word lines, WL2, WL4, WL6 and WL8 are selected by the section decoder 32a', and ground selection lines, GSL1 and GSL2, and odd word lines, WL1, WL3, WL5 and WL7 are selected by the section decoder 32b'. The NAND cell units are connected between bit lines BL1–BLn (n=512) and common source line CSL. Common source line CSL is connected to virtual ground line VGL. String selection line SSL is connected to the gates of string selection transistors S11–S1n (n=512), and ground selection lines GSL1 and GSL2 are connected to ground selection transistors, G11–G1n (n=512) and G21–G2n (n=512), respectively.

The first group of ground selection transistors G11–G1n (n=512) are alternately fabricated as enhancement and depletion type devices such that the transistors connected to even bit lines are enhancement-type devices, and the transistors connected to odd bit lines are depletion-type devices. The reverse arrangement is used for the second group of ground selection transistors G21–G2n (n=512); that is, the transistors connected to odd bit lines are enhancement-type devices, and the transistors connected to even bit lines are depletion-type devices.

Between the bit lines and virtual ground line VGL, reference voltage supply circuit 106 is connected to set unselected bit lines of the sub-block to a reference voltage level during a read operation in response to outputs of reference block decoder 108 in which transistor units RU1–RUn (n=512) with the same number of the NAND cell units are arranged. In each transistor unit (e.g., RU1), floating gate transistor (Q11), reference selection transistors (Q21 and Q31) of the depletion and enhancement-types, respectively, are serially connected between its corresponding bit line (BL1) and VGL. A reference voltage Vref of 1.8V is commonly coupled to the gates of the floating gate transistors Q11–Q1n (n=512). The reference ground selection transistors Q21–Q2n (n=512) and Q31–Q3n (n=512) are arranged in the same way as the ground selection transistors in the sub-block SBk. The gates of Q21–Q2n and Q31–Q3n are connected to reference selection lines RSL1 and RSL2, respectively. A reference voltage for reading is applied to alternate ones of the odd and even bit lines. Reference selection lines RSL1 and RSL2 are output by reference block decoder 108 in response to writing and reading reference block selection lines (or signals) XMDiWref and XMDiRref which are generated by the reference block selection circuit 60 shown in FIG. 9. RSL1 is connected to a node interposed between transistors WRT1 and RRT1 whose gates are coupled to XMDiWref and XMDiRref, respectively. The other terminals of WRT1 and RRT1 are connected to writing and reading reference selection lines GSW2 and GSR2, respectively. RSL2 is connected to a node between transistors WRT2 and RRT2 whose gates are coupled to XMDiWref and XMDiRref, respectively. The other terminals of WRT2 and RRT2 are connected to writing and reading reference selection lines GSW1 and GSR1, respectively.

In section decoder 32a' at the left side of SBk, SSL is connected to a node between transistors WST and RST whose gates are coupled to writing and reading block selection lines XMDiW and XMDiR, respectively. XMDiW and XMDiR are generated from writing and reading row decoder, 31 and 34, respectively. XMDiW is also connected to the gates of transistors WT2, WT4, WT6 and WT8 which correspond to WL2, WL4, WL6 and WL8 for writing. XMDiR is also connected to the gates of transistors RT2, RT4, RT6 and RT8 which correspond to WL2, WL4, WL6 and WL8 for reading. WST and RST are connected between writing and reading string selection drive lines SSSLW and SSSLR. WL2 is connected to a node interposed between WT2 and RT2 which are connected between writing and reading drive lines SW2 and SR2. WL4 is connected to a node interposed between WT4 and RT4 connected between writing and reading drive lines SW4 and SR4. WL6 is connected to a node interposed between WT6 and RT6 connected between writing and reading drive lines SW6 and SR6. WL8 is connected to a node interposed between WT8 and RT8 connected between writing and reading drive lines SW8 and SR8. The gate of transistor GST is connected between SSL, and the ground is coupled to block selection flag signal $\overline{\text{XMDiWP}}$ to control the selection of the corresponding sub-block, SBk.

In section decoder 32b' at the right side of SBk, WL1 is connected to a node interposed between WT1 and RT1 connected between writing and reading drive lines SW1 and SR1. WL3 is connected to a node interposed between WT3 and RT3 connected between writing and reading drive lines SW3 and SR3. WL5 is connected to a node interposed between WT5 and RT5 connected between writing and reading drive lines SW5 and SR5. WL7 is connected to a node interposed between WT7 and RT7 connected between writing and reading drive lines SW7 and SR7. GSL1 is connected to a node interposed between WGT1 and RGT1 connected between writing and reading drive lines GSW1 and GSR1. GSL2 is connected to a node interposed between WGT2 and RGT2 connected between writing and reading drive lines GSW2 and GSR2.

As described above, the transistors of the section decoders 32a' and 32b' fall into two groups: one for driving even word lines and the other for driving odd word lines. Such a distributed structure allows the memory cell pitch to be reduced, resulting in a reduced cell array area.

Figure 12A:
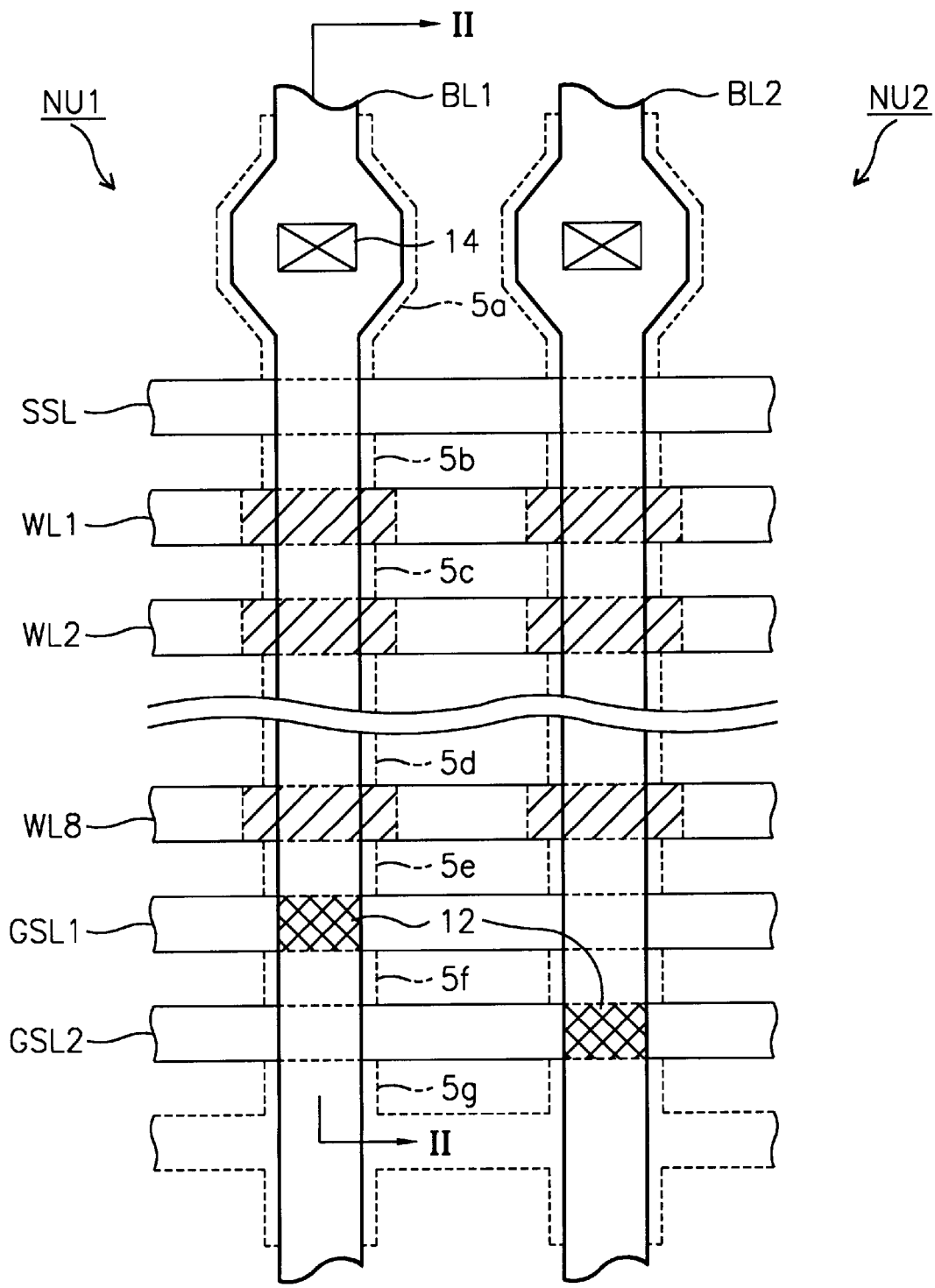
FIG. 12A illustrates a lay-out pattern of a NAND cell unit in FIG. 11B.
Figure 12B:
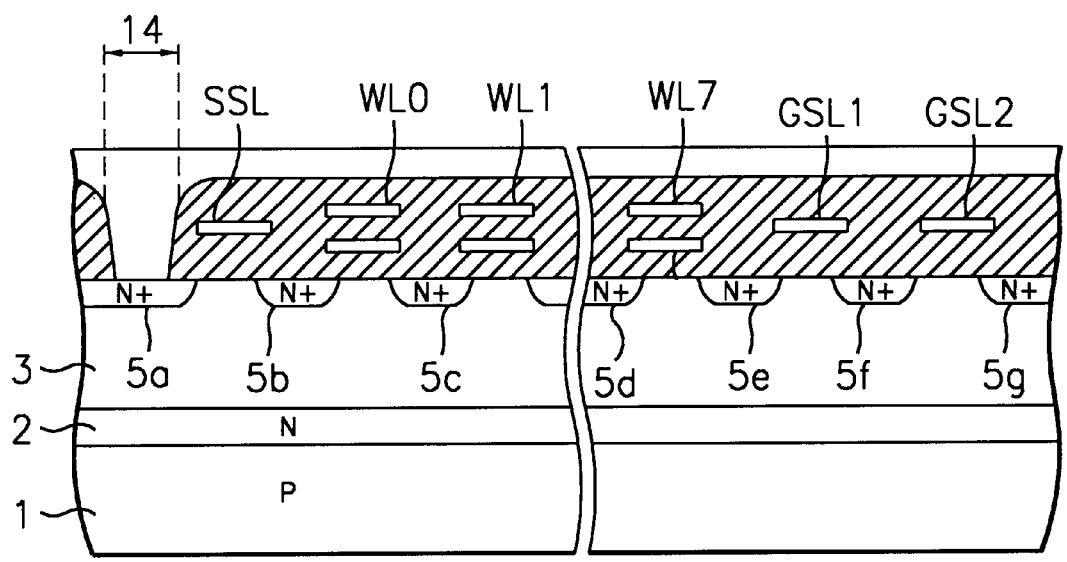
FIG 12B is a cross-sectional view taken along line II—II in FIG. 12A.

FIGS. 12A and 12B show the structure of the NAND cell unit of FIG. 11B. N+ doped regions 5a–5g formed in P-well 3 are used for source and drain regions of the string selection transistors, cell transistors and ground selection transistors in the NAND cell unit. Doped channel regions 12 are formed such that the ground selection transistors are depletion-type transistors. The bit line is connected to N+ region 5a of the string selection transistor through contact hole 14.

Figure 13:
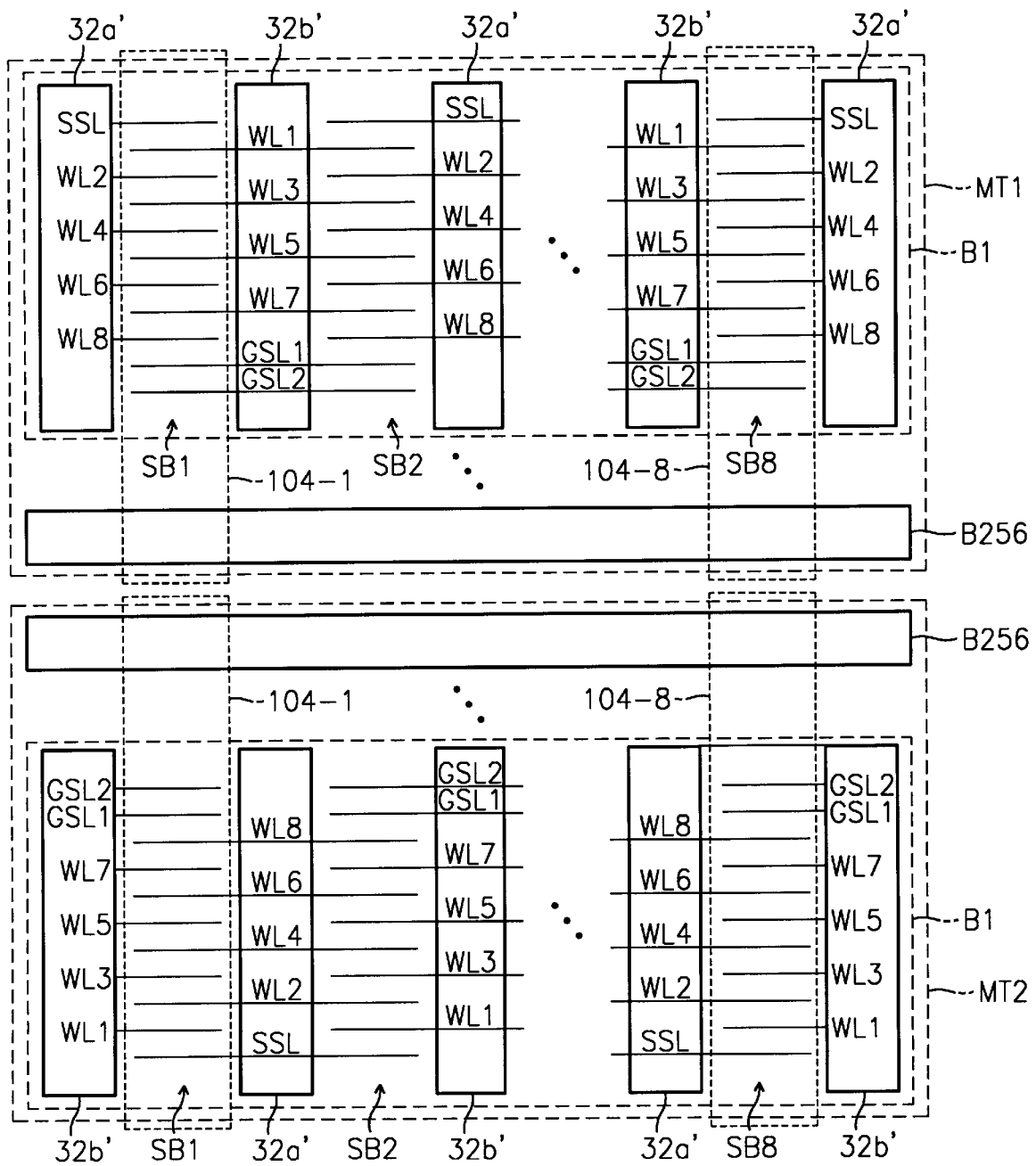
FIG. 13 illustrates an interconnecting feature with word lines in FIG. 10.

FIG. 13 is helpful in understand the interconnecting features between the row lines (i.e., the string and ground selection lines, the word lines) in the sub-blocks and section decoders over the whole memory cell array. The configuration of connections between the section decoders and the row lines are different depending on their locations within in the mat, though their internal architectures are the same as shown in FIGS. 11A through 11C. Section decoder 32a' is connected to the string selection line and a half of the word lines, while the other section decoder 32b' is connected to the ground selection lines and a half of the word lines. When any of the section decoders 32a' and 32b' is interposed between two sub-blocks, it occupies half of the word lines belonging to each of the adjacent sub-blocks. Such arrangements contribute to enhancing the effect of distributing the loading capacitance throughout the memory cell array 50.

Figure 14:
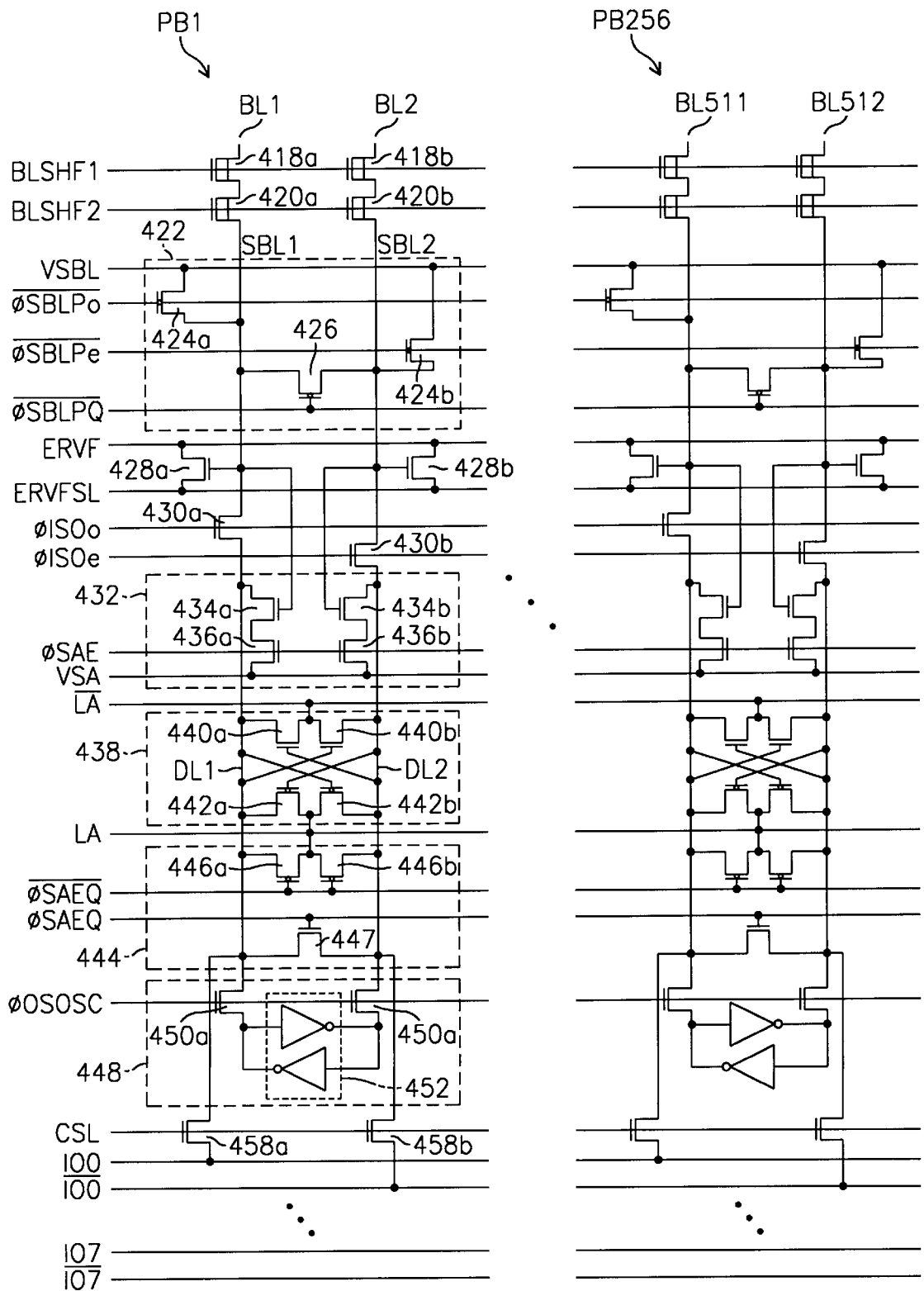
FIG. 14 is a partial circuit diagram of the pager buffer circuitry of FIG. 10.
Figure 14A:
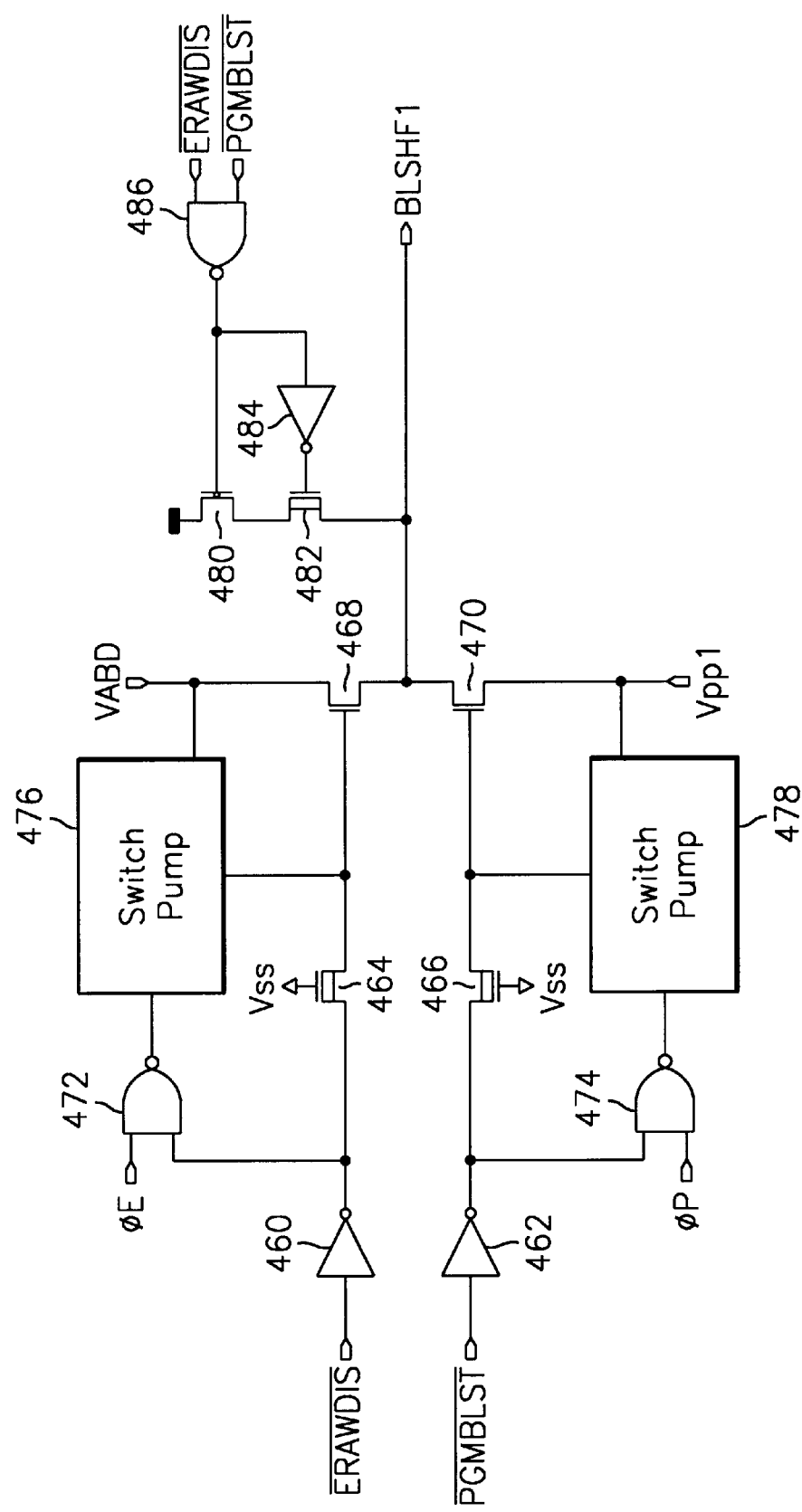
FIGS. 14A through 14I illustrate circuits for the controlling voltages and signal lines shown of FIG. 14.

FIG. 14 shows the internal construction of the page buffers PB1–PB256 in the page buffer circuitry 35 interposed between the bit lines BL1–BL512 and data input/output lines IO0–IO7, corresponding to the sub-block SBk shown in FIG. 11B. Each page buffer is connected between a pair of the bit lines and a pair of the input/output lines, including two sense amplifiers and one data latch. In PB1, which is a representative structure, depletion transistors 418a and 420a are connected between BL1 and slave bit line SBL1, and depletion transistors 418b and 420b are connected in series between BL2 and SBL2. The gates of 418a and 418b are coupled to first bit line shielding signal BLSHF1, and the gates of 418b and 420b are coupled to second bit line shielding signal BLSHF2. The pair of slave bit lines, SBL1 and SBL2, is connected to a pair of data lines DL1 and DL2 through transistors 430a and 430b, respectively, whose gates are each coupled to isolation signals ΦISOo and ΦISOe. On the slave bit line pair, precharging circuit 422 is provided with transistor 424a connected between precharging voltage VSBL and SBL1, transistor 424b is connected between VSBL and SBL2, and equalizing transistor 426 is connected between SBL1 and SBL2. The gates of 424a and 424b are coupled to odd and even slave bit line precharging signals φSBLPo and φSBLPe, respectively, and the gate of 426 to slave bit line equalizing signal φSBLEQ. Transistors 428a and 428b are connected in parallel between voltage lines ERVF and ERVFSL which are used in an erasure verifying operation to be described hereinbelow, and their gates are connected to SBL1 and SBL2, respectively. On the pair of data lines DL1 and DL2, first and second sense amplifiers 432 and 438 and data line precharging circuit 444 are provided therein. In the first sense amplifier 432, transistors 434a and 436a are connected between DL1 and sensing source voltage line VSA, and transistors 434b and 436b are connected between DL2 and VSA. The gates of 434a and 434b are connected to SBL1 and SBL2, respectively, and the gates of 436a and 436b to enable signal ΦSAE in common. The second sense amplifier 438 is formed of N- and P-type latched sense amplifiers constructed of transistors 440a and 440b, 442a and 442b. Sensing control signals LA and $\overline{LA}$ are applied to the N- and P-type latched sense amplifiers. The precharging circuit 444 is constructed of transistors 446a and 446b connected in series between DL1 and DL2, and transistor 447 between DL1 and DL2. The gates of 446a and 446b are coupled to sense amplifier equalizing signal φSAEQ, and the gate of 447 to ΦSAEQ. A pair of transistors 458a and 458b, whose gates are coupled to a column selection line, are connected between the pair of the data lines, DL1 and DL2, and the pair IO0 and $\overline{IO0}$. The data latch 448 is formed of latch 452, made of inverters, and a pair of transistors 450a and 450b connected between the data line pair and both ends of latch 452. Column isolation signal ΦISOSC is applied to the gates of the transistors 450a and 450b.

Figure 14B:
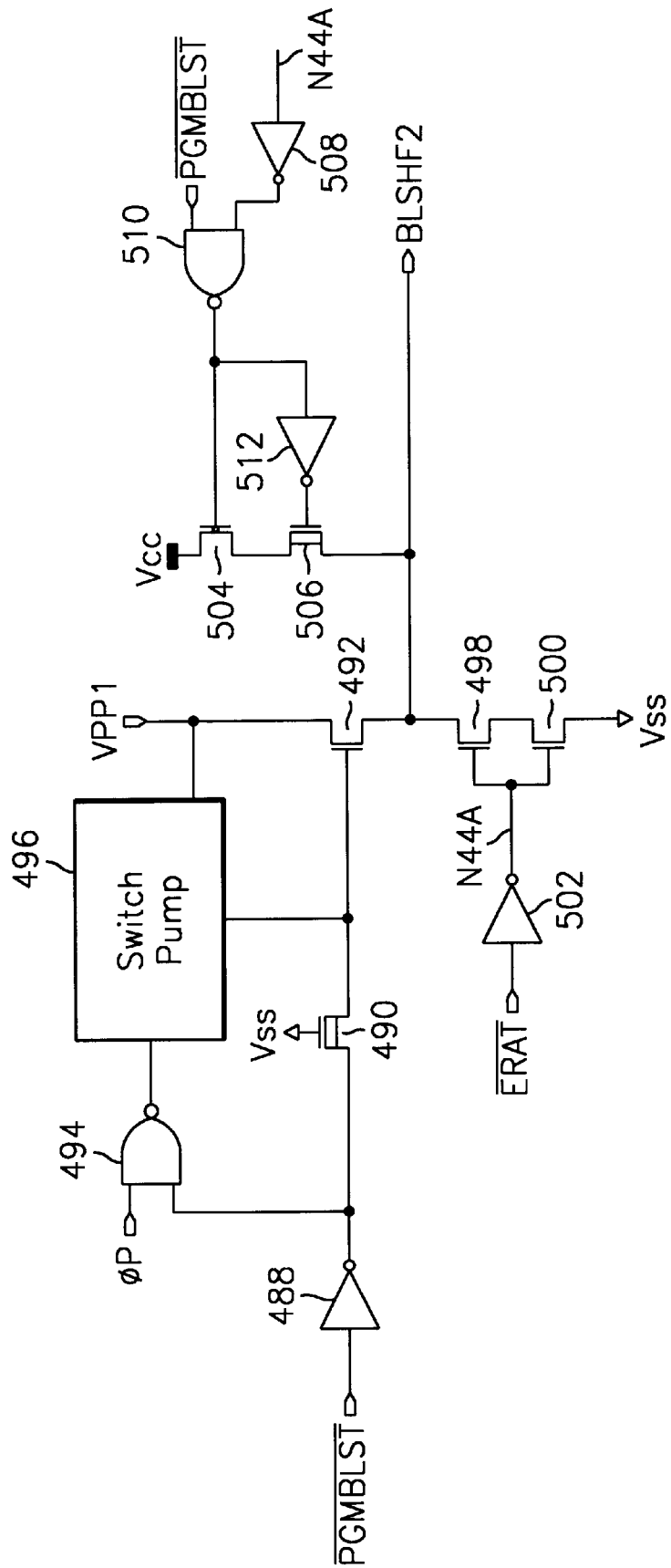

FIGS. 14A through 14I show techniques for generating the voltages and signals in FIG. 14. Referring FIG. 14A for BLSHF1, signal $\overline{ERAWDIS}$, which is held at a low level during erasing and erasure recovery periods of the erasure mode, is applied to the gate of NMOS transistor 468 through inverter 460 and NMOS depletion transistor 464 whose gate is grounded. Signal $\overline{PGMBLST}$, which is held at a low level during programming and data setting periods of the programming mode, is applied to the gate of NMOS transistor 470 through inverter 462 and NMOS depletion transistor 466 whose gate is grounded. BLSBF1 is generated from a source-drain common node of the transistors 468 and 470. The output of inverter 460 is connected to the input of NAND gate 472 together with signal ΦE which is a periodic pulsing signal for erasing. The output of inverter 462 is connected to the input of NAND gate 474 together with signal ΦP which is a periodic pulsing signal for programming. The output of NAND gate 472 is applied to switch pump 476 which is connected to voltage VABD of 8V and supplies a pumping voltage to the gate of transistor 468. The VABD of 8V is applied thereto during the erasure mode. The output of NAND gate 474 is applied to switch pump 478 which is connected to voltage Vpp1 of 4.5V and supplies a pumping voltage to the gate of transistor 470. The Vpp1 of 4.5V is applied thereto during the programming mode. Between power supply voltage Vcc and BLSHF1, PMOS transistor 480 and NMOS depletion transistor 482 are connected in series. The gate of transistor 480 is connected to output of NAND gate 486 and the gate of transistor 482 is coupled to an inverted signal of the output of NAND gate 486. NAND gate 486 receives $\overline{ERAWDIS}$ and $\overline{PGMBLST}$. Source of transistor 468 and drain of transistor 470 are connected to VABD and Vpp1, respectively. Thus the voltage level of BLSHF1 is charged up to 8V (the VABD level) for erasing and erasure recovering in the erasure mode, Vpp1 for programming and data setting for bit line in the programming mode and Vcc in the other modes. In FIG. 14B for generating BLSHF2, $\overline{PGMBLST}$ is applied to NAND gate 494 through inverter 488 and to the gate of NMOS transistor 492 through NMOS depletion transistor 490. The gate of transistor 490 is grounded. ΦP is also applied to the input of NAND gate 494 whose output is applied to switch pump 496 as an oscillating signal as in FIG. 14A. Switch pump 496 is coupled to Vpp1 and supplies a pumping voltage to the gate of transistor 492 which is connected between Vpp1 and BLSHF2. Between BLSHF2 and Vss (or the ground), NMOS transistors 498 and 500 are connected to respond an inverted signal of $\overline{ERAT}$ which is held low for erasing and erasure recovering. Thus, the voltage level of BLSHF2 is held on Vss (0V or the ground) for erasing and erasure recovering, Vpp1 for programming and data setting and Vcc in the other modes.

Figure 14C:
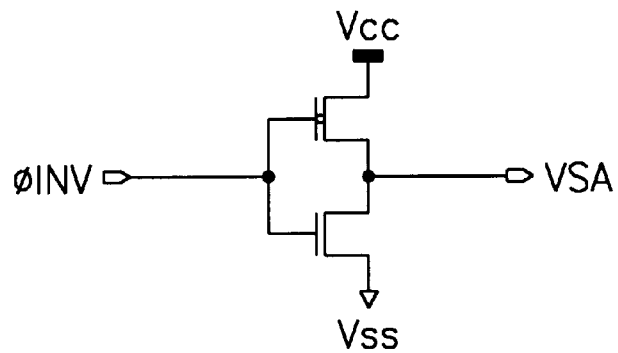

Referring FIG. 14C, VSA, source voltage for the first sense amplifier 432 in FIG. 14, responds to signal ΦINV which indicates an inverting read mode or a non-inverting read mode, so that VSA is 0V in the inverting read mode and Vcc in the non-inverting read mode.

Figure 14D:
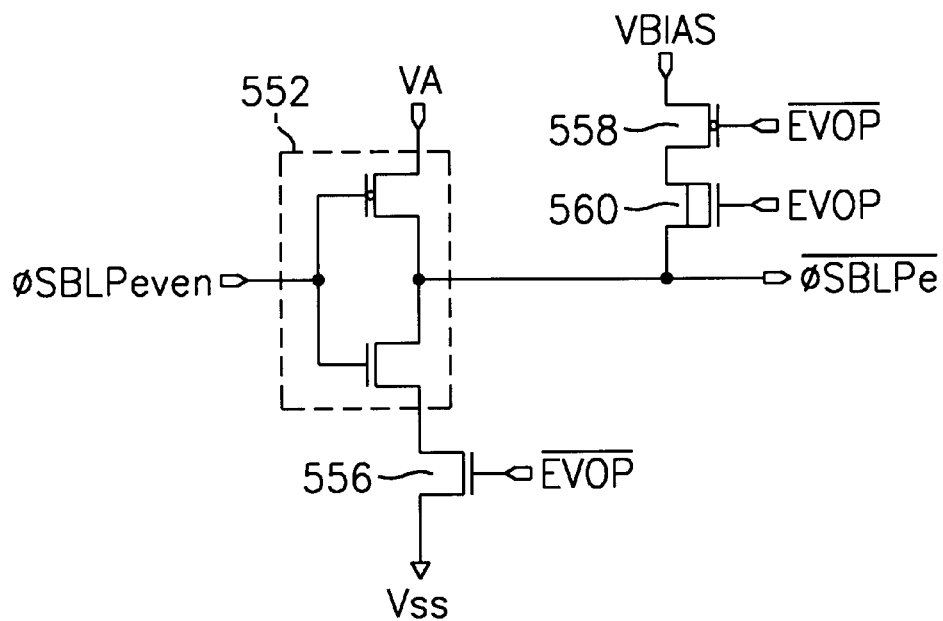
Figure 14E:
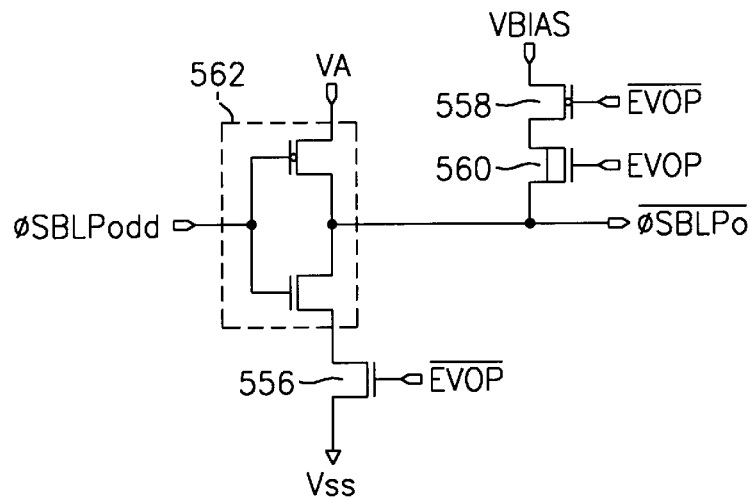

The manners for controlling the slave bit line precharging signals φSBLPe and φSBLPo are shown in FIGS. 14D and 14E. Referring FIG. 14D, φSBLPe is generated from inverter 552 which receives ΦSBLPeven. Between inverter 552 and Vss (or the ground), NMOS transistor 556, whose gate is coupled to signal $\overline{EVOP}$ is connected. Source and bulk of the PMOS transistor of inverter 552 are connected to voltage line VA of the Vpp1 level. Between VBIAS and φSBLPe, PMOS transistor 558 and NMOS depletion transistor 560 are connected. Source and bulk of transistor 558 are coupled to VBIAS. The gates of the transistors 558 and 560 are coupled to $\overline{EVOP}$ and EVOP, respectively. EVOP is held low but high level for erasure verifying and $\overline{EVOP}$ is the complementary. The generations of VA and VBIAS will be described with the following FIGS. 14H and 14I. φSBLPe goes to 0V, Vpp1 on VA or VBIAS in response to the voltage levels of φSBLPeven, EVOP and $\overline{EVOP}$. As an example, in the erasure verifying operation, if EVOP and $\overline{EVOP}$ are high and low levels and ΦSBLPeven goe s to high level, the φSBLPebecomes VBIAS. In the other operations, φSBLPe varies along the voltage levels of ΦpSBLPeven and VA. The circuit of FIG. 14E for generating φSBLPo is the same with that of FIG. 14D but input of inverter 562 is ΦSBLPodd instead of the ΦSBLPeven.

Figure 14F:
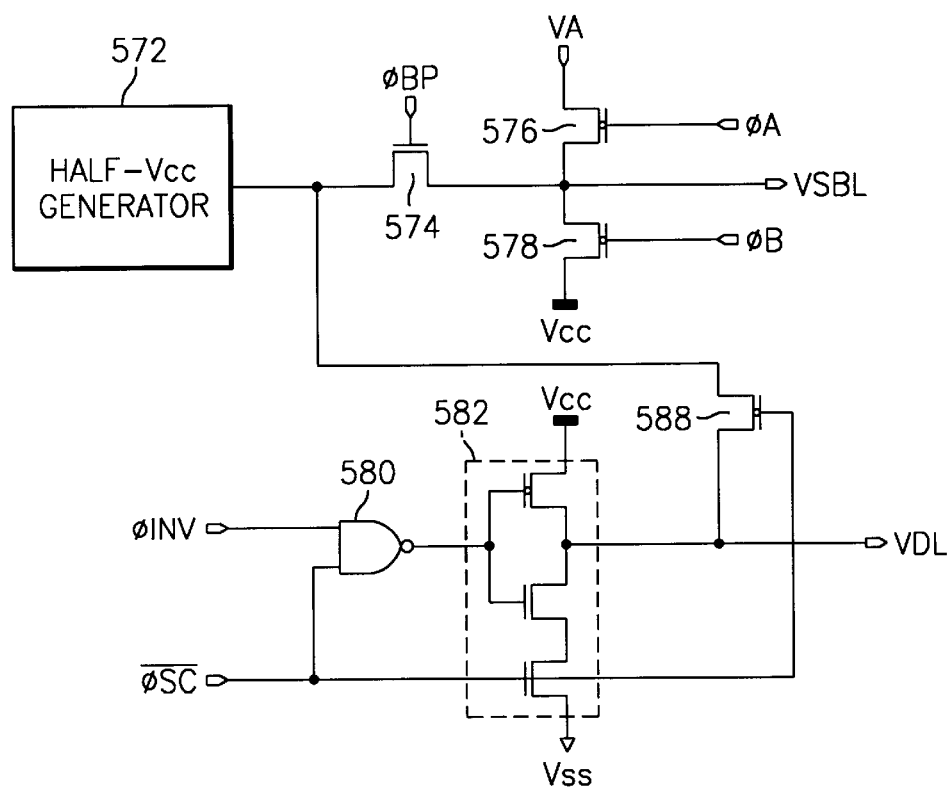

FIG. 14F shows a circuit for controlling VSBL and VDL of FIG. 14. The output of half-Vcc generator 572 is connected to VSBL through an NMOS transistor whose gate is coupled to signal ΦBP. Between VSBL and VA, PMOS transistor 576, whose gate is coupled to ΦA, is connected. Between VSBL and power supply voltage Vcc, PMOS transistor 578, whose gate is coupled to signal ΦB, is connected. The output of half-Vcc generator 572 is also connected to VDL through PMOS transistor 588, whose gate is coupled to signal φSC. φSC and ΦINV are applied to NAND gate 580 whose output is connected to VDL through inverter 582. φSC is also connected to the gate of NMOS transistor 586 which is connected between inverter 582 and Vss (ground or 0V). VSBL goes to half-Vcc when all of ΦBP, ΦA and ΦB are at Vpp1 (4.5V). Otherwise, VSBL is charge up to Vpp1 of VA when ΦBP and ΦA are at low levels, and goes to Vcc when ΦBP and ΦB are at low levels. Variations of ΦINV and $\overline{\phi SC}$ make VSBL be half-Vcc, Vcc or 0V.

Figure 14G:
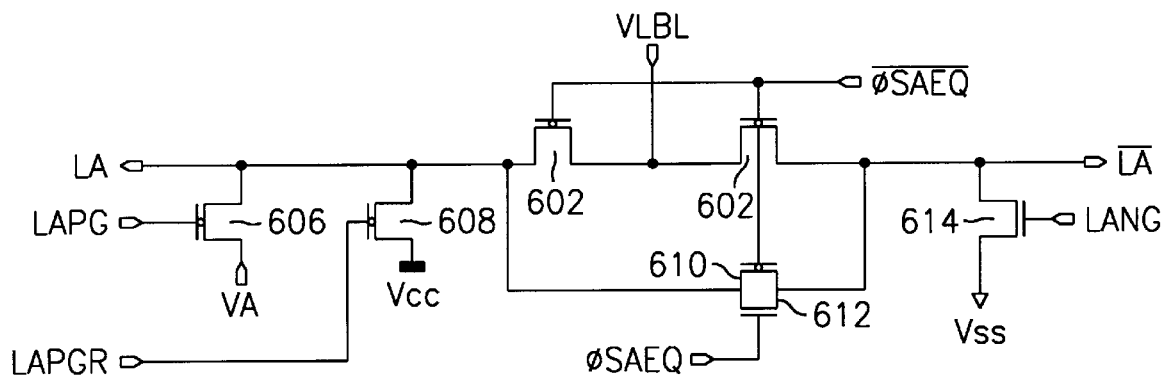

Referring to FIG. 14G, PMOS transistors 602 and 604, whose gates are coupled to $\overline{\phi SAEQ}$, are connected in series between LA and $\overline{LA}$ for controlling LA and $\overline{LA}$. A node between the two PMOS transistors 602 and 604 is connected to VLBL. $\overline{\phi SAEQ}$ is also applied to the P-type gate of CMOS transmission gate 610, whose N-type gate is coupled to ΦSAEQ, is connected between LA and $\overline{LA}$ for equalizing LA and $\overline{LA}$. Transistor 606, whose gate is coupled to signal LAPG, is connected between LA and VA, and transistor 608, whose gate is coupled to signal LAPGR, is connected to LA and Vcc. Transistor 614, whose gate is coupled to signal LANG, is connected between $\overline{LA}$ and Vss.

Figure 14H:
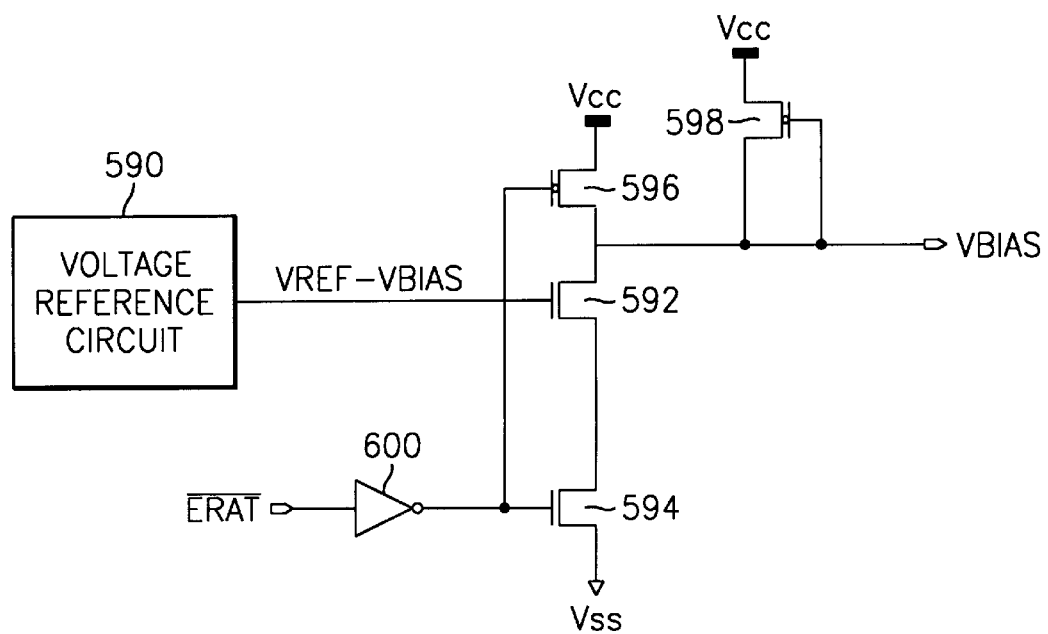
Figure 14I:
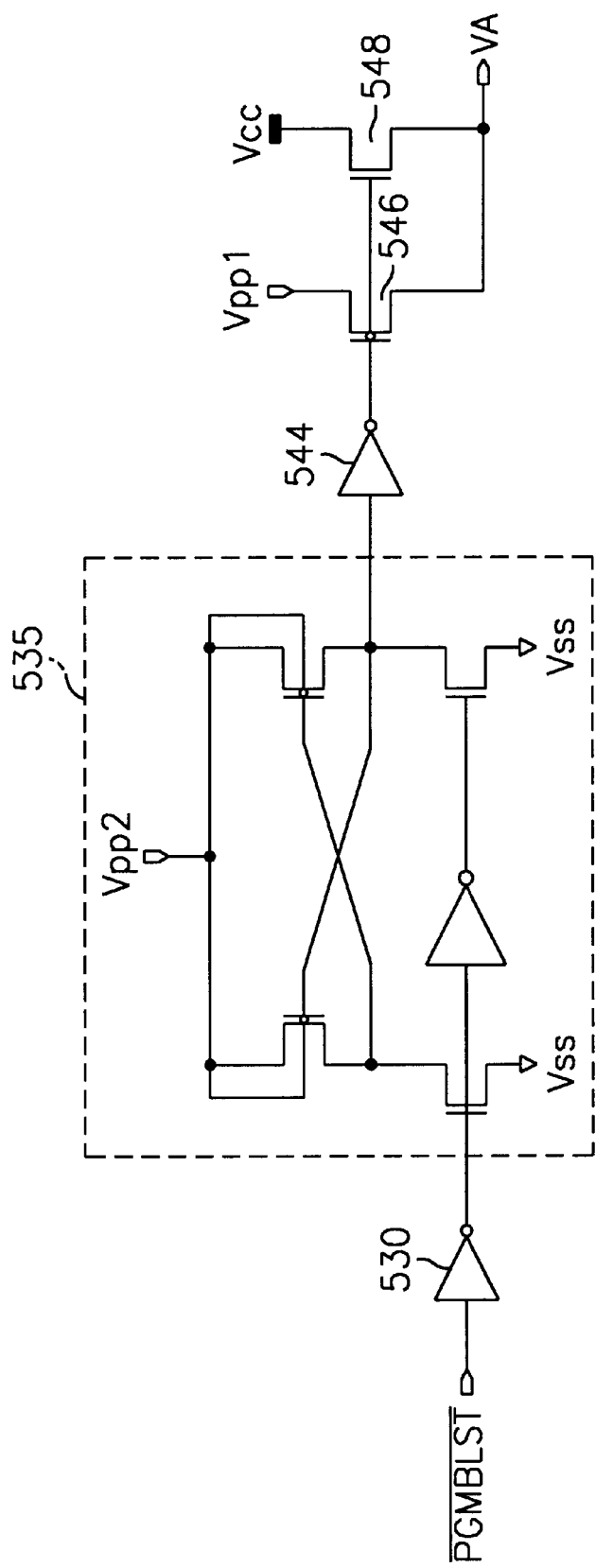

FIGS. 14H and 14I are circuits for generating VBIAS and VA used in the circuits of FIGS. 14D through 14G. In FIG. 14H, VBIAS is generated from the drain node of NMOS transistor 592 whose gate is connected to the output of voltage reference circuit 590. Signal $\overline{ERAT}$, which is held low during the erasure mode, is applied to the gate of NMOS transistor 594 through inverter 600 which is connected between source of transistor 592 and Vss. The inverted signal $\overline{ERAT}$ is also applied to the gate of PMOS transistor 596 which is connected between Vcc and the drain of transistor 592. Diode-connected PMOS transistor 598 is connected between Vcc and VBIAS. The circuit of FIG. 14H is used for generating a constant VBIAS even in when the power voltage varies. Referring to FIG. 14I, the circuit for VA has level shifting circuit 535 which uses pumping voltage Vpp2 of 6V as a power voltage source. $\overline{PGMBLST}$, which goes to 0V for programming and data setting, is applied to the input of level shifting circuit 535 through inverter 530. The output of level shifting circuit 535 is connected to the gates of PMOS and NMOS transistors 546 and 548. PMOS transistor 546 is connected between Vpp1 and VA, and NMOS transistor 548 is connected between Vcc and VA. Thus, VA is charged up to Vpp1 for programming and data setting and retains Vcc at other times.

Figure 15:
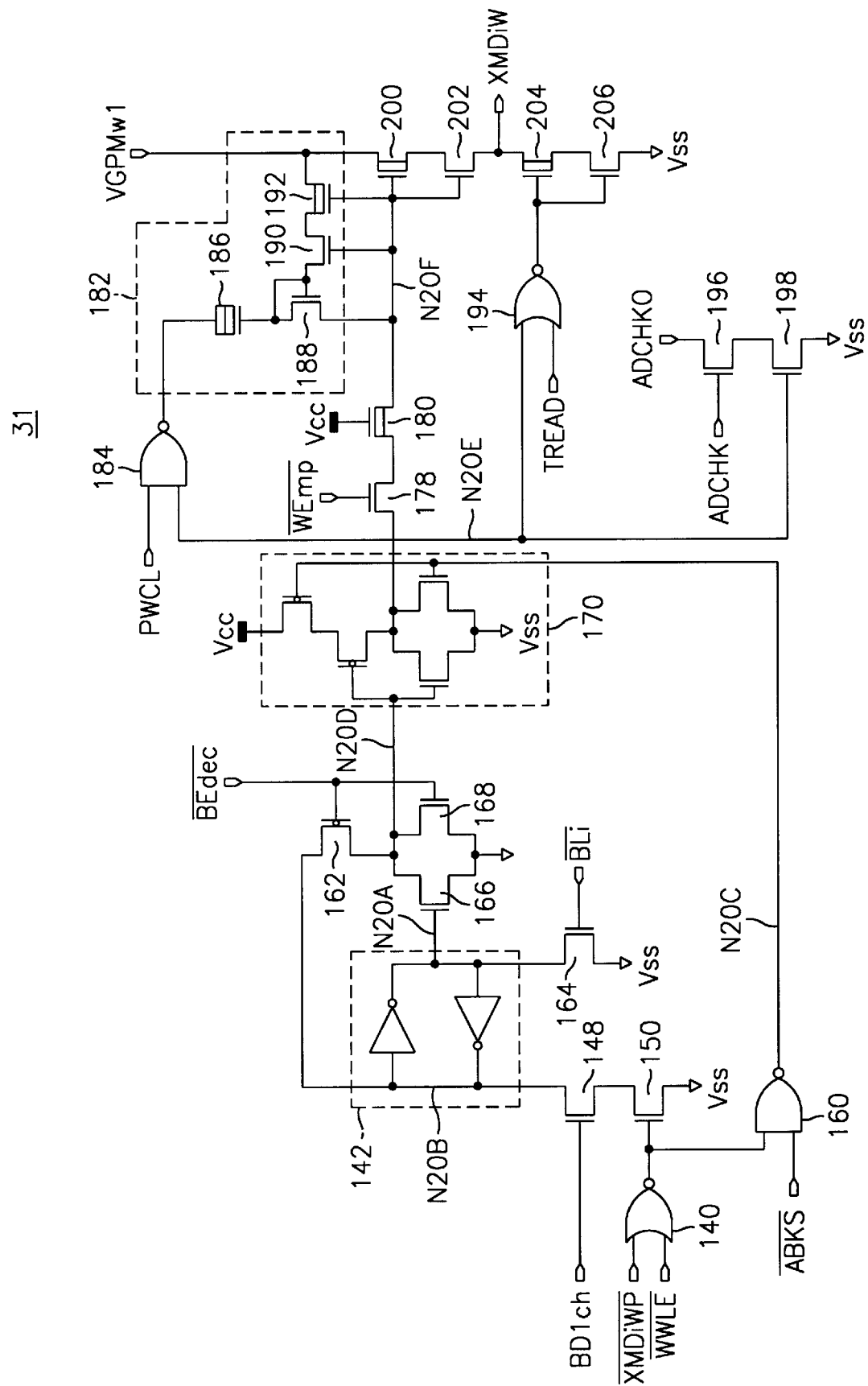
FIG. 15 is a circuit diagram of the writing row decoder in FIG. 9.

FIG. 15 shows the circuit construction of writing row decoder 31 shown in FIG. 9, for generating writing block selection signal XMDiW. $\overline{XMDiWP}$ and $\overline{WWLE}$ are applied to NOR gate 140. $\overline{XMDiWP}$ is a flag signal for the writing block selection and $\overline{WWLE}$ is a signal for selecting the writing row decoder. The output of NOR gate 140 is applied to the gate of NMOS transistor 150 and NAND gate 160 which receives signal $\overline{ABKS}$. Transistor 150 is connected between one node N20B of latch 142 and Vss, together with NMOS transistor 148, in series. The gate of transistor 148 is coupled to block information decoding signal BD1ch. The other node N20A of latch 142 is connected to Vss through NMOS transistor 164, whose gate is coupled to $\overline{BLi}$ (i=1, 2, ..., or 512) and applied to the gate of NMOS transistor 166 which is connected between node N20D and Vss, together with transistor 168, whose gate is coupled to block activation signal $\overline{BEdec}$. $\overline{BEdec}$ is also applied to the gate of PMOS transistor 162 which is connected between nodes N20B and N20D. Node N20D and the output of NAND gate 160 become the input of NOR circuit 170 whose output is connected to node N20E. Node N20E is connected to the gates of NMOS transistor 200 and NMOS depletion transistor 202 through NMOS transistor 178 and NMOS depletion transistor 180, whose gates are respectively coupled to signal $\overline{WEmp}$ and Vcc, and applied to the inputs of NAND and NOR gates 184 and 194, and the gate of NMOS transistor 198. $\overline{WEmp}$ is a signal that is activated for the writing mode. NAND and NOR gates 184 and 194 also receive signals PWCL and TREAD, respectively. TREAD is high only during the reading operation. Transistor 198 is connected between signal ADCHKO and Vss in series, together with NMOS transistor 196 whose gate is coupled to signal ADCHK. The circuit of transistors 196 and 198 is used to detect a voltage level on node N20E during the erasure verifying mode. The output of NAND gate 184 is applied to switch pump 182. Switch pump 182 is formed of MOS capacitor 186, diode-connected NMOS transistor 188, NMOS transistor 190 and NMOS depletion transistor 192. The gates of the transistors 188, 190 and 192 are connected to node N20F which is the gate node of NMOS depletion transistor 200. The drain of transistor 200 is connected to VPGMw1 (over 20V) that is also applied to switch pump 182. Node N20F is also coupled to the gate of NMOS transistor 202 connected between transistor 200 and XMDiW. Between XMDiW and Vss, NMOS depletion transistor 204 and NMOS transistor 206 are connected with their gates coupled to ouput of NOR gate 194. XMDiW, which corresponds to a selected block, will be at the voltage level of VPGMw1.

Figure 16:
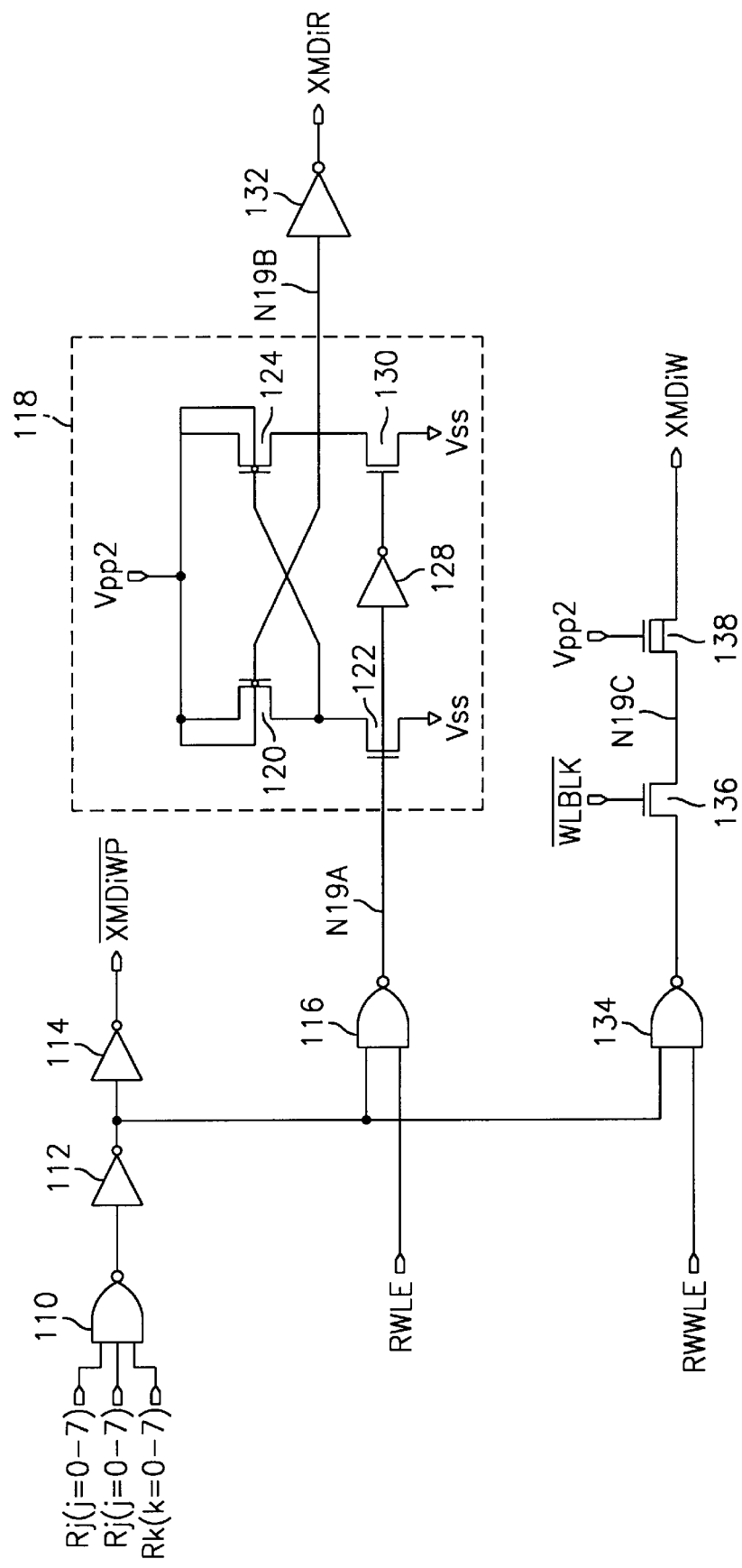
FIG. 16 is a circuit diagram of the reading row decoder of FIG. 9.

FIG. 16 shows the reading row decoder shown in FIG. 9 which generates reading block selection signal XMDiR (the character i is one of 1 through 8 corresponding to the number of the sub-blocks in the memory block). The outputs from reading row pre-decoder 70 are applied to the input of NAND gate 110 whose output is connected to $\overline{XMDiWP}$ through inverters 112 and 114. The output of inverter 112 is connected to the inputs of NAND gates 116 and 134 which receive signals RWLE and RWWLE, respectively. The output of NAND gate 116 is connected to the input of level shifting circuit 118 which uses Vpp2 (6V) as a power source voltage. The output of level shifting circuit 118 is applied to inverter 132 whose output becomes XMDiR. The output of NAND gate 134 is connected to XMDiW through NMOS transistor 136 and NMOS depletion transistor 138 whose gates are respectively coupled to the signal $\overline{WLBLK}$ and Vpp2. Signals RWLE, RWWLE and $\overline{WLBLK}$ are activated in the writing and reading modes. Transistor 136 discharges XMDiW to Vss and transistor 138 prevents the drain of transistor 136 from gate-induced breakdown when XMDiW goes to a high level over 18V during the writing mode.

Figure 17:
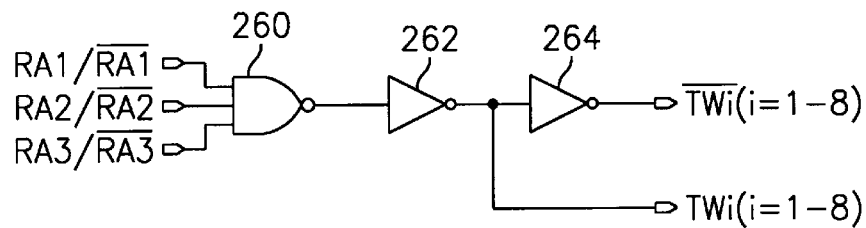
FIG. 17 is a circuit diagram of the writing row pre-decoder of FIG. 9.
Figure 18A:
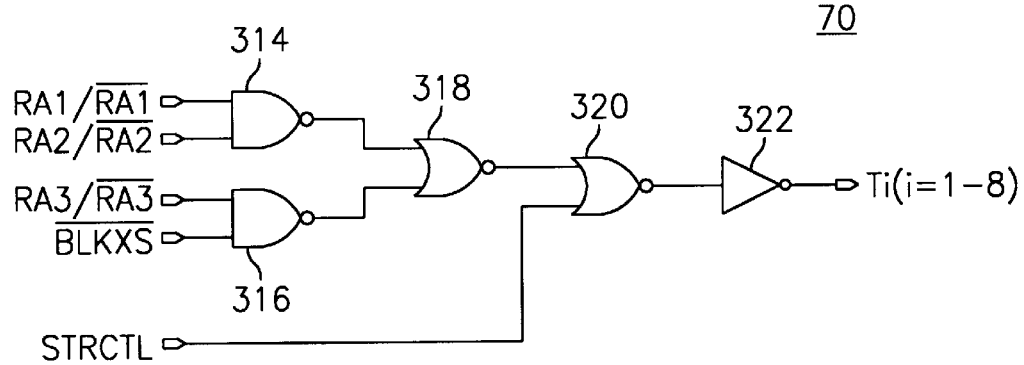
FIGS. 18A and 18B are circuit diagrams of the reading row pre-decoder of FIG. 9.
Figure 18B:
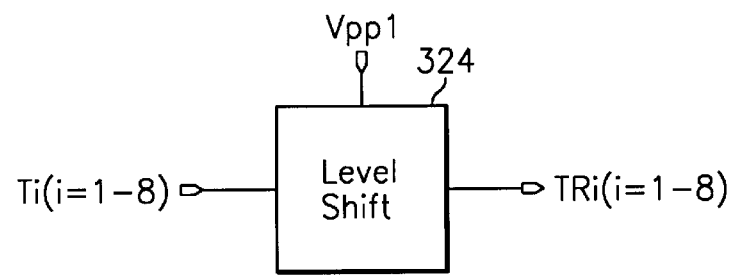

In FIG. 17, Writing row pre-decoder 69 shown in FIG. 9 receives row address signals RA1/$\overline{RA1}$, RA2/$\overline{RA2}$ and RA3/$\overline{RA3}$ and generates writing row address decoding signal TWi/$\overline{TWi}$ (i is one of 1 through 8). Referring FIGS. 18A and 18B, reading row pre-decoder 70 generates signal Ti in response to row address signals RA1/$\overline{RA1}$, RA2/$\overline{RA2}$ and RA3/$\overline{RA3}$, and signals $\overline{BLKSX}$ and STRCTL, and generates reading row address decoding signal TRi (i is one of 1 through 8) through level shifting circuit 324 which uses Vpp1 as a power source voltage and increases the voltage level of Ti which is ranged between Vcc (3V) and Vss.

Figure 19A:
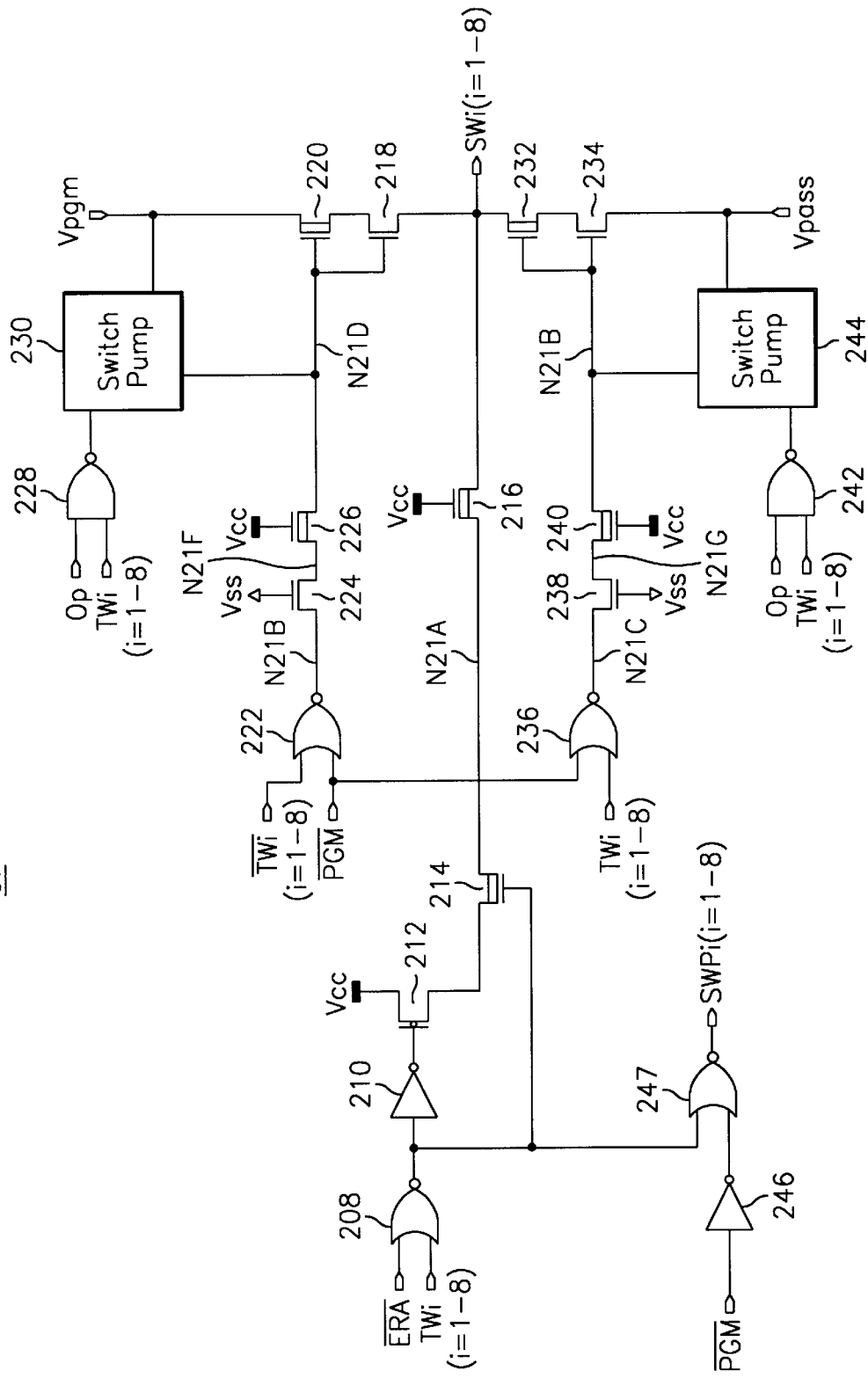
FIGS. 19A through 19F show circuits of the writing gate drive circuit of FIG. 9, for controlling the writing drive signals shown in FIGS. 11A and C.
Figure 19B:
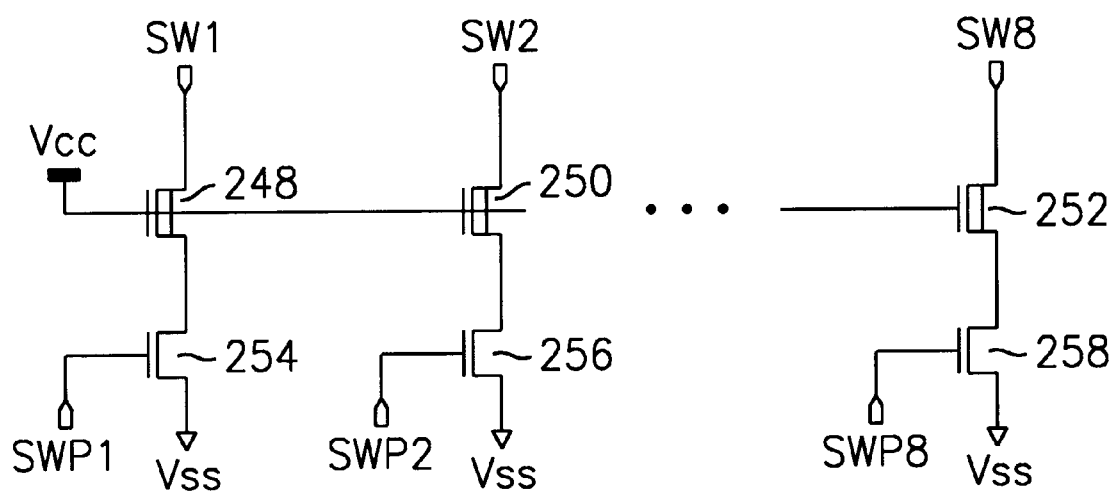

FIGS. 19A through 20F show circuits for generating and controlling the drive lines, involved in the writing operation, in FIGS. 11A through 11C, included in writing gate drive circuit 67. Referring to FIG. 19A, NOR gate 208 receives $\overline{ERA}$ and Twi, and applies its output to inverter 210 and the input of NOR gate 247 so as to generate writing word line drive signal SWi (i is one of 1 through 8) in response to the erasure enable signal $\overline{ERA}$, program enable signal $\overline{PGM}$ and writing row decoding signal TWi. NOR gate 247 receives $\overline{PGM}$ through inverter 246 and generates the signal SWPi for controlling the charging and discharging of SWi. The output of inverter 210 is connected to the gate of PMOS transistor 212 whose source is connected to Vcc. The drain of transistor 212 is connected to SWi through NMOS depletion transistors 214 and 216 whose gates are each coupled to the output of NOR gate 208 and Vcc. NMOS depletion transistor 220 and NMOS transistor 218 are connected between program voltage Vpgm and SWi. The gates of transistors 218 and 220 are coupled to the output of NOR gate 222 through NMOS depletion transistor 226 and NMOS transistor 224 whose gates are each coupled to Vcc and Vss. NOR gate 222 receives TWi and $\overline{PGM}$. Vpgm is also applied to switch pump 230 which applies a pumping voltage to the gates of transistors 220 and 218 in response to the output of NAND gate 228 which receives oscillating signal Op and TWi. Between SWi and pass voltage Vpass in programming, NMOS depletion transistor 232 and NMOS transistor 234, whose gates are coupled to output of NOR gate 236 which receives TWi and $\overline{PGM}$ are connected through NMOS depletion transistor 240 and NMOS transistor 238 whose gates are each coupled to Vcc and Vss. Vpass is also applied to switch pump 244 which applies a pumping voltage to the gates of transistors 232 and 234 in response to the output of NAND gate 242 which receives oscillating signal Op and TWi. Vpgm is loaded on SWi when the SWi corresponds to a selected word line in the writing mode, and Vpass is generated when the SWi corresponds to a non-selected word line. Switch pumps 230 and 244 generate sufficiently high gate voltages for the pull-up transistors, 220, 218, 232 and 234, to transfer Vpgm and Vpass to SWi. The discharging signals SWP1–SWP8, referring to FIG. 19B, are applied to the gates of NMOS transistors 254, 256, . . . , and 258 whose sources are connected to Vss. The drains of transistors 254 through 258 are connected to SW1 through SW8 via NMOS depletion transistors 248, 250, . . . , and 252, respectively. The gates of transistors 248 through 252 are all coupled to Vcc.

Figure 19C:
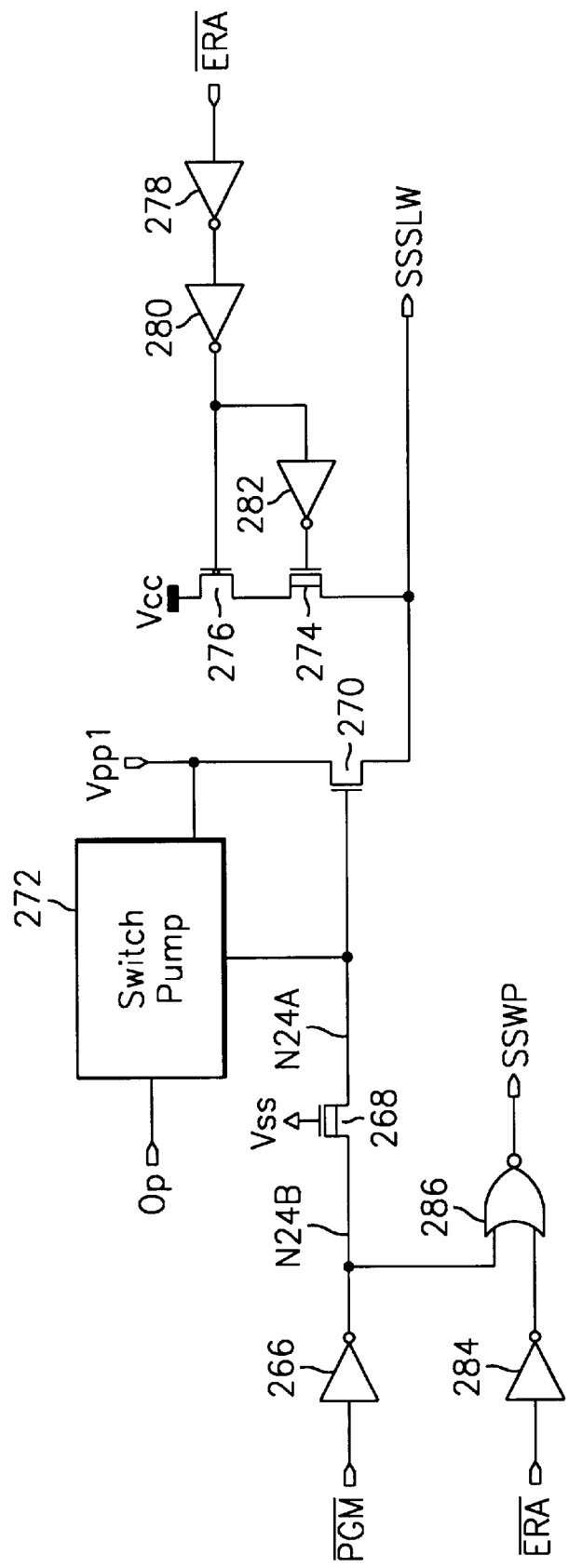
Figure 19D:
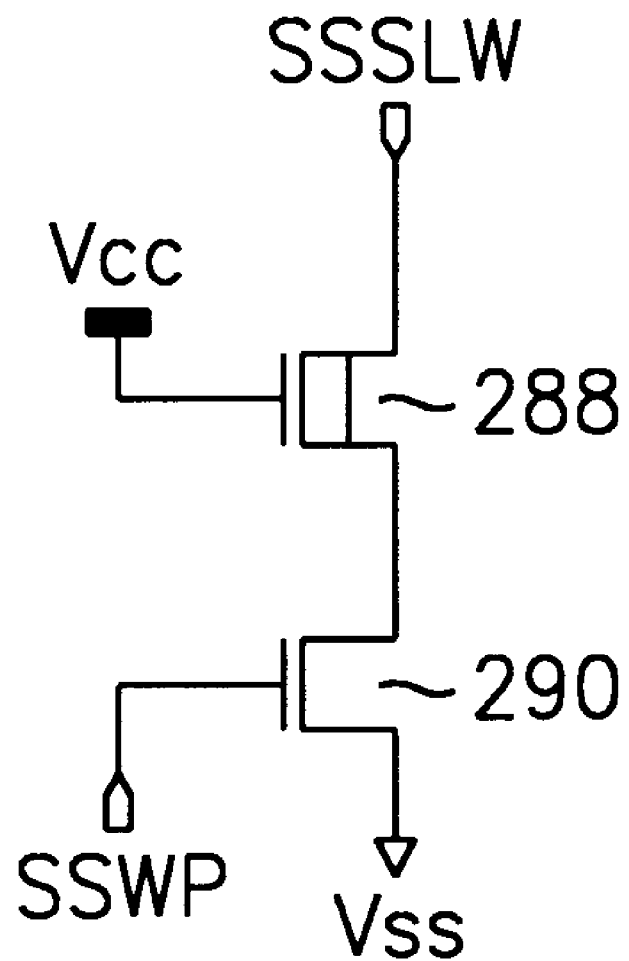

Referring to FIGS. 19C and 19D, writing string selection drive signal (or line) SSSLW is generated in response to $\overline{PGM}$ and $\overline{ERA}$ and discharged by SSWP. $\overline{PGM}$ is applied to the gate of NMOS transistor 270 through inverter 266 and NMOS depletion transistor 268, which is connected between Vpp1 and SSSLW. The gate of transistor 268 is coupled to Vss. The output of inverter 266 is applied to NOR gate 286 together with the inverted signal $\overline{ERA}$ to generate SSWP. Switch pump 272 applies a pumping voltage to the gate of transistor 270 using Vpp1, in response to Op. PMOS transistor 276 and NMOS depletion transistor 274 are connected in series between Vcc and SSSLW. The discharging circuit of FIG. 19D is constructed in the same manner as the circuit of FIG. 19B, in which SSWP is connected to the gate of NMOS transistor 290 which is coupled to SSSLW through NMOS depletion transistor 288.

Figure 19E:
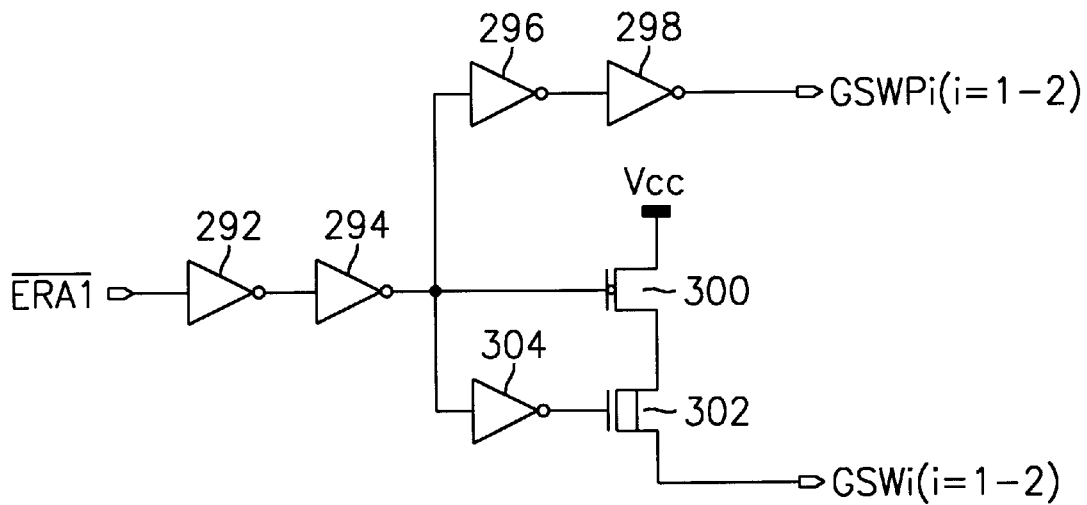
Figure 19F:
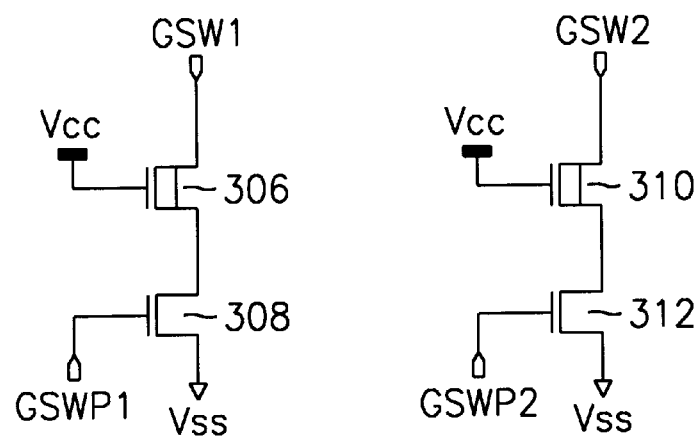

In FIGS. 19E and 19F, $\overline{ERA1}$ is applied to the gate of PMOS transistor 300 through inverters 292 and 294 for writing ground selection drive signal GSWi (i is one of 1 and 2 corresponding to the two ground selection lines GSL1 and GSL2 as shown in FIG. 11C). Also, it is applied to the gate of NMOS depletion transistor 302 through inverters 292, 294 and 304. Transistors 300 and 302 are connected between Vcc and GSWi. GSWPi is generated by delaying the output of the inverter 294 through inverters 296 and 298. The discharging circuit of FIG. 19F is constructed in the same manner as the circuit of FIG. 19B or 19D, in which GSWP1 and GSWP2 are each coupled to the gate of NMOS transistors 308 and 312 which are respectively connected to GSLW1 and GSW2 through NMOS depletion transistors 306 and 310. The GSWi is Vcc of 3V in the erasure mode and held at Vss of 0V in the other modes.

Figure 20A:
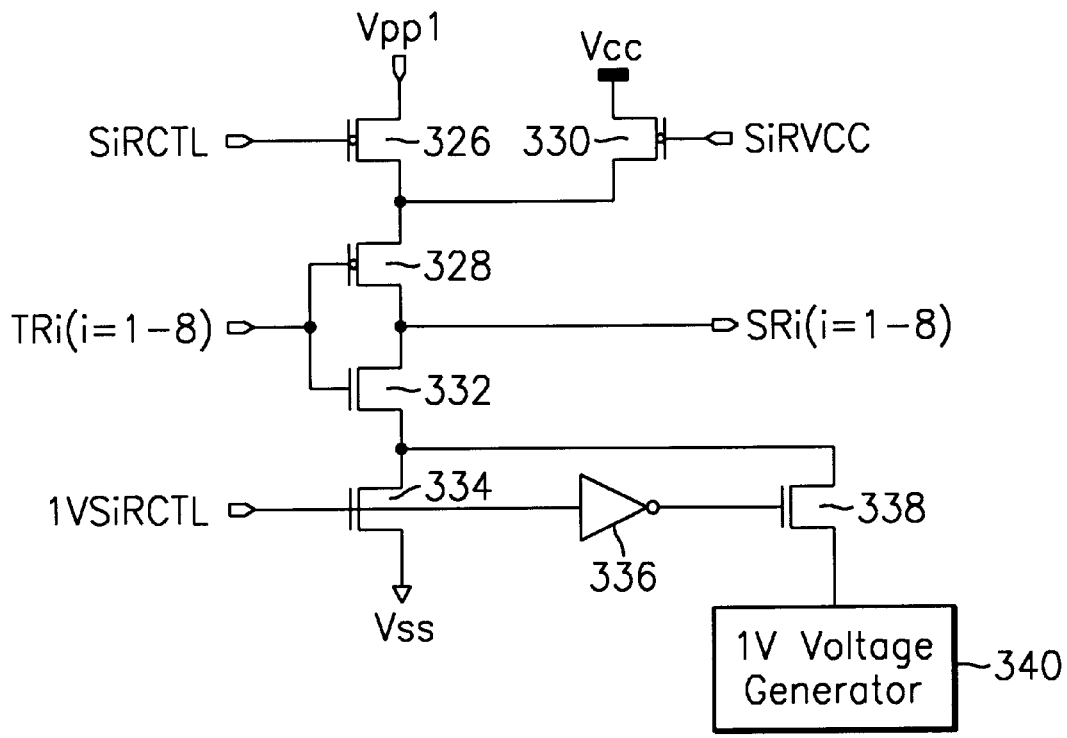
FIGS. 20A through 20E show circuits of the reading gate drive circuit of FIG. 9, for controlling the reading drive signals shown in FIGS. 11A and C.

FIGS. 20A through 20E show circuits for generating and controlling the drive lines, involved in the reading operation, in FIGS. 11A through 11C, included in reading gate drive circuit 68. In FIG. 20A, a signal SiRCTL ranging from Vpp1 to Vss is applied to the gate of PMOS transistor 326, and a signal SiRVCC ranging from Vpp2 to Vss is applied to the gate of PMOS transistor 330 for generating reading word line drive signal SRi (i is one of 1 through 8). The drains of transistors 326 and 330 are connected to the source of PMOS transistor 328 whose drain is connected to SRi. The gate of transistor 328 is coupled to TRi generated from the reading row pre-decoder 70. SRi is also coupled to the drain of NMOS transistor 332, whose gate is connected to TRi. The source of transistor 332 is connected to Vss through NMOS transistor 334 whose gate is coupled to signal 1VSIRCTL which is also applied to the gate of NMOS transistor 338 through inverter 336. Transistor 338 is connected between the source of transistor 332 and the outputt of one-volt generator 340.

Figure 20B:
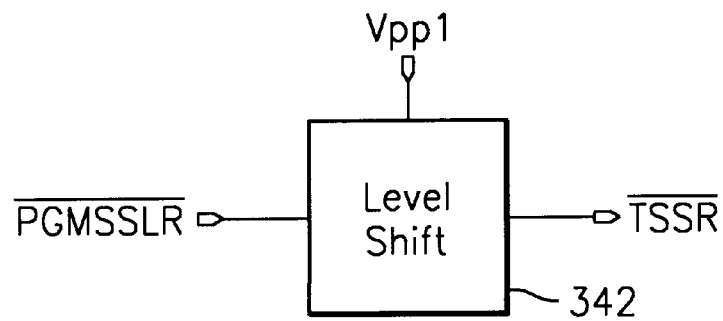
Figure 20C:
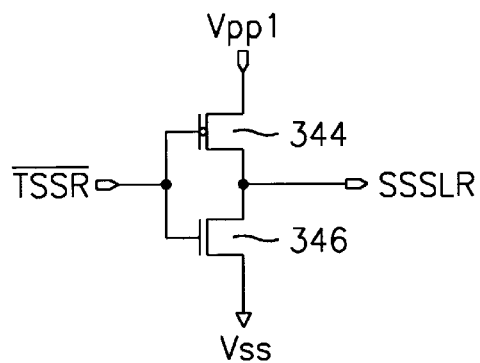
Figure 20D:
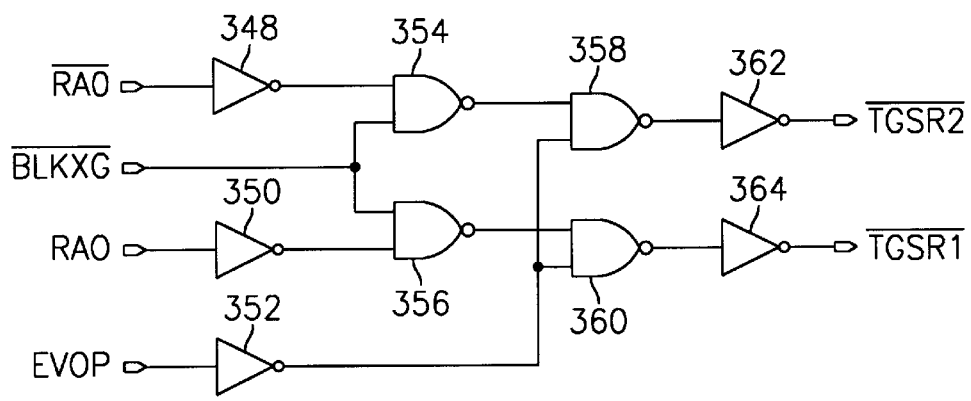
Figure 20E:
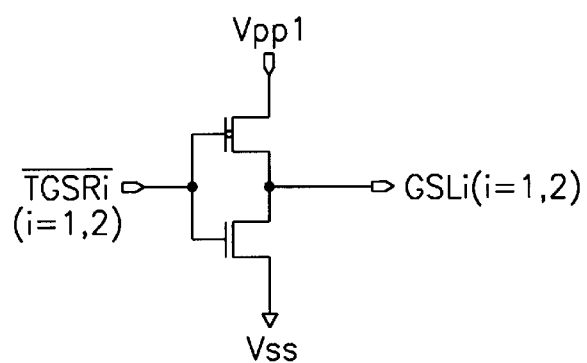

In FIGS. 20B and 20C, for generating reading string selection drive signal SSSLR, signal $\overline{PGMSSLR}$ is converted to signal $\overline{TSSR}$ through level shifting circuit 342 which is connected to Vpp1 as a power source voltage. And then, as shown in FIG. 20C, $\overline{TSSR}$ is changed to SSSLR through the inverter which is connected to Vpp1. FIGS. 20D and 20E are for generating reading ground selection drive signal GSRi. An inverted signal of the lowest address signal $\overline{RA0}$ and signal $\overline{BLKXG}$ are applied to the input of NAND gate 354. $\overline{BLKXG}$ is a signal pulling the ground selection lines down to Vss. $\overline{BLKXG}$ is also applied to the input of NAND gate 356 together with an inverted signal of the lowest address signal RA0. The outputs of NAND gates 354 and 356 are applied to the inputs of NAND gates 358 and 360, respectively, together with an inverted signal of EVOP which goes to high level in the erasure verifying operation. The outputs from NAND gates 358 and 360 are converted to $\overline{TGSR2}$ and $\overline{TGSR1}$ through inverters 362 and 364, respectively. The signals $\overline{TGSRi}$ ($\overline{TGSR1}$ or $\overline{TGSR2}$) become GSRi after passing through the inverter in FIG. 20E.

Figure 21A:
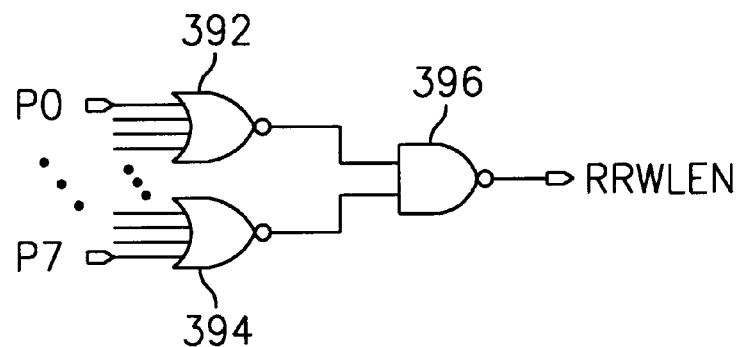
FIGS. 21A through 21C show circuits of the reference block selection circuit of FIG. 9.
Figure 21C:
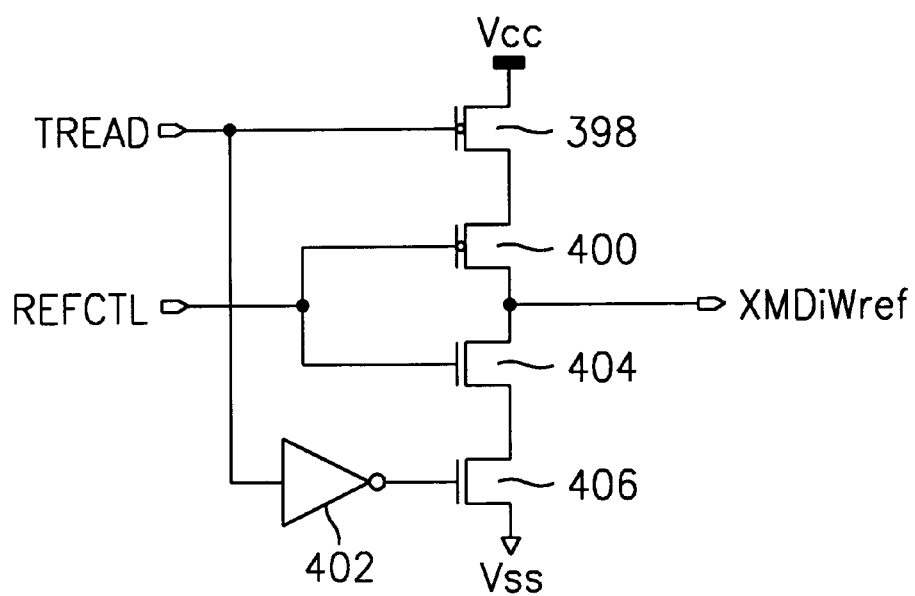
Figure 21B:
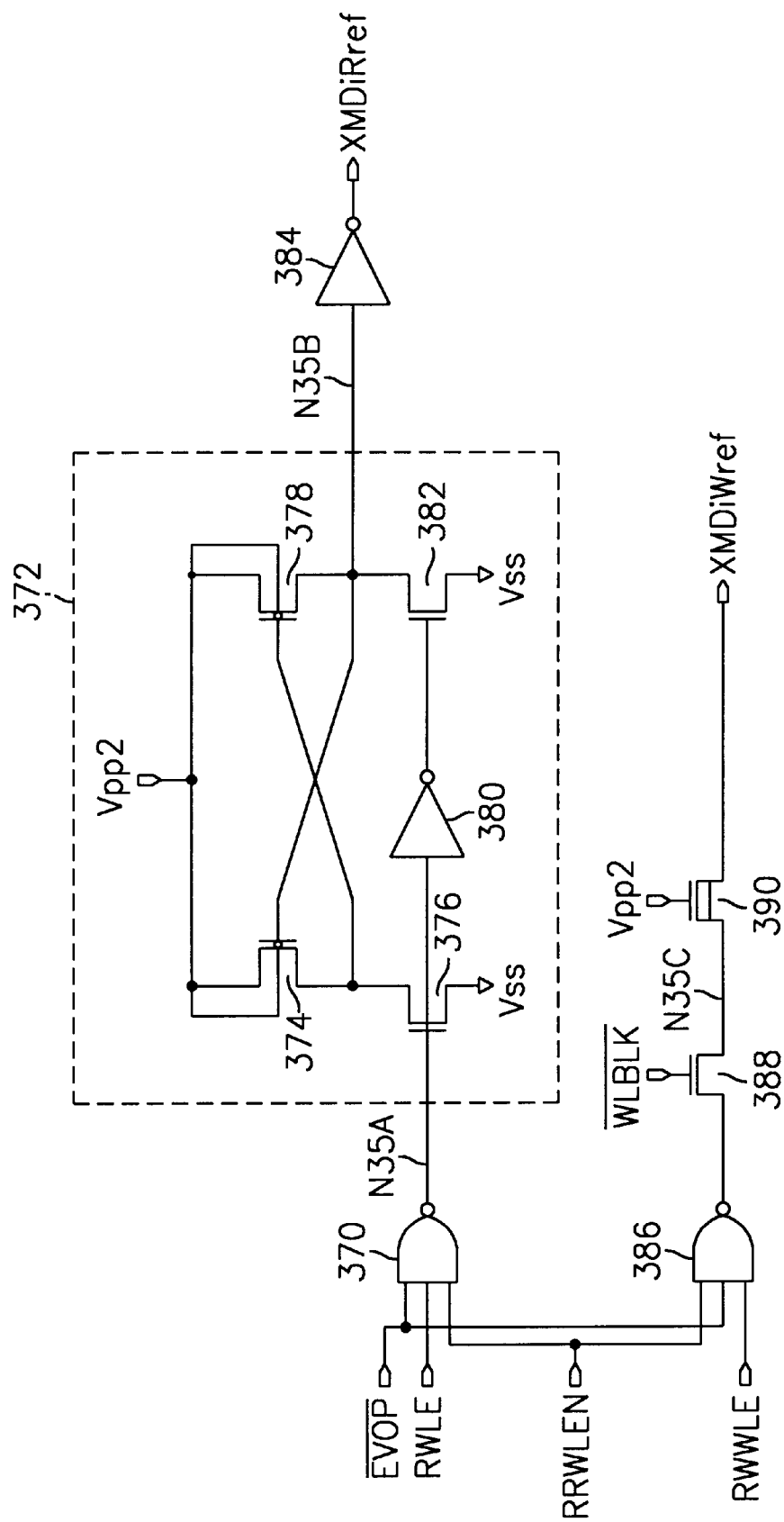

FIGS. 21A through 21C show circuits in reference block selection circuit 60 shown in FIG. 9, generating reference block selection signals XMDiWref and XMDiRref. In FIG. 21A, signal RRWLEN is made from decoding logic formed from NOR and NAND gates, 392 through 396, in response to output signals P0–P7 generated from the reading row pre-decoder 70, and, as shown in FIG. 21B, is applied to the inputs of NAND gates 370 and 386. NAND gate 370 also receives $\overline{EVOP}$ and reading word line enable signal RWLE, and NAND gate 386 receives $\overline{EVOP}$ and reading/writing word line enable signal RWWLE. The output of NAND gate 370 is applied to level shifting circuit 372 which is connected to Vpp2 as a power source voltage for itself. The output of level shifting circuit 372 is applied to inverter 384 and the reading reference block selection signal XMDiRref is generated from the outputt of inverter 384. The output of NAND gate 386 is connected to the writing reference block selection line XMDiWref through NMOS transistor 388 and NMOS depletion transistor 390, whose gates are each coupled to signal $\overline{WLBLK}$ and Vpp2, which connection, as is the same in the case of XMDiW, is for the purpose of discharging XMDiWref through bulk of transistor 388 and blocking a reverse-flowing toward the bulk of transistor 388 when XMDiWref is driven high. Referring to FIG. 21C, XMDiWref is generated through the clocked inverter formed of PMOS transistors 398 and 400, whose gates are each coupled to TREAD and REFCTL, and NMOS transistors 404 and 406 whose gates are each coupled to REFCTL and TREAD.

Figure 22:
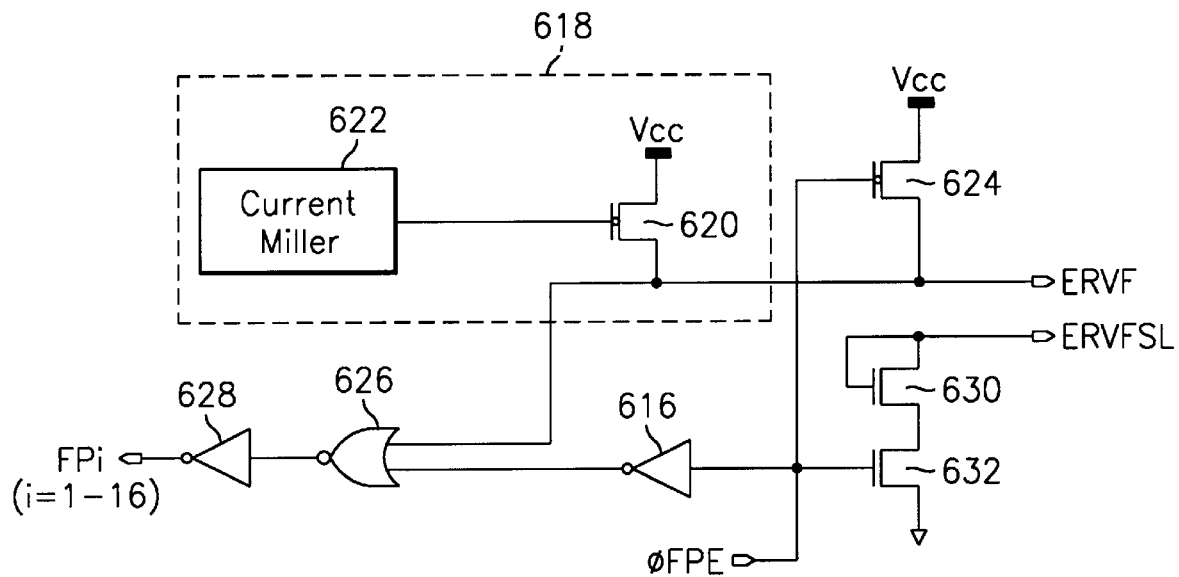
FIG. 22 shows a detection circuit for an erasure verification and write hit/miss checking, included in the mode control block of FIG. 9.
Figure 23:
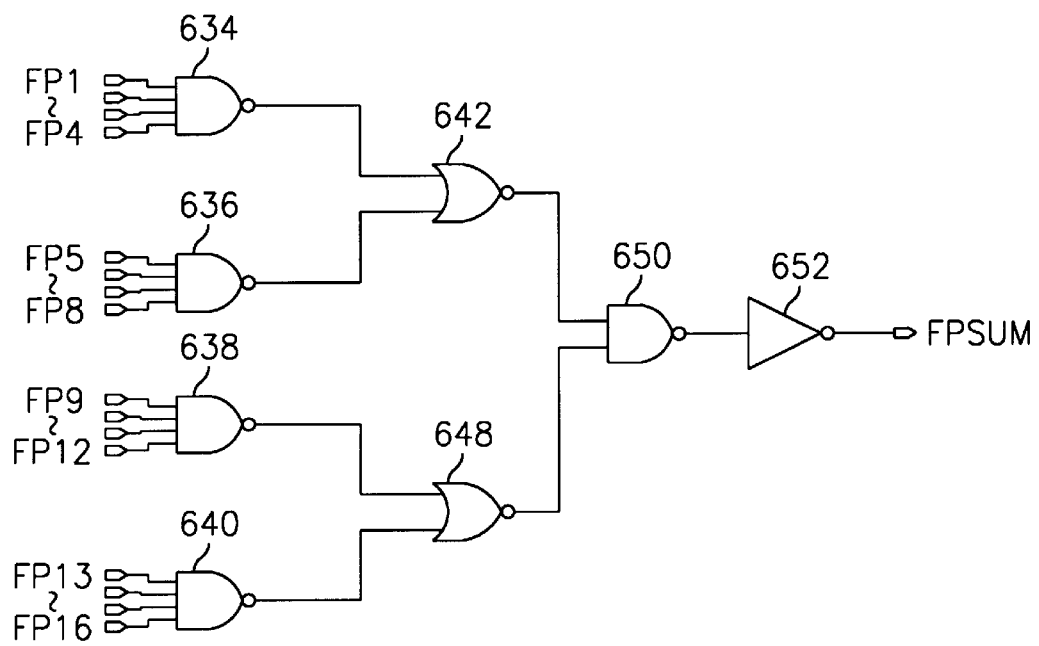
FIG. 23 shows a circuit for detecting a result of the erasure verification from the circuit of FIG. 22.

FIG. 22 shows a circuit for detecting a voltage level on the erasure verification line ERVF. PMOS transistor 620 is connected between Vcc and ERVF, with its gate being coupled to current source 622. Signal ΦFPE, which goes to a high level when the erasure verification operation begins, is coupled to the gate of PMOS transistor 624 which is connected between Vcc and ERVF. ΦFPE is also applied to the input of NOR gate 626 through inverter 616, the input of NOR gate 626 also being connected to ERVF. ΦFPE is also coupled to the gate of NMOS transistor 632 which is connected to the erasure verification source line ERVFSL through NMOS transistor 630 whose drain and gate are connected in common to ERVFSL. The source of transistor 632 is connected to Vss. The output of NOR gate 626 is converted to detecting signal FPi (i=1–16) through inverter 628. A transition to a low level with FPi caused by a transistion to a low level of ERVF indicates an erasure failure, i.e., a writing-miss state for the corresponding memory cell. FIG. 23 shows a logic circuit for detecting the results of the erasure verification performed by the circuit of FIG. 22. Resulting signal FPSUM detects variations on FP1–FP16, so that it goes low even when one of FP1 through FP16 is changed to a low level. The low level of FPSUM resultingly indicates that the preceded erasure operation has not been successfully conducted therein or at least one memory cell that experienced the erasure operation is in a writing-miss state.

Figure 24:
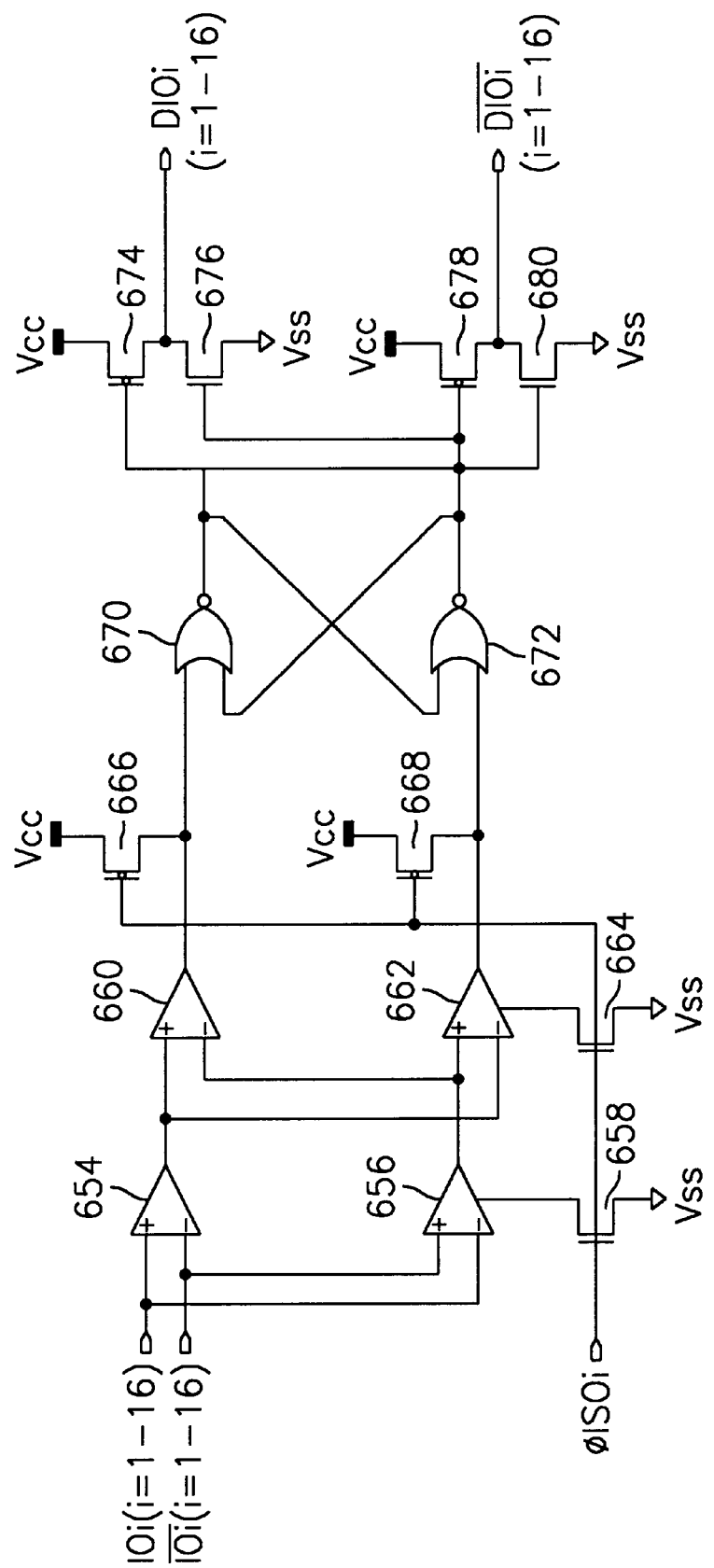
FIG. 24 is a circuit diagram of a sense amplifier assigned to the input/output line in FIG. 14.

FIG. 24 shows a circuit for amplifying the voltage levels of data loaded on input/output lines and transferring them to data input/output lines. A pair of input/output lines, IOi and $\overline{IOi}$ (i is one of 1–16), are applied to flip-flop 670 formed of NOR gates 670 and 672 through two stages of differential amplifier pairs, 654 and 656, and 660 and 662. The outputs of flip-flop 670 and 672 are each applied to the gates of PMOS and NMOS transistors 674 and 680, and NMOS and PMOS transistors 676 and 678. PMOS and NMOS transistors 674 and 676 are connected between Vcc and Vss, with their common source-drain node being coupled to data input/output line DIOi, and PMOS and NMOS transistors 678 and 680 are connected between Vcc and Vss, with their common source-drain node being coupled to data input/output line $\overline{DIOi}$ and PMOS and NMOS transistors 678 and 680 (i is one of 1–16). NMOS transistors 658 and 664 are each connected between amplifiers 656 and Vss and between amplifier 662 and 664 with their gates being coupled to ΦISOi (i.e., ΦISOe or ΦISOo) which is also applied to the gates of PMOS transistors 666 and 668 which are each connected between Vcc and the output of amplifier 660 and between Vcc and the output of amplifier 662.

Figure 25:
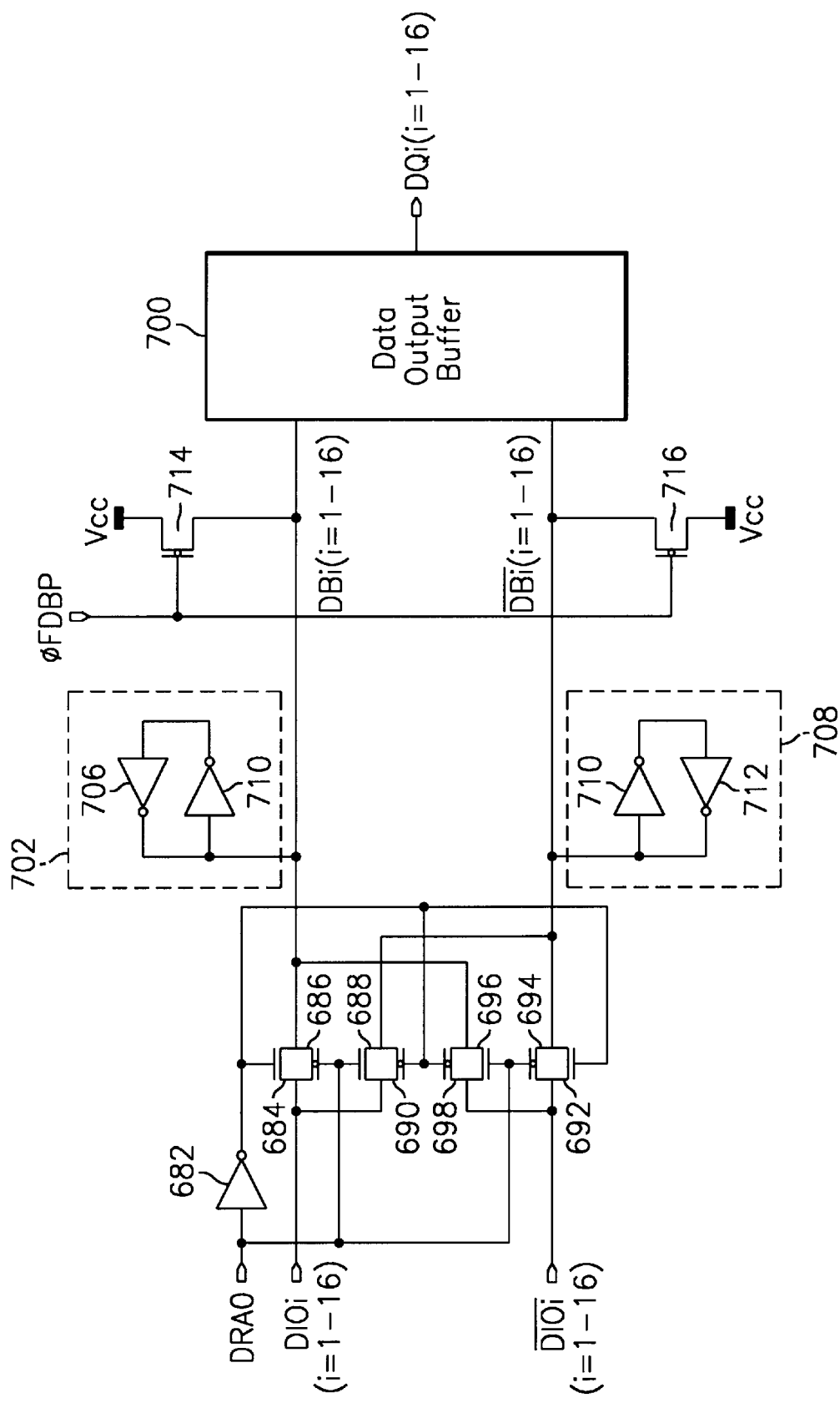
FIG. 25 is a circuit diagram of an output data transfer circuit between the input/output line and data buffer.
Figure 26:
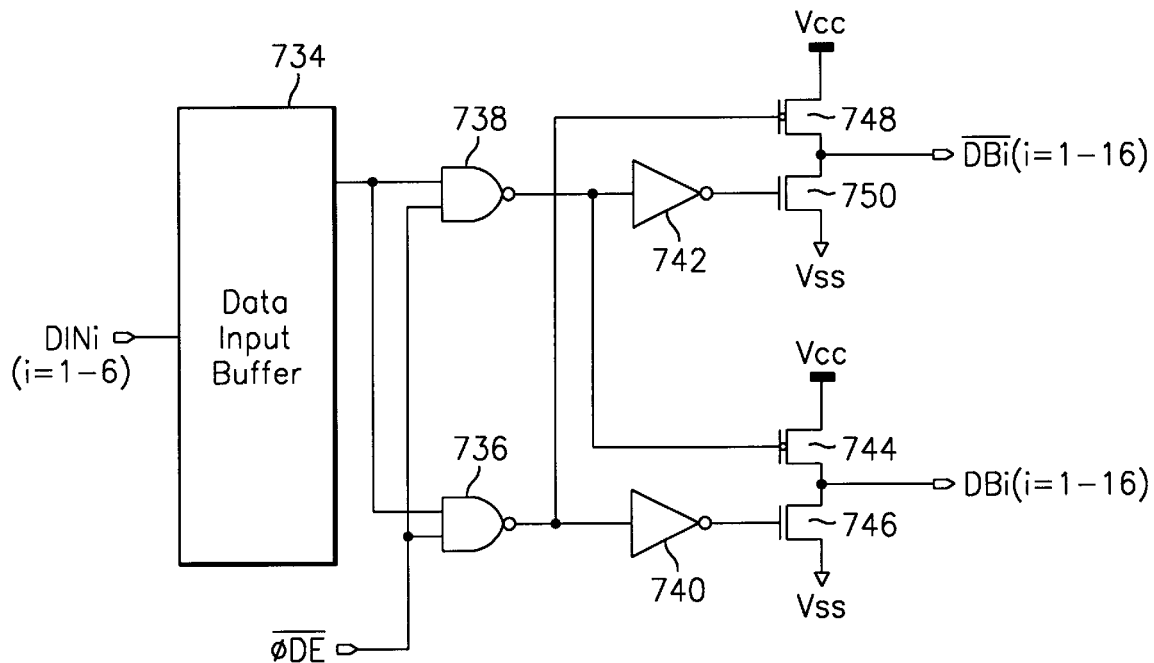
FIG. 26 is a circuit diagram of an input data transfer circuit between the data buffer and data bus.

FIG. 25 shows a circuit for connecting the data input/output lines to data buffer 61. DIOi and $\overline{DIOi}$ are connected to a pair of data buses, DBi and $\overline{DBi}$, through transmission gates 684, 688, 692 and 694 which are controlled by signal DRA0. To DBi and $\overline{DBi}$, latches 702 and 708 are coupled to maintain the current voltage levels of data. Precharging transistors 714 and 716, whose gates are coupled to precharging signal ΦFDBP are each connected between Vcc and DBi, and between Vcc and $\overline{DBi}$. Data buffer 61 is connected to data input/output pins DQi (i is one of 1 through 16). DIOi and $\overline{DIOi}$ are each cross-connected to $\overline{DBi}$ and DBi when DRA0 is at a high level. The data buffer 61 has a bidirectional transfer function with input and output data. Referring to FIG. 26, the input data transfer circuit connects data buffer 61 to DBi and $\overline{DBi}$. An input data bit supplied from DQi through data buffer 62 is applied to NAND gates 738 and 736 whose inputs are controlled by signal $\overline{\phi DE}$. The outputs from NAND gates 738 and 736 are applied to PMOS transistors 744 and 748, and to NMOS transistors 750 and 746 through inverters 742 and 740, respectively. PMOS and NMOS transistors 748 and 750 are connected between Vcc and Vss in series, as are PMOS and NMOS transistors 744 and 746. The source-drain nodes of the PMOS and NMOS transistors, 748 and 750, and 744 and 746, are connected to DBi and $\overline{DBi}$.

Figure 27:
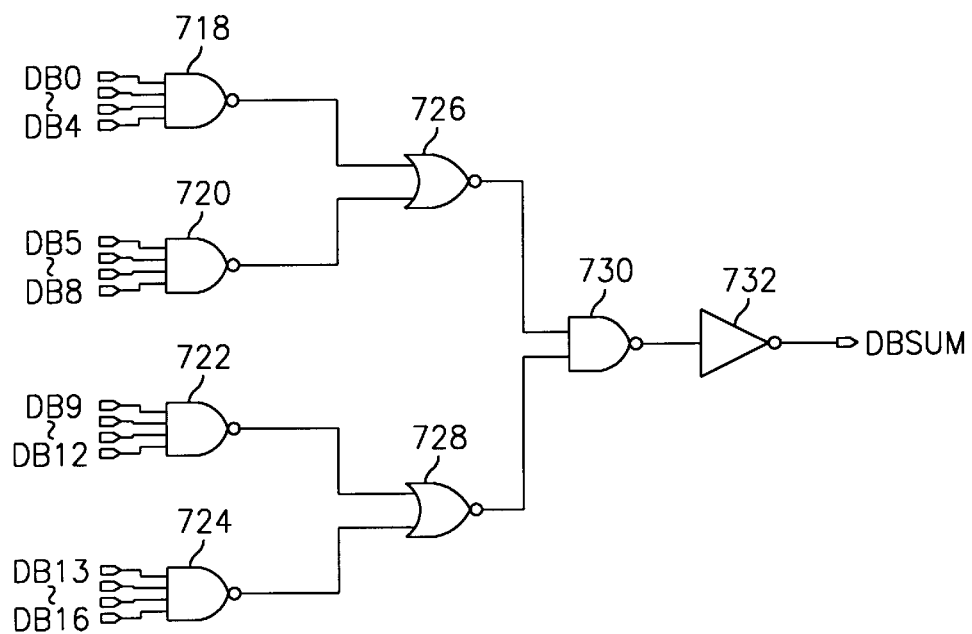
FIG. 27 shows a circuit for detecting a result of the write hit/miss checking, included in the mode control block of FIG. 9.

FIG. 27 shows a circuit for detecting a result of the programming verification using read-out data bits on the data buses from the circuit of FIG. 25. Data buses DB1 through DB16 are applied to NAND gates 718 through 724 by four bits, the outputs from the NAND gates are applied to NOR gates 726 and 728, and the outputs of the NOR gates are applied to NAND gate 730. The output of NAND gate 730 is converted to programming verification signal DBSUM through inverter 732. If at least one of the signals DB0 through DB16 are low, DBSUM becomes low to indicate a programming failure, the writing-miss state. The reverse of that condition is regarded to as a writing-hit state that indicates a programming operation is available therefrom.

Now, explanations of the operations operable in the flash device will be given in conjunction with the timing and flow charts form FIGS. 28 to 34, in which operation modes adaptable to the DRAM and specific operation modes of the flash memory are introduced, accompanied by detailed descriptions of the operating features relevant to the circuits. A flash memory according to the invention basically has a reading mode, a writing mode (substantially, the programming mode) and an erasure mode, and further has verification functions for the erasure and programming modes. The verification for the programming may be referred to as the writing hit/miss checking mode. The writing mode includes a restoring operation (or a re-programming operation) in which data supplied from the data input/output pins are automatically written in memory cells during a $\overline{RAS}$ precharging time. The restoring operation is conducted against an unlocked block of memory cells, and, if the unlocked block is in the writing-miss state, put in the programming cycle after performing the erasing. The specific operations of the flash memory can be performed in a WCBR mode that is normally used in the DRAM.

FIGS. 28 through 30 show reading, the writing and erasing operations, respectively, with the drive lines (or signals) shown in FIGS. 11A through 11C.

Figure 28A:
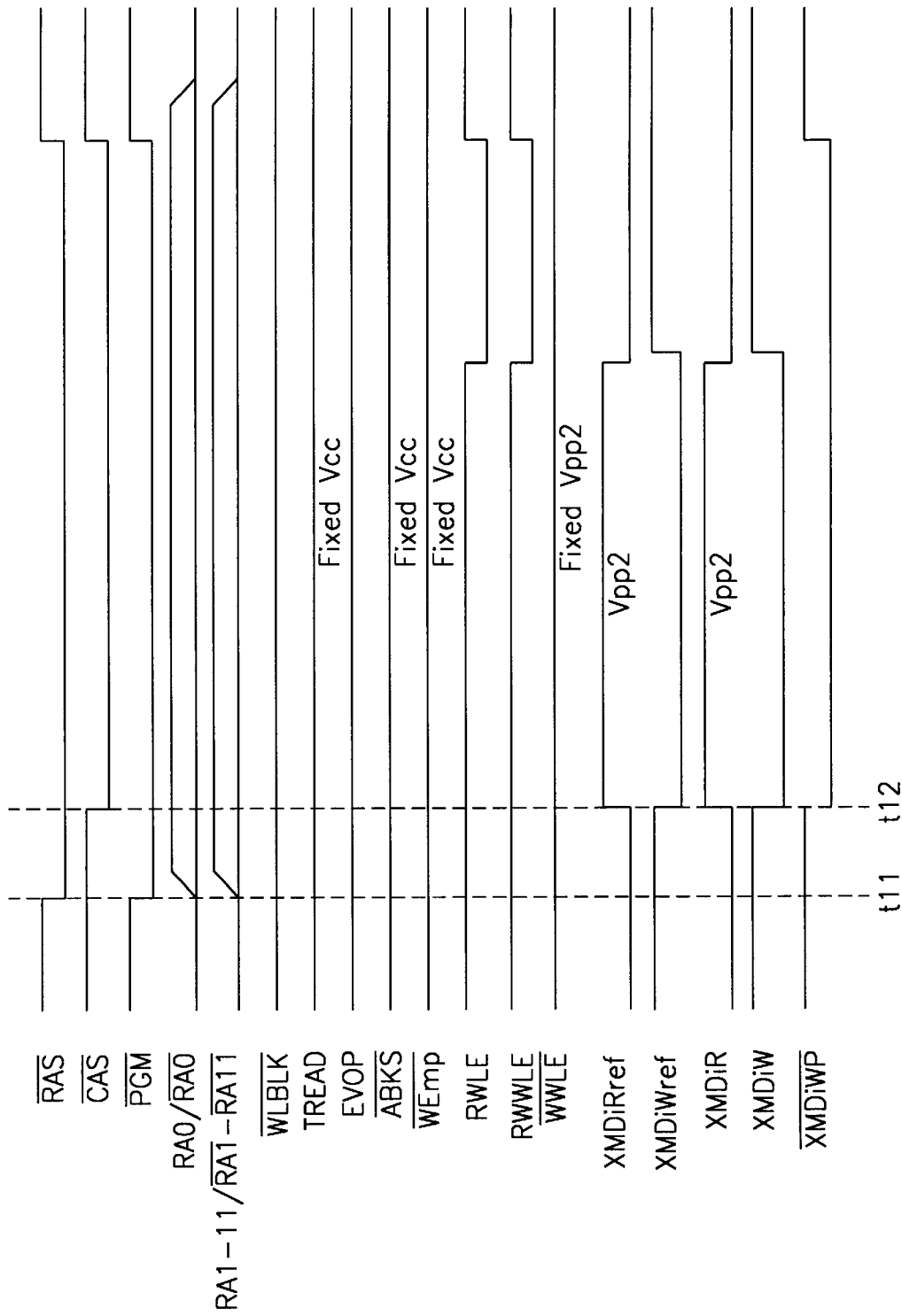
Figure 29A:
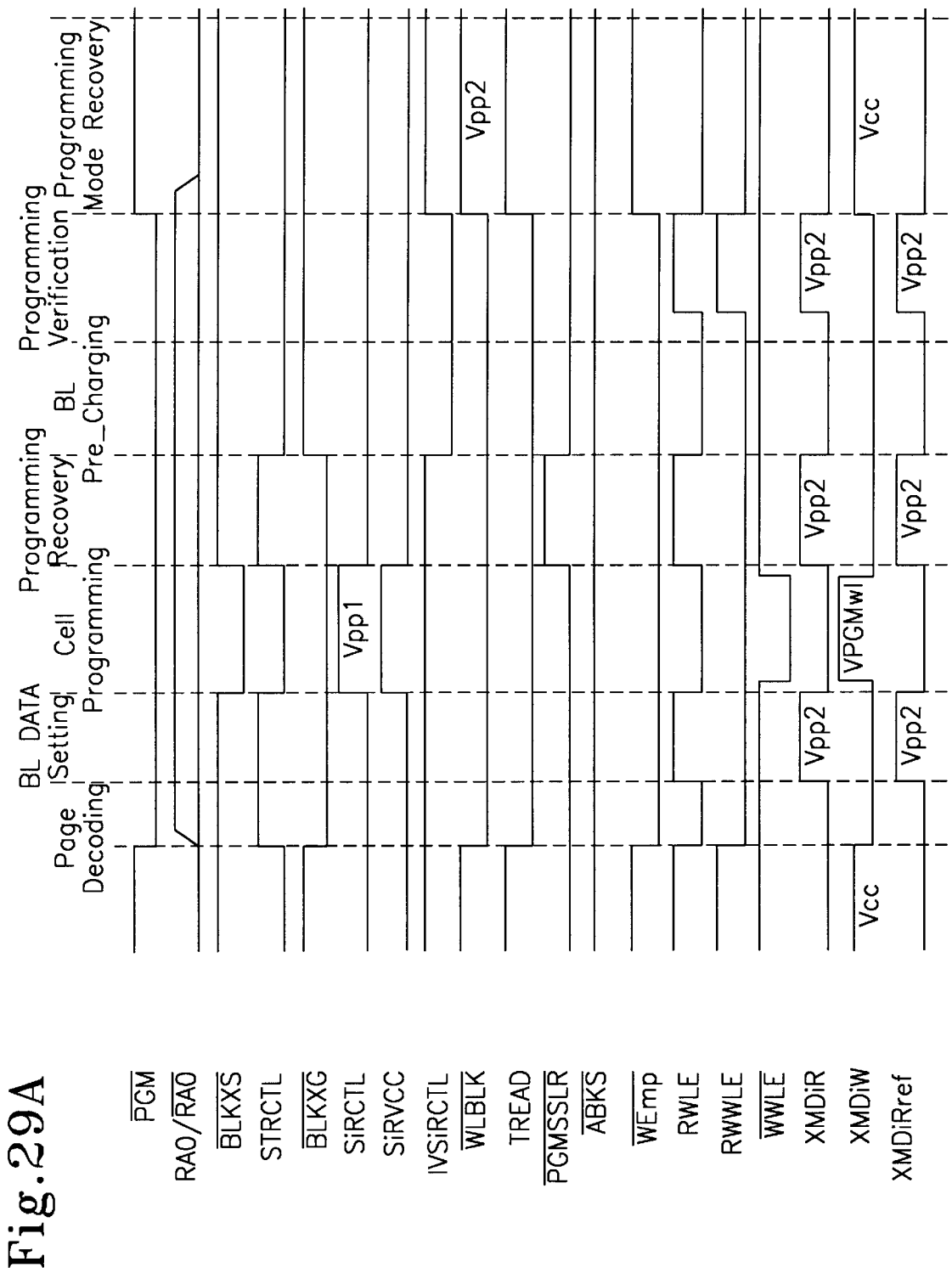
Figure 29B:
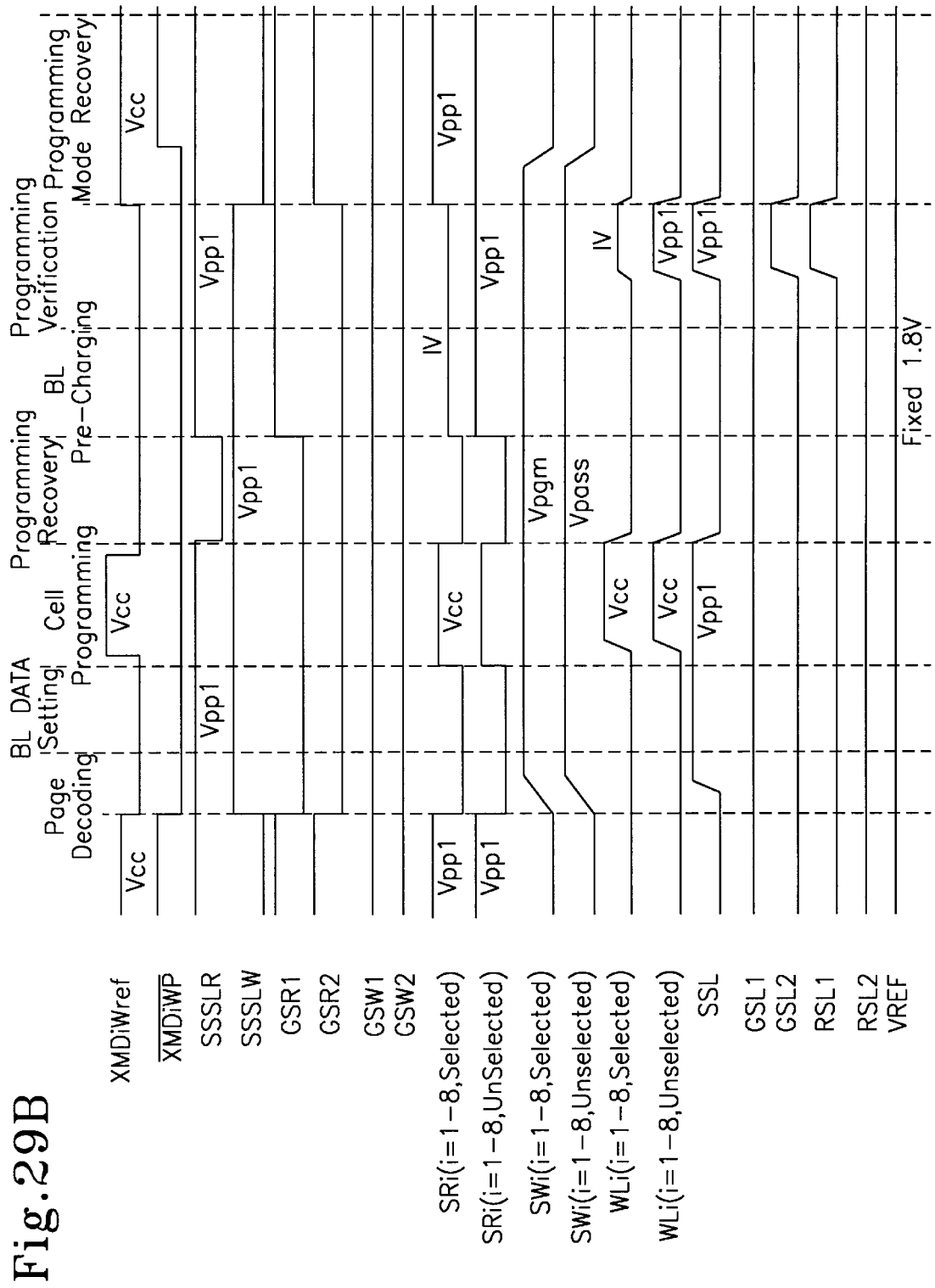
Figure 30A:
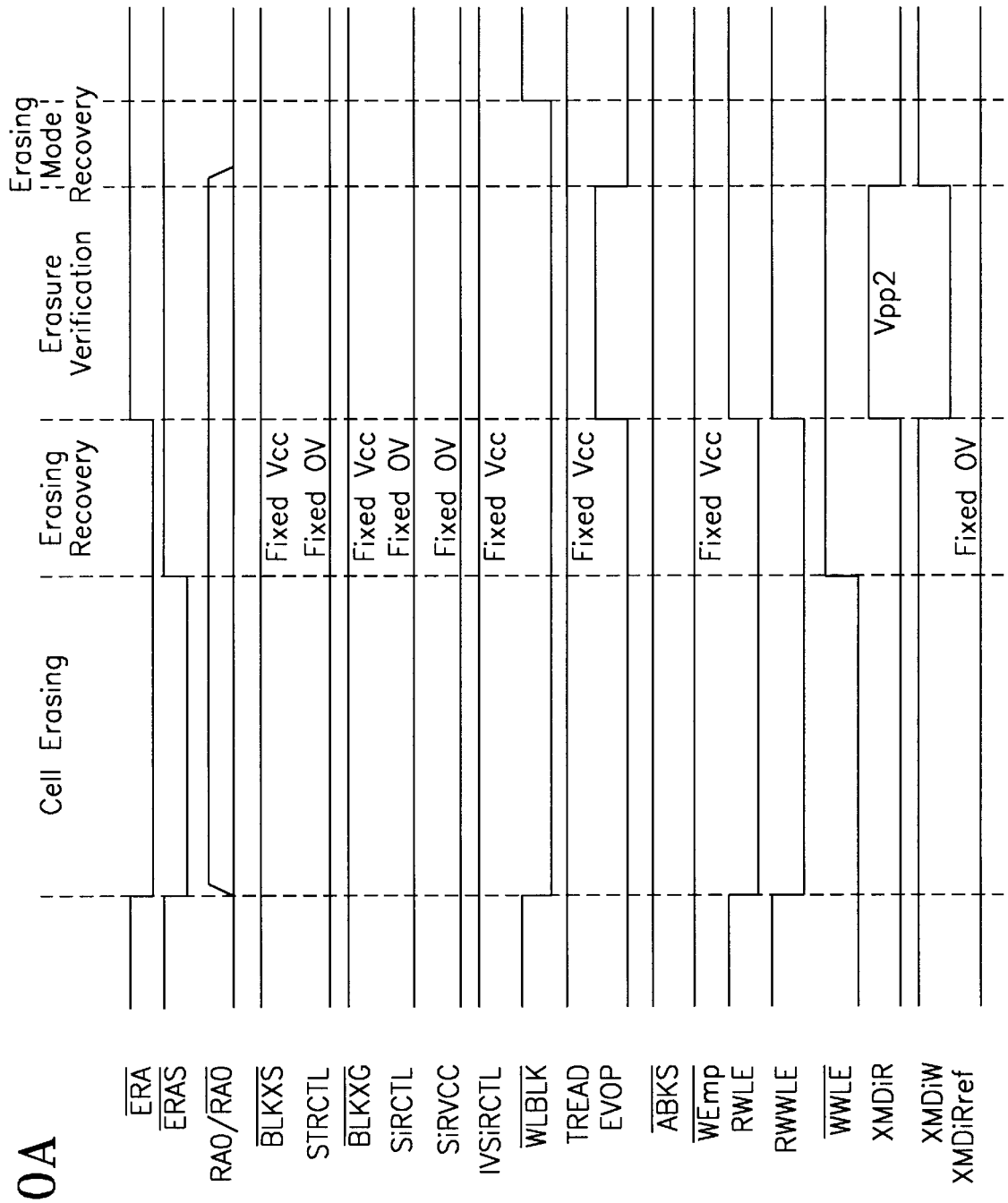
Figure 30B:
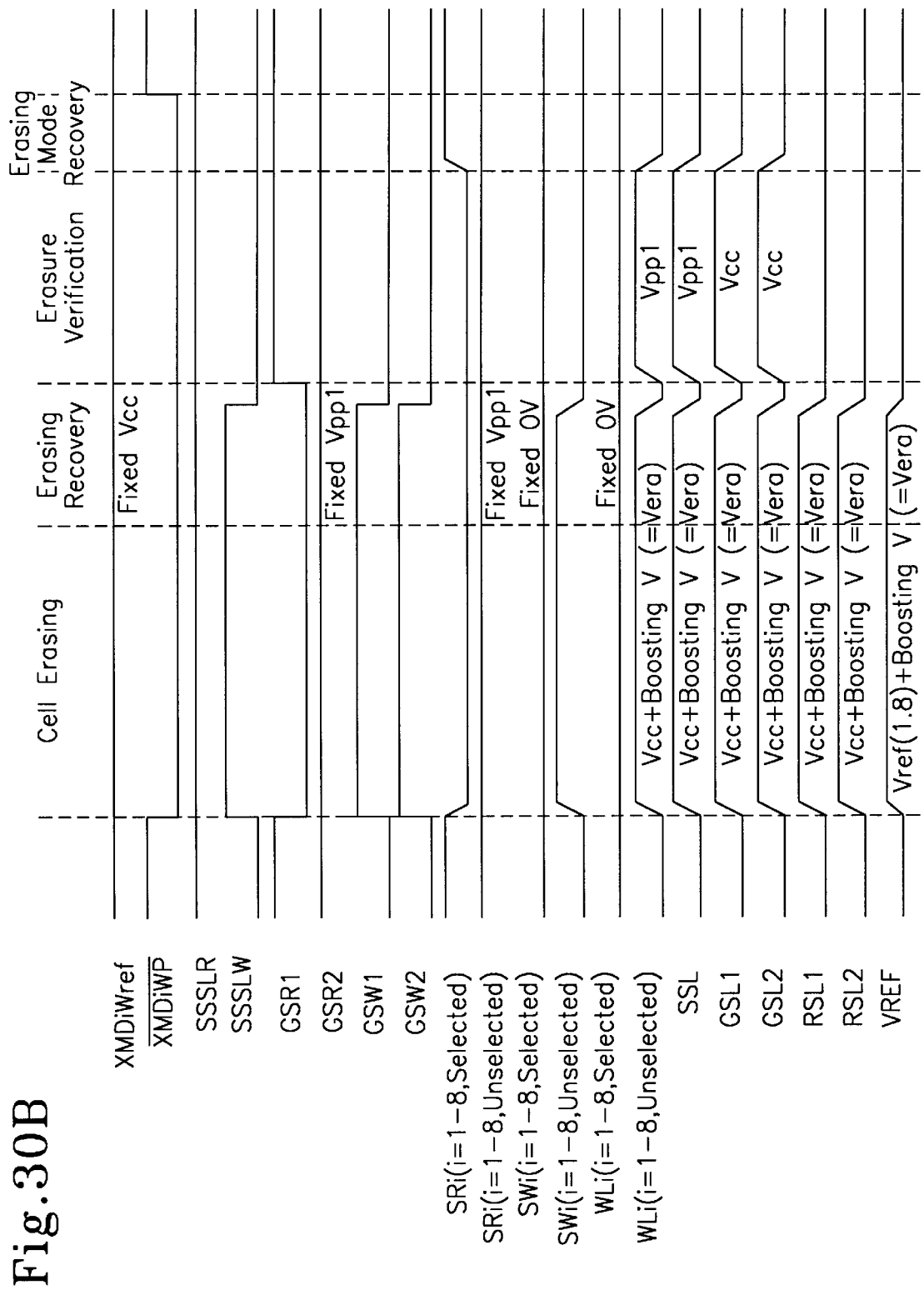

Referring to FIGS. 28A and 28B, in the $\overline{RAS}$ precharging period until tl 1, the bit lines are charged up to precharging levels of half-Vcc, writing drive lines, SSSLW, GSW1, GSW2 and SW1 to SW8, are driven low, and XMDiR and XMDiW are each at low and high levels, so that the word lines WL1–WL8, the string and ground selection lines, SSL, GSL1 and GSL2, are discharged through transistors WT1 through WT8, WST, WGT1 and WGT2, respectively. For the reading drive lines, SSSLR and SR1 to SR8 retain Vpp1 and GSR1 and GSR2 are driven to Vcc.

After $\overline{RAS}$ is activated to a low level, address signals RA1 through RA11 are received from the address pins and an hierarchical selection for the divided units of the memory cell array is carried out therein. A selected SRi is pulled down to Vcc from Vpp1. The lowest address bit RA0 determines an alternative selection between the odd and even bit lines, the bit lines BL1–BL512 being arranged in the sub-block SBk in which low level of RA0 causes the odd bit lines to be selected. It is assumed that the odd bit lines BL1, BL3, . . . , and BL511 are selected therein. At t12, XMDiR and XNDiRref go to Vpp2 while XMDiW, XMDiWP and XMDiWref are pulled down to low levels, and thereby a selected word line goes to 0V, and the unselected word lines and SSL go to Vpp1. GSR1 goes to 0V while GSR2 is high. If the selected memory cell is an on-cell (i.e., if the cell has been erased), the corresponding bit line goes to 0V from the precharging voltage level of half-Vcc. The even bit lines BL2, BL4, . . . , and BL512 not selected by the RA0 are pulled down to 0V through their corresponding transistors in reference voltage supply circuit 106. On the other hand, when the RA0 is at a high level to select the even bit lines, the logic states of the drive signals and discharging paths for the bit lines are exchanged with each other.

Writing mode

Referring to FIGS. 11A–11C and 29A and 29B, the writing operation is comprised of the periods of page decoding, bit line data setting, cell programming, programming recovery, bit line precharging, programming verification and programming mode recovery.

In the page decoding operation, selections for a block and a page (a unit of memory cells coupled a word line and a plurality of bit lines) are carried out by multiplexing valid address signals. $\overline{PGM}$ being at a low level permits the row address signal (e.g., RA0) to be activated, and thereby the drive signals such as SRi, GSR1 and GSR2 involved in the reading chain go to Vcc in response to STRCTL and $\overline{BLKXG}$, respectively. SSSLR is held at Vpp1. XMDiW and XMDiWref are driven to a low level in response to RWWLE to make the word lines, other control signal lines SSL, GSL1, GSL2, RSL1 and RSL2 float or be driven to 0V. During this time, the selected SWi goes to Vpgm of 18V and the unselected SWi go to Vpp1 of 4.5V as the pass voltage Vpass. SSSLW is Vpp1 and GSW1 and GSW2 are Vcc.

In the bit line data setting operation, Vcc and Vpp1 are alternately applied to a selected bit line when a data bit stored in the corresponding page buffer (i.e., the data latch 452 of FIG. 14) is "0" and "1", respectively. XMDiR and XMDiRref are pulled up to Vpp2 in response to RWLE, and thereby 0V is applied to all of the row lines WL1–WL8, GSL1, GSL2, RSL1 and RSL2. SSL goes to Vpp1 and Vref is set at 1.8V. Therefore, the sources of the string selection transistors are at Vpp1–Vth or 0V when the loaded data bit in the page buffer is "1" or "0", respectively. Vpp1, which is higher than Vcc, is applied to SSL for the data bit "1", thereby causing the sources of the string selection transistors be charged enough to lower the voltage differences between the gates and channel of the cell transistors, which contributes to reducing the stress at the cell transistors when self-boosting programming is being conducted.

Next, in the cell programming operation, all of the SRi go to Vcc in response to $\overline{BLKXS}$, SSSLR is Vpp1 and GSR1 and GSR2 all remain at 0V. A selected SWi remains at Vpgm while the unselected SWi are at Vpass. SSSLW is Vpp1 and GSW1 and GSW2 are all 0V. Then, XMDiR and XMDiRref are driven to low levels. As XMDiW are pulled up to Vpgmw1 (=Vpgm+2Vth), Vpgm and Vpass are applied to the selected word line and the unselected word lines, respectively. SSL is Vpp1 and GSL1 and Gsl2 are 0V. Vref is 1.8V and RSL1 and RSL2 are 0V. Applying Vcc to SRi prevents snap-back breakdown in the switching transistor (one of RT1–RT8) when Vpgm is applied to the gate of the corresponding selected word line.

After the cell programming operation, the programming recovery operation begins to discharge the high voltages, Vpgm, Vpass and Vpp1 which are applied to the word lines and drive lines. All of SRi, SSSLR, GSR1 and GSR2 are pulled down to 0V while the writing drive signals are held at the voltage levels for the cell programming period. Then, XMDiW goes to 0V from Vpgmw1 in response to a high level on $\overline{WWLE}$, and XMDiR is pulled up to Vpp2 from 0V.

In the bit line precharging period for preparing the programming verification, a selected SRi is set to 1V and the unselected SRi are set to Vpp1, while the voltages of the writing drive lines are held at the same voltages as the cell programming period. Vpp1 is applied to SSSLR, and GSR1 and GSR2 become 0V and Vcc, respectively, for activating the odd bit lines. Next, the programming verification is conducted in the same sequence as the reading operation and the programming mode recovery begins in order to prepare for the next programming cycle in response to $\overline{PGM}$ which goes from low to high.

Erasure mode

Referring to FIGS. 11A–11C and 30A and 30B, the erasure operation includes the steps of cell erasing, erasing recovery, erasure verification and mode recovery.

In the cell erasing operation, a selected SWi is held at 0V whilethe unselected SWi are pulled up to Vcc. Vcc is applied to SSSLW, GSW1 and GSW2, and also loaded on the reference voltage line Vref. As block selection indicateing signal $\overline{BEdec}$ falls to a low level, XMDiW goes to Vcc, and thereby 0V and Vcc-Vth are each applied to a selected word line and the unselected word lines, respectively. The voltage levels of SSL, GSL1, GSL2, Vref, RSL1 and RSL2 become Vcc-Vth. Thus, the erasure voltage Vera of 20V is applied to the bulk regions (i.e., P-type wells) of the selected cell transistors in the selected page. Because of the supply of Vera, the unselected word line are pulled up to Vcc-Vth+Vera while the selected word line is held at 0V, and also SSL, GSL1, GSL2, Vref, RSL1 and RSL2 are boosted up to Vcc-Vth+Vera. After the cell erasing, the erasing recovery begins thereof in response to a high level on $\overline{ERAS}$, in which, as is well known, Vera is discharged through the common source line CSL and pumping circuit.

In the erasure verification operation, XMDiR is pulled up to Vpp2 from 0V and thereby 0V and Vpp1 are each applied to a selected word line and the unselected word lines, respectively. SSL is Vpp1, and XMDiWref, GSL1 and GSL2 are Vcc, so that Vref is at Vcc-Vth and RSL1 and RSL2 become 0V. The erased cells are verified when they are detected as on-cells. The erasing mode recovery operation is for preparing for the next operation cycle such as a programming operation in which all of the signals or lines are set to the states before the cell erasing operation.

FIGS. 31 through 34 are timing diagrams of operations for controlling the column in FIG. 14 for the read mode, writing mode, erasure mode and writing hit/miss checking mode, respectively, on the assumption that the odd bit lines are selected therein.

Read mode

Referring to FIGS. 14, 31A and 31B, during the $\overline{RAS}$ precharging period until t11, the bit lines BL1–BL512 are held at the precharging levels of half-Vcc and the data lines DL1–DL512 are precharged and equalized with Vcc. At t11, as $\overline{RAS}$ falls to a low level, the read operation is activated when the row address signals are received. The lowest row address signal RA0 at a low level corresponds to the selection of the odd bit lines and data lines. At t21, as $\overline{CAS}$ is activated, ΦSBLPeven and ΦSBLPodd go to low levels and thereby φSAEQ, φSBLPe and φSBLPo rise up to high levels to finish the precharging and equalization of the bit lines. During this time, LA and $\overline{LA}$ are driven to Vcc. Thereafter, as a word line is selected, the odd bit lines are developed in accordance with data states stored in the corresponding cells while the even bit lines are subjected to the reference voltage, from t13. At t14, if ΦSAE goes to high for a short pulse, the present voltage levels on the pairs of the odd and even bit lines are further developed by the sense amplifiers 432 and the pairs of data lines follow the voltage differences. Therefore, the second sense amplifier 438 detects and further amplifies the voltage difference between the data line pair. At t15, as column selection signal CSL goes high, the amplified data bits on the data lines are transferred to the input/output lines IO1–IO16. The data bits on the input/output lines are amplified through the circuit of FIG. 24 and transferred to the data input/output lines DIO1–DIO16. The data bits on DIO1–DIO16 are transferred to DQ1–AQ16 through the circuit of FIG. 25. It will be understood that the operating sequence of a data selection with the even bit lines is the same with that with the odd bit lines.

Writing mode

Referring to FIGS. 14, 32A and 32B, the writing mode begins with the activation of $\overline{PGM}$ to a low level. The operating steps therein are the same as those of FIGS. 29A and 29B. At the beginning of the writing, i.e., the programming operation, ΦINV falls drops to a low level and VSA goes to Vcc to prepare the non-inverted read-out for the following programming verification. First, in the page decoding operation, the row address selects a page. In the bit line data setting operation, VSL and $\overline{LA}$ go to Vpp1 from Vcc. ΦISOo are pulled up to Vpp2 to transfer data stored in the data latch 452 of FIG. 14 to the selected odd bit lines. The unselected even bit lines are held at Vpp1 by $\overline{\phi SBLPe}$ which is 0V.

In the cell programming step, as described above, Vpgm and Vpass are applied to a selected word line and the unselected word lines, respectively. Vpgm and Vpass are applied to the word lines are discharged during the programming recovery step in which ΦISOo are pulled down to 0V from Vpp2 to separate the odd bit lines from their corresponding data lines, $\overline{\phi SBLPo}$ goes to 0V, and $\overline{LA}$ and VSBL drops down to Vcc from Vpp1, so that the bit lines are set at Vcc. In the bit line precharging step with the precharging voltage level of Vcc, $\overline{\phi SBLPe}$ and ΦISOe are pulled up to Vcc and Vpp2, respectively, thereby causing data stored in the data latches to be transferred to the unselected even bit lines through the data lines.

The programming verification is initiated by isolating the even bit lines from their corresponding data lines in response to ΦISOe falling to 0V from Vpp2. $\overline{LA}$ and $\overline{\phi SAEQ}$ go to low levels to cause the data lines to be pulled down to 0V and equalized therein. As $\overline{\phi SAEQ}$ goes high, the voltage levels of the selected odd bit lines are developed in response to the states of the corresponding memory cells of the selected page. The unselected even bit lines are subjected to the reference voltage. A high level on ΦSAE enables the first sense amplifier 432, and a high level on $\overline{LA}$ causes the second sense amplifier 438 be activated thereby. The programming recovery is for preparing another programming operation.

Erasure mode

Figure 33A:
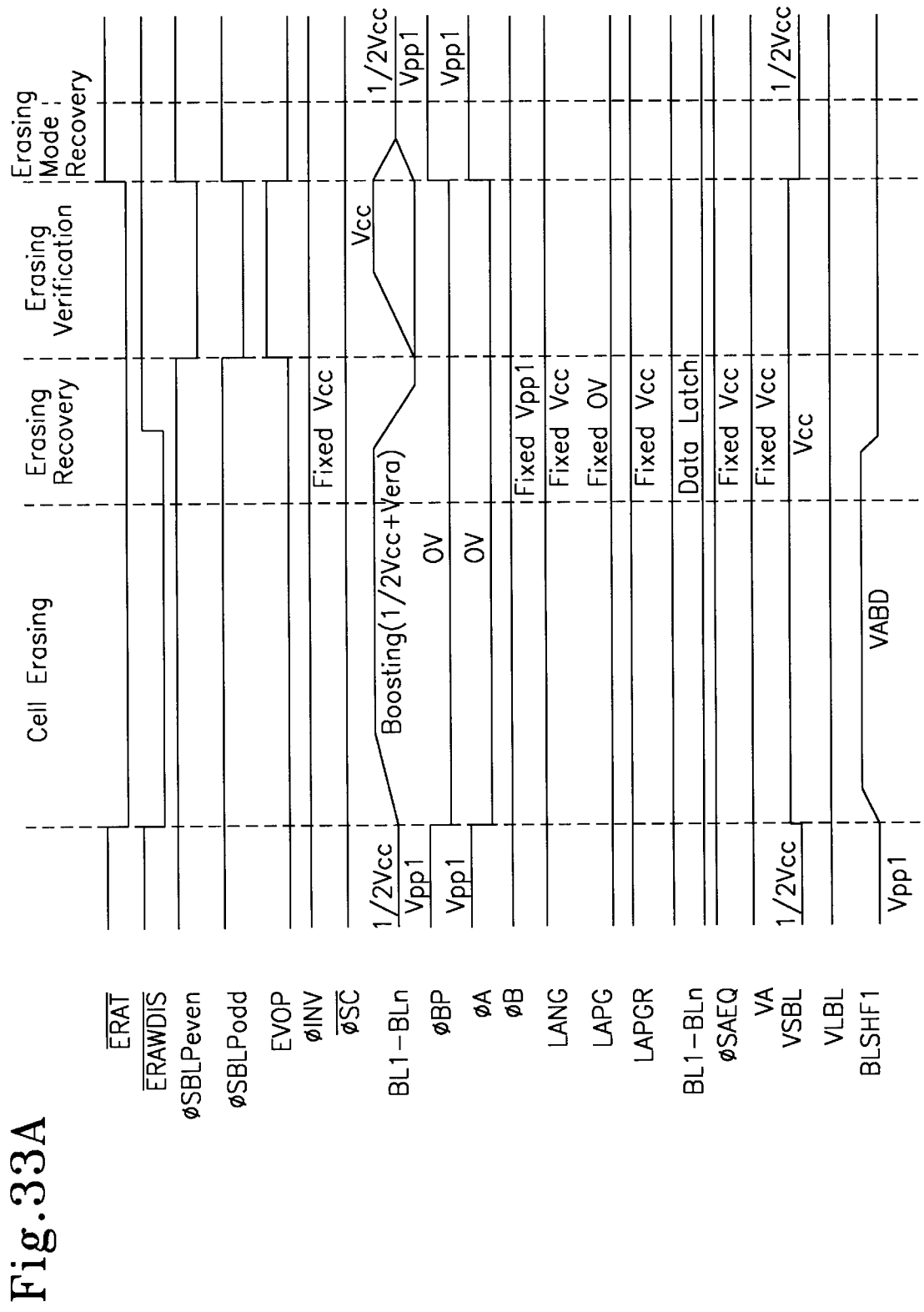
Figure 33B:
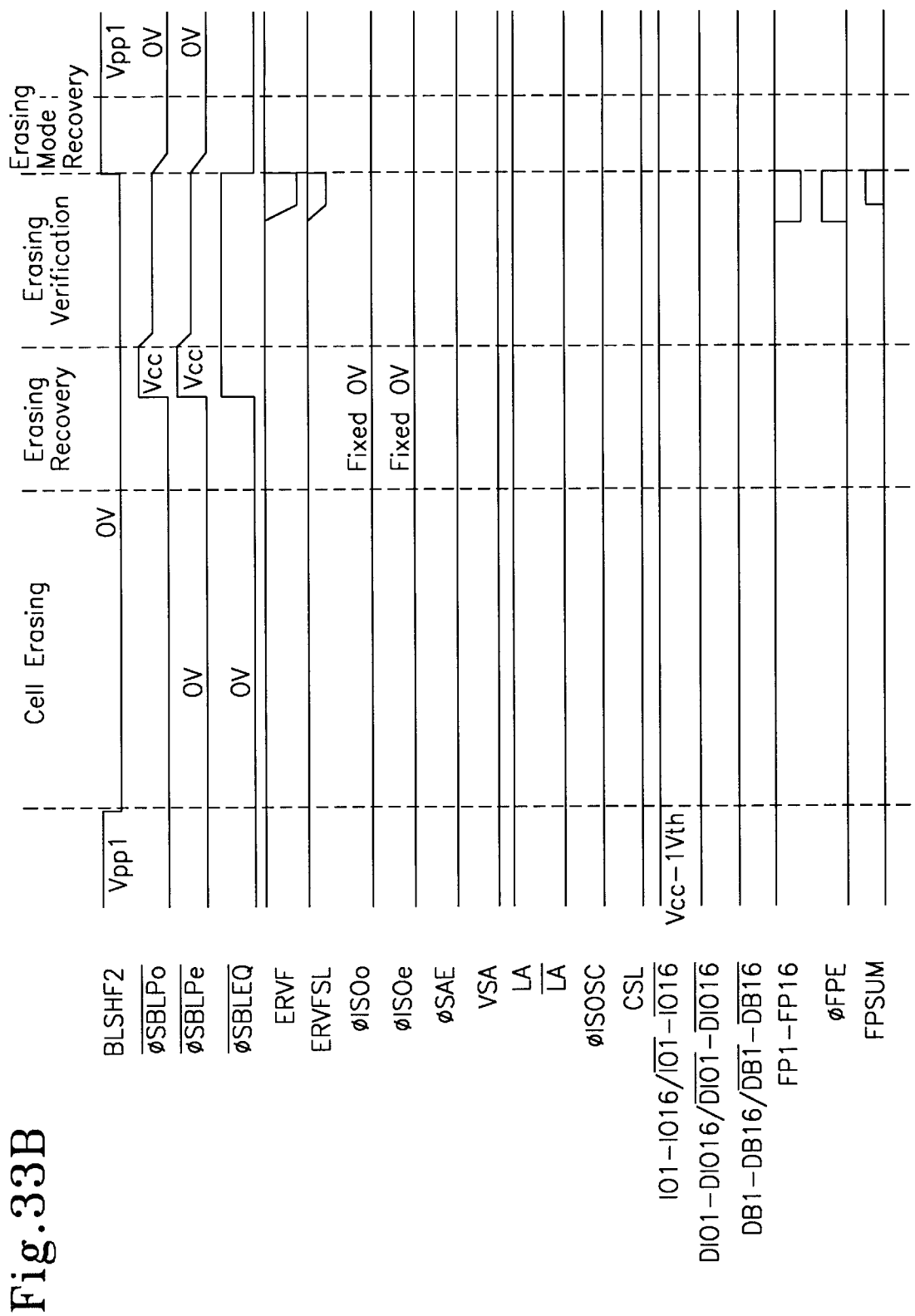

Referring to FIGS. 14, 33A and 33B, a low level on $\overline{ERAT}$ initiates the erasure operation. In the cell erasing operation, ΦSBLPeven and ΦSBLPodd are driven high while $\overline{\phi SBLPo}$ and $\overline{\phi SBLPe}$ are driven low. VSBL rises to Vcc from half-Vcc in response to ΦBP falling to 0V from Vpp1 and a low level on ΦA. BLSHF1 goes to 0V from Vpp1 and BLSHF2 goes to VABD from Vpp1, and thereby the bit lines are driven to Vcc. BLSHF2 at VABD prevents the bit lines from being influenced by Vera. Vera is discharged in the erasing recovery step in which RSL1 and RSL2 go high to pull down all of the bit lines to 0V, and $\overline{\phi SBLPo}$ and $\overline{\phi SBLPe}$ are at high levels to disconnect the bit lines from Vcc.

In the erasure verification operation, while ΦFPE of FIG. 22 goes to a high level, if there is at least one memory cell that has not been completely erased (i.e., an off-cell), the corresponding output from FP1 through FP16 goes high, and the output of the circuit of FIG. 23, FPSUM, goes high, thereby indicating indicates a failure of the former erasure. A successful erasure is verified by a low level on FPSUM, in which all of the erased cells are on-cells.

Writing hit/miss checking mode

Figure 34B:
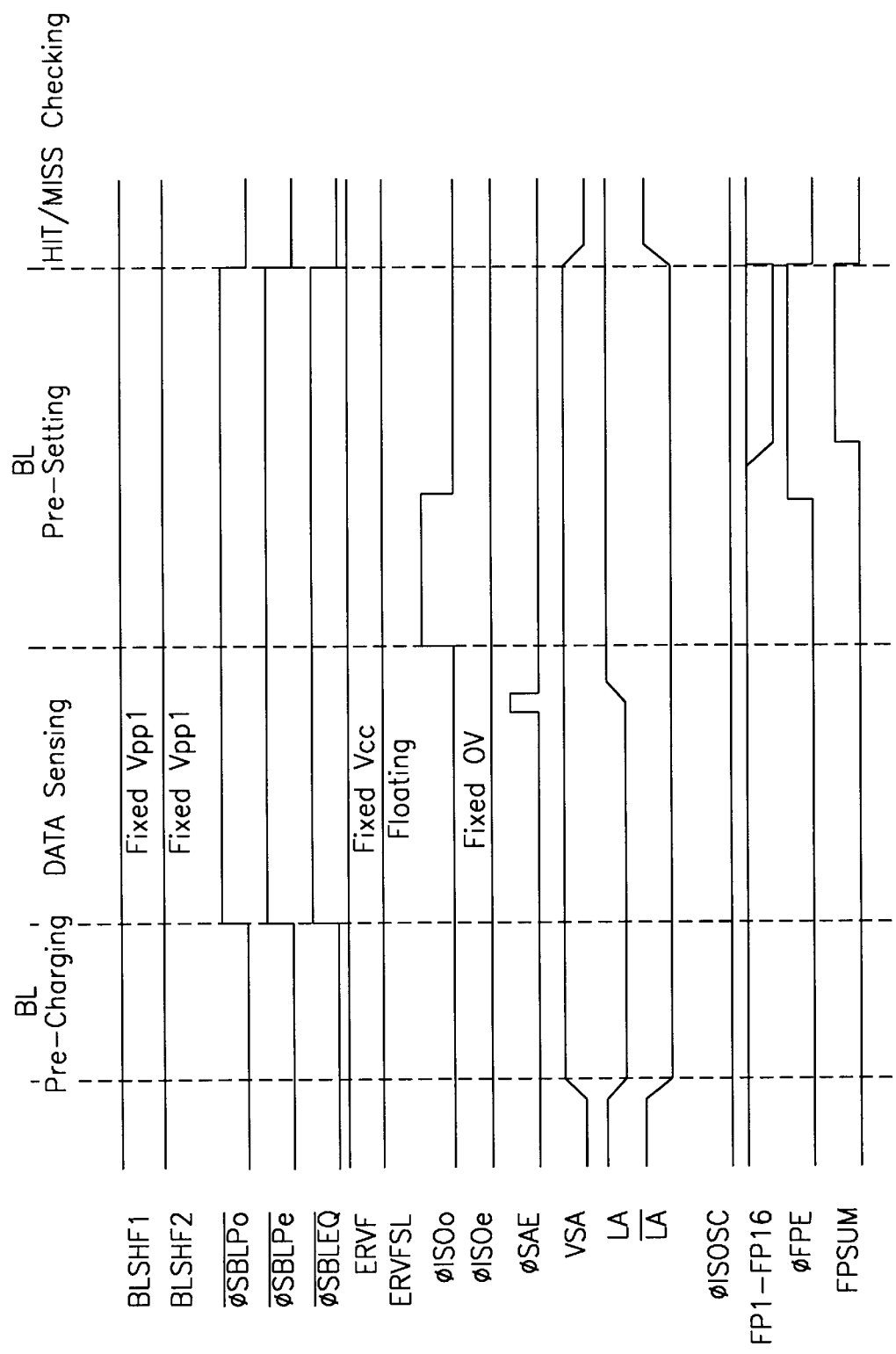

Referring to FIGS. 14, 34A and 34B, this mode, for detecting the existence of a non-erased cell, is comprised of the steps of bit line precharging, data sensing, bit line pre-setting and hit/miss checking. In the bit line precharging step, ΦBP and ΦB go to low and high levels, respectively, while $\overline{\phi SBLPo}$ and $\overline{\phi SBLPe}$ are low and ΦSBLPodd and ΦSBLPeven are high. VSBL is pulled up to Vcc from half-Vcc and thereby the bit lines are precharged to Vcc. ΦSAEQ is low, VDL goes to 0V from Vcc, LANG is high, LAPG is low and LAPGR goes high. Therefore, LA and $\overline{LA}$ are all pulled down to 0V and the data lines DL1 through DL512 are set to 0V. The data sensing operation is the same as the aforementioned. After sensing, the unselected bit lines are pulled down to 0V by way of the reference voltage drive circuit 106. In the bit line setting step, data stored in the data latches are loaded on their corresponding bit lines. As above, assuming that the odd bit lines are selected therein, ΦISOo goes to Vpp2 to transfer the data latched to the odd bit lines. The even bit lines not selected are held at 0V.

Next, in the hit/miss checking step that is the same as the erasure verification operation, ERVF remains at Vcc or 0V when a selected memory cell is an on-cell (an erased cell) or off-cell (a programmed cell), respectively. An ERVF of Vcc or 0V denote the writing-hit and writing-miss states, respectively.

As described above, the invention provides a DRAM-interfaced flash memory which can perform specific operation modes, such as erasure, programming, verifications of erasure and programming, and writing hit/miss checking, which are adaptable to the normal operations of a DRAM. Further, the flash memory, which can be used in a computer system as an auxiliary memory component while the DRAM acts as a main memory component, contributes to enhancing the efficiency of an operating facility in a memory system of the computer system.

In the drawings and specification, there have been disclosed typical preferred embodiments of the invention and, although specific terms are employed therein, they are used in a generic and descriptive sense only and not for the purpose of limitation, the scope of the invention being set forth in the following claims.

What is claimed is:

1. A nonvolatile memory compatible with a dynamic random access memory, comprising:

a memory array divided into at least one pair of mats, each of the mats including a plurality of sub-array sections separated in a row direction and a plurality of section decoders for the separated sub-array sections, each section decoder being arranged adjacent to one or between two of the sub-array sections to select rows of the one or two sub-array sections, each of sub-array sections being divided into a plurality of sub-blocks in a column direction, a number of sub-blocks arranged in the row direction forming a block;

reading and writing row decoders for selecting rows of the memory array during reading and writing operations, respectively; and reading and writing gate drive circuits for selecting a plurality of drive lines which supply source voltages to the rows of the memory array during the reading and writing operations, respectively, wherein the section decoders are arranged in pairs corresponding to each sub-array section such that one section decoder of each pair is assigned to a half of the rows belonging to the corresponding sub-array section, and the other section decoder of the pair is assigned to the other rows thereof, and each of the section decoder pairs connects the drive lines to the assigned rows of the one or two adjacent sub-array sections.

2. A nonvolatile memory compatible with a dynamic random access memory, comprising:

a memory array divided into one or more pairs of mats, each mat including a plurality of sub-array sections separated from each other in a row direction, a plurality of first type section decoders and a plurality of second type section decoders being provided for the respective separated sub-array sections, each of the section decoders being alternately arranged adjacent to one or between two of the sub-array sections to select rows of the adjacent one or two sub-array sections;

reading and writing row decoders for respectively selecting rows of the memory array during reading and writing operations; and reading and writing gate drive circuits for respectively selecting a plurality of drive lines which supply source voltages to the rows of the memory array during the reading and writing operations, wherein the first type section decoders each selects a half of the rows of the adjacent one or two sub-array sections, the second type section decoders each selects the other rows of the adjacent one or two sub-array sections, and the first type section decoders are respectively opposite to the second type section decoders within each mat pair.

3. A nonvolatile memory compatible with a dynamic random access memory comprising:

a memory array divided into at least one pair of mats, each mat including a plurality of sub-arrays arranged in a first direction, each sub-array including a plurality of sub-blocks arranged in a second direction, a number of sub-blocks forming a block in the first direction; and a plurality of section decoders arranged adjacent to the sub-arrays for connecting drive lines thereto;

wherein the rows of each sub-array are allocated to more than one adjacent section decoder;

wherein each sub-aray is arranged between two section decoders such that one of the two section decoders connects drive lines to some of the rows of the sub-array, and the other of the two section decoders connects drive lines to the remaining rows of the sub-array; and wherein each section decoder that is aranged between two sub-arrays connects drive lines to some of the rows of each of the two adjacent sub-arays.

4. A nonvolatile memory according to claim 3 further including:

a reading row decoder coupled to the section decoders for providing reading block selection signals thereto; and a writing row decoder coupled to the section decoders for providing writing block selection signals thereto.

5. A nonvolatile memnory according to claim 3 further including:

a reading gate drive circuit coupled to the section decoders for providing word line drive signals thereto; and a writing gate drive circuit coupled to the section decoders for providing word line drive signals thereto.

6. A nonvolatile memory according to claim 3 wherein each sub-array includes a plurality of NAND cell units, and wherein each NAND cell unit includes:

a strng selection transistor;

a plurality of cell transistors;

a first ground selection transistor; and a second ground selection transistor.

7. A nonvolatile memory according to claim 6 wherein:

a first group of the plurality of section decoders are adapted to provide first and second ground selection lines to one or more adjacent sub-arrays;

the first ground selection transistor in each NAND cell unit is coupled to receive the first ground selection line from the adjacent section decoder; and the second ground selection transistor in each NAND cell unit is coupled to receive the second ground selection line from the adjacent section decoder.

8. A nonvolatile mnemory according to claim 7 wherein:

a second group of the plurality of section decoders are adapted to provide string selection lines to one or more adjacent sub-arrays; and the string selection transistor in each NAND cell unit is coupled to receive the string selection line from the adjacent section decoder.

9. A nonvolatile memory according to claim 8 wherein the section decoders are arranged such that section decoders from the first group and second group alternate in the first direction.

10. A nonvolatile memory according to claim 9 wherein one of the two ground selection transistors in each NAND cell unit is a depletion-type transistor.

11. A nonvolatile memory according to claim 11 wherein the depletion-type transistors in adjacent NAND cell units are coupled to different ground selection lines.

* * * * *

UNITED STATES PATENT AND TRADEMARK OFFICE
CERTIFICATE OF CORRECTION

PATENT NO. : 5,963,475
DATED : October 5, 1999
INVENTOR(S) : Choi et al.

It is certified that error appears in the above-identified patent and that said Letters Patent is hereby corrected as shown below:

Column 9,
Line 49, "BLSBFI" should read -- BLSHFI --.

Column 22,
Line 10, "memnory" should read -- memory --.
Line 19, "strng" should read -- string --.
Line 34, "mnemory" should read -- memory --.
Line 48, "claim 11" should read -- claim 10 --.

Signed and Sealed this

Thirteenth Day of August, 2002

Attest:

Attesting Officer

JAMES E. ROGAN
Director of the United States Patent and Trademark Office